(12) United States Patent
Noda

(10) Patent No.: US 11,963,371 B2
(45) Date of Patent: Apr. 16, 2024

(54) NONVOLATILE SEMICONDUCTOR MEMORY DEVICE AND FABRICATION METHOD OF THE NONVOLATILE SEMICONDUCTOR MEMORY DEVICE

(71) Applicant: Kioxia Corporation, Tokyo (JP)

(72) Inventor: Kotaro Noda, Mie (JP)

(73) Assignee: Kioxia Corporation, Tokyo (JP)

( * ) Notice: Subject to any disclaimer, the term of this patent is extended or adjusted under 35 U.S.C. 154(b) by 448 days.

(21) Appl. No.: 17/203,172

(22) Filed: Mar. 16, 2021

(65) Prior Publication Data
US 2021/0202580 A1 Jul. 1, 2021

Related U.S. Application Data

(63) Continuation of application No. PCT/JP2019/008821, filed on Mar. 6, 2019.

(51) Int. Cl.
*H10B 63/00* (2023.01)
*H01L 23/00* (2006.01)
*H10N 70/00* (2023.01)

(52) U.S. Cl.
CPC .............. *H10B 63/84* (2023.02); *H01L 24/43* (2013.01); *H01L 24/46* (2013.01); *H10N 70/061* (2023.02); *H10N 70/826* (2023.02); *H10N 70/841* (2023.02)

(58) Field of Classification Search
CPC .......... H10B 63/84; H01L 24/43; H01L 24/46
See application file for complete search history.

(56) References Cited

U.S. PATENT DOCUMENTS

| | | | |
|---|---|---|---|
| 8,649,217 B2 | 2/2014 | Kuniya | |
| 9,093,642 B2 | 7/2015 | Okajima | |
| 9,257,484 B2 | 2/2016 | Okajima | |
| 9,893,280 B2 | 2/2018 | Suzuki | |
| 2013/0237028 A1 | 9/2013 | Furuhashi | |
| 2014/0239246 A1* | 8/2014 | Noda | H10N 70/063 |
| | | | 257/4 |
| 2016/0049421 A1 | 2/2016 | Zhang | |
| 2016/0343434 A1 | 11/2016 | Lee | |

FOREIGN PATENT DOCUMENTS

| | | |
|---|---|---|
| JP | 2013-062380 A | 4/2013 |
| JP | 2013-065707 A | 4/2013 |
| JP | 2016-219811 A | 12/2016 |

* cited by examiner

*Primary Examiner* — Marvin Payen
(74) *Attorney, Agent, or Firm* — Foley & Lardner LLP

(57) ABSTRACT

A certain embodiment includes: first wiring layers extended in a first direction and arranged in a second direction; second wiring layers provided above the first wiring layer of a third direction and arranged in the first direction and extended in the second direction; first stacked structures comprising a first memory cell disposed between the second and first wiring layers at a crossing portion between the second and first wiring layers; first conductive layers provided in the same layer as the first wiring layers, adjacent to the first wiring layer in the second direction, and not connected to other than the second wiring layer; second stacked structures disposed at crossing portions between the second wiring layers and the first conductive layers; and an insulation layer provided between the first stacked structures and between the second stacked structures having a Young's modulus larger than that of the insulation layer.

16 Claims, 36 Drawing Sheets

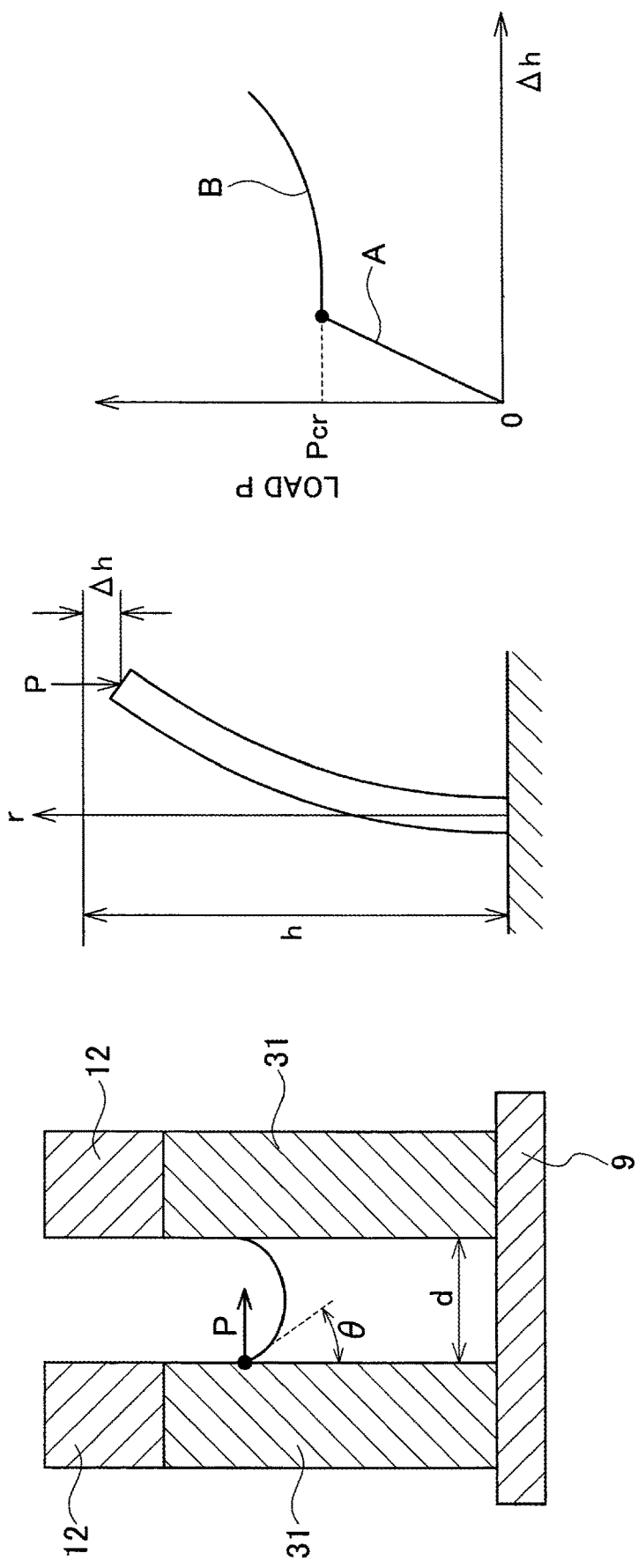

NONVOLATILE SEMICONDUCTOR MEMORY DEVICE AND FABRICATION METHOD OF THE NONVOLATILE SEMICONDUCTOR MEMORY DEVICE

CROSS REFERENCE TO RELATED APPLICATIONS

This is a continuation application (CA) of PCT Application No. PCT/JP2019/008821, filed on Mar. 6, 2019, which claims priority to PCT Application No. PCT/JP2019/008821, filed on Mar. 6, 2019 and the entire contents of which are incorporated herein by reference.

FIELD

Embodiments described herein relate generally to a nonvolatile semiconductor memory device and a fabrication method of the nonvolatile semiconductor memory device.

BACKGROUND

In recent years, a Resistive Random Access Memory (ReRAM) using a resistance variation of a film has been developed. As a kind of the ReRAM, a phase change memory (PCM) has been developed which utilizes a resistance variation due to a thermal phase transition between a crystalline state and an amorphous state in a storage area of a film. Moreover, since a superlattice PCM in which two different alloys are repeatedly stacked can change a phase of the film with a small amount of electric currents, it has attracted attention as a storage device easily capable of power saving.

BRIEF DESCRIPTION OF THE DRAWINGS

FIG. 8A is a conceptual diagram illustrating a pattern collapse.

FIG. 8B is a schematic diagram illustrating a buckling deformation.

FIG. 8C is an explanatory diagram illustrating a relationship between a displacement and a loading weight in the buckling deformation.

DETAILED DESCRIPTION

Next, certain embodiments will now be described with reference to drawings. In the description of the following drawings to be explained, the identical or similar reference sign is attached to the identical or similar part. However, it should be noted that the drawings are schematic and the relation between thickness and the plane size and the ratio of the thickness of each component part differs from an actual thing. Therefore, detailed thickness and size should be determined in consideration of the following explanation. Of course, the part from which the relation and ratio of a mutual size differ also in mutually drawings is included.

Moreover, the embodiments described hereinafter merely exemplify the device and method for materializing the technical idea; and the embodiments do not specify the material, shape, structure, placement, etc. of each component part as the following. The embodiments may be changed without departing from the spirit or scope of claims.

Certain embodiments disclosed herein provide a highly reliable nonvolatile semiconductor memory device having excellent mechanical strength, resistance to pattern shorts, and improved yields, and a fabrication method of such a nonvolatile semiconductor memory device.

A nonvolatile semiconductor memory device according to the embodiments includes a plurality of first wiring layers, a plurality of second wiring layers, a plurality of first stacked structure, a plurality of first conductive layers, a plurality of second stacked structure, and an insulation layer. The plurality of the first wiring layers are extended in a first direction, and are arranged in a second direction crossing the first direction. The plurality of second wiring layers are provided above the plurality of first wiring layer of a third direction crossing the first direction and the second direction, and are arranged in the first direction and extended in the second direction. The plurality of first stacked structures each includes a first memory cell disposed between the second wiring layer and the first wiring layer at a crossing portion between each the plurality of second wiring layers and each the plurality of first wiring layers. The plurality of first conductive layers are provided in the same layer as the plurality of first wiring layers, are arranged to be adjacent to the first wiring layer in the second direction, and are not connected to other than the second wiring layer. The plurality of second stacked structures are disposed respectively at crossing portions between the second wiring layers and the plurality of first conductive layers. The insulation layer is provided between the plurality of first stacked structures and between the plurality of second stacked structures. The second stacked structure has a Young's modulus larger than a Young's modulus of the insulation layer.

Embodiments

Figure 1:
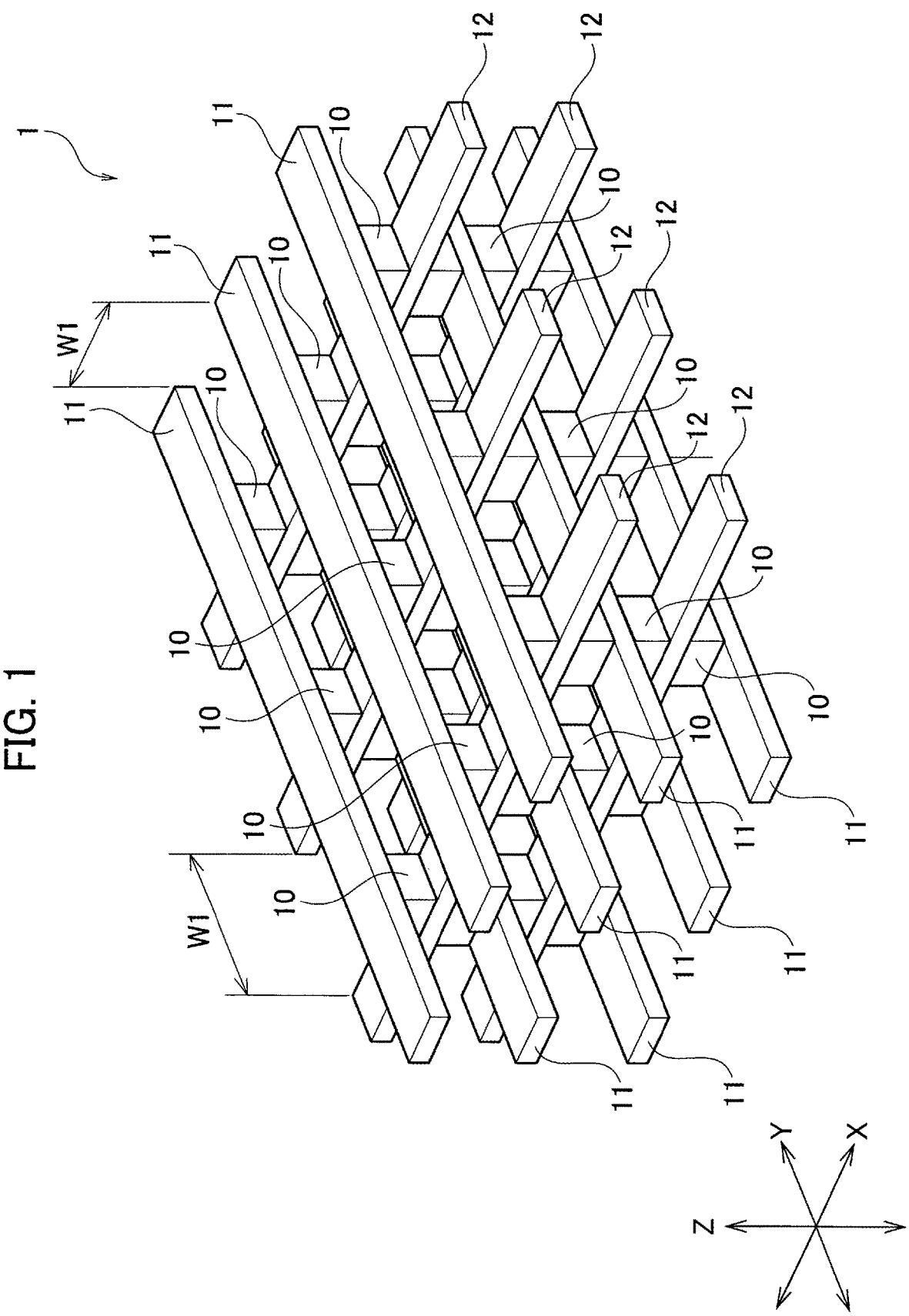
FIG. 1 is a schematic bird's-eye view configuration diagram of a nonvolatile semiconductor memory device according to the embodiments.
Figure 2:
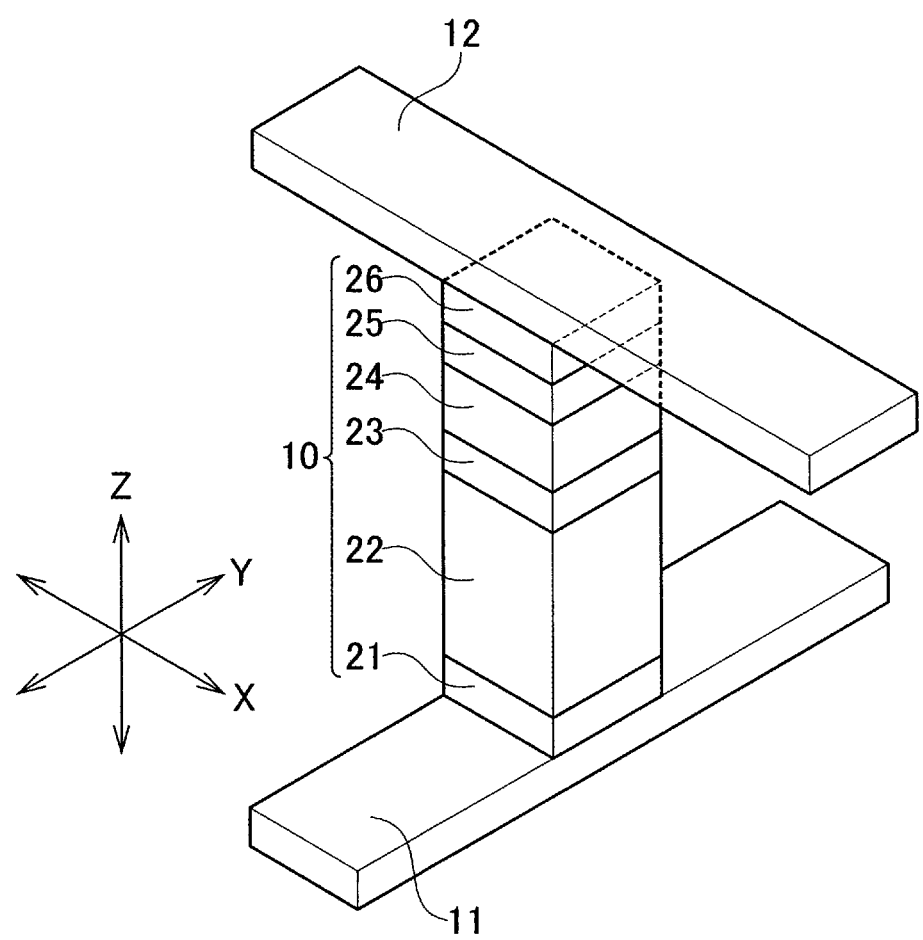
FIG. 2 is a schematic bird's-eye view configuration diagram illustrating a memory cell portion illustrated in FIG. 1.

FIG. 1 illustrates a schematic bird's-eye view configuration of a nonvolatile semiconductor memory device 1 according to the embodiments, and four layers are stacked in an array of 3 lines×3 columns, for example. FIG. 2 illustrates a schematic bird's-eye view configuration of a portion of a memory cell 10 illustrated in FIG. 1.

As illustrated in FIG. 1, the nonvolatile semiconductor memory device 1 according to the embodiments includes a cross-point type memory structure, and includes: a plurality of first wiring layers 11 disposed on the same plane; a plurality of second wiring layers 12 disposed on the same plane on the plurality of first wiring layers 11 to be three-dimensionally crossed respectively with the plurality of first wiring layers 11; and a memory cell 10 disposed between the second wiring layer 12 and the first wiring layer 11 at a crossing portion between each of the plurality of second wiring layers 12 and each of the plurality of first wiring layers 11. The nonvolatile semiconductor memory device 1 according to the embodiments may be disposed on an insulating substrate including an insulation layer formed on a semiconductor substrate, for example.

The first wiring layer 11 and the second wiring layer 12 are three-dimensionally crossed with each other in non-parallel. For example, as illustrated in FIG. 1, a plurality of the memory cells 10 are disposed in a matrix in two-dimensional direction (X-Y direction), and a plurality of layers of the matrix array thereof are further stacked in a Z axial direction orthogonal to the X-Y plane. The first wiring layer 11 is shared between upper and lower memory cells 10, and the second wiring layer 12 is similarly shared between upper and lower memory cells 10. In FIG. 1, although an interlayer insulating film is disposed between the plurality of first wiring layers 11 and the plurality of second wiring layers 12, illustration thereof is omitted.

In the following description, the first wiring layer 11 may be referred to as a lower wiring layer or a bit line, and the second wiring layer 12 may be referred to as an upper wiring layer or a word line, for convenience. Moreover, the cross-point type memory structure can be stacked in a plurality of layers. The names of the bit line and the word line may be reversed from each other.

To the nonvolatile semiconductor memory device according to the embodiments, a Resistive Random Access Memory (ReRAM), a Phase-Change Memory (PCM), a Ferroelectric Random Access Memory (FeRAM), or the like can also be applied. Moreover, a Magneto Tunnel Junction (MTJ) resistance change element can also be applied thereto. In the following description, the PCM will mainly be described.

(Configuration of Memory Cell)

As illustrated in FIG. 2, the memory cell 10 of the nonvolatile semiconductor memory device according to the embodiments includes a storage element connected in series between the first wiring layer 11 and the second wiring layer 12, and a selector 22. The storage element includes a variable resistance film 24.

The selector 22 may be a two-terminals switch device, for example. When a voltage applied between the two terminals is equal to or less than a threshold value, the switch device is in a "high resistivity" state, e.g., an electrically non-conductive state. When the voltage applied between the two terminals is more than the threshold value, the state of the switch device is changed to a "low resistivity" state, e.g., an electrically conductive state. The switch device may have such a function regardless of the polarity of the voltage. The switch device contains at least one kind of chalcogen elements selected from the group consisting of tellurium (Te), selenium (Se), and sulfur (S). Alternatively, the switch device may contain chalcogenide which is a compound including the above-mentioned chalcogen element. The switch device may further contain at least one kinds of elements selected from the group including boron (B), aluminum (Al), gallium (Ga), indium (In), carbon (C), silicon (Si), germanium (Ge), tin (Sn), arsenic (As), phosphorus (P), and antimony (Sb).

Moreover, the selector 22 can be configured of a silicon diode or the like having a p-intrinsic-n (PIN) structure, for example. However, the selector 22 need not to be used.

The variable resistance film 24 can electrically switch between a state where the resistance is relatively low (set state) and a state where the resistance is relatively high (reset state), and stores data in a nonvolatile manner. The selector 22 prevents a sneak current when electrically accessing (forming/writing/erasing/reading) the selected memory cell.

The variable resistance film 24 contains a metallic oxide, for example. As the metallic oxide thereof, there can be used one kind of metal or an oxide of an alloy of two or more kinds of metals selected from the group including zirconium (Zr), titanium (Ti), aluminum (Al), hafnium (Hf), manganese (Mn), tantalum (Ta), and tungsten (W), for example.

When the memory cell 10 is formed as a superlattice PCM, the variable resistance film 24 is formed as a supperlattice structure in which a plurality of chalcogenide compound layers are stacked. The chalcogenide compound used for the variable resistance film 24 is composed of two or more chalcogenide compounds, such as antimony telluride as $Sb_2Te_3$, germanium telluride as GeTe, for example. In order to stabilize a phase change, it is preferable that one kind of the chalcogenide compound contains antimony (Sb) or bismuth (Bi). The selector 22 is formed of a chalcogenide compound of a transition metal. This chalcogenide compound is a compound of: one or more kind of transition metals selected from the group including titanium (Ti) and vanadium (V), copper (Cu), zinc (Zn), chromium (Cr), zirconium (Zr), platinum (Pt), palladium (Pd), molybdenum (Mo), nickel (Ni), manganese (Mn), and hafnium (Hf); and one or more kind of chalcogen elements selected from the group including sulfur (S), selenium (Se), and tellurium (Te), for example. More preferably, the chalcogenide compound is a compound of which the composition is expressed by chemical formula MX or $MX_2$ where M is a transition metal and X is a chalcogen element. When the composition is MX, the concentration of the transition metal M in the chalcogenide compound is 50 atomic %, and when the composition is $MX_2$, the concentration of transition metal M is 33 atomic %. However, since there is an allowable range in the composition of each compound, the preferable concentration of the transition metal M in the chalcogenide compound is equal to or greater than 20 atomic % and equal to or less than 60 atomic %. In the present embodiments, the chalcogenide compound is $TiTe_2$.

The variable resistance film 24 is sandwiched between a conductive film 25 and a conductive film 23. The conductive film 25 and the conductive film 23 include a metal film or a metal nitride film. As the conductive film 25 and the conductive film 23, it is also possible to use a titanium nitride film, for example.

An electrode layer 26 is disposed between the conductive film 25 and the second wiring layer 12. Tungsten (W), titanium (Ti), tantalum (Ta), or a nitride thereof can be applied to the first wiring layer 11, the second wiring layer 12, and the electrode layer 26, for example.

Moreover, the variable resistance film 24 may be formed of silicon (Si), and the electrode layer 26 may be formed of nickel (Ni) or platinum (Pt).

A conductive film 21 is disposed between the first wiring layer 11 and the selector 22. The conductive film 21 includes a metal film or a metal nitride film. The conductive film 21 may include a conducting material, such as a titanium nitride (TiN), tungsten (W), copper (Cu), or aluminum (Al), for example. The conductive film 21 is connected to the first wiring layer 11.

The conductive films 21, 23, and 25 prevent diffusion of material elements between the upper and lower layers respectively sandwiching the conductive films 21, 23, and 25. Moreover, the conductive films 21, 23, and 25 improve adhesion between the upper and lower layers respectively sandwiching the conductive films 21, 23, and 25.

When a reset voltage is applied to the variable resistance film 24 in a low resistivity state (set state) having a relatively low resistivity, through the first wiring layer 11 and the second wiring layer 12, the variable resistance film 24 can be switched from the set state to a high resistivity state (reset state) having a relatively high resistivity.

When a set voltage higher than the reset voltage is applied to the variable resistance film 24 in the high resistivity state (reset state), the variable resistance film 24 can be switched therefrom to the low resistivity state (set state).

Although the details of a fabrication method thereof will be described below, the fundamental structure illustrated in FIG. 1 can be fabricated as follows, for example. After stacking stacked film including the memory cell 10 on the lower wiring layer 11, the stacked film and the lower wiring layer 11 are processed into a line shape in the Y direction, and embedding an interlayer insulating film in a trench between the stacked films formed by the aforementioned processing, and then the upper wiring layer 12 is formed on the stacked film and the interlayer insulating film. The upper wiring layer 12 is processed into a line shape in the X direction, and further the stacked films under between upper wiring layers 12 which are processed into the line shape are also be processed, and thereby the memory cell 10 composed of a substantially pillar-shaped (hereinafter, simply referred to as "pillar-shaped") plurality of stacked films can be formed at a crossing portion between the upper wiring layer 12 and the lower wiring layer 11.

Figure 3:
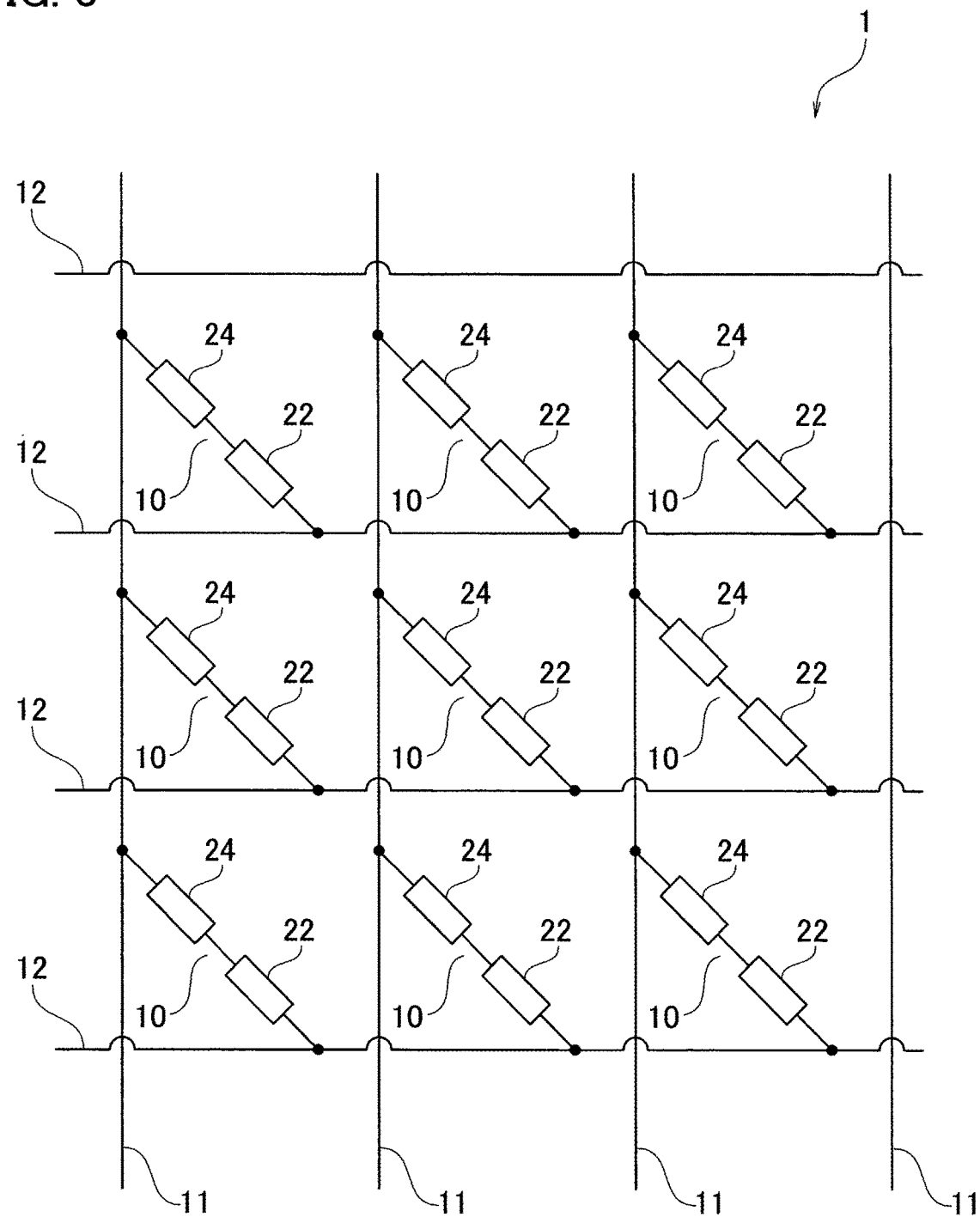
FIG. 3 is a circuit configuration diagram of the nonvolatile semiconductor memory device according to the embodiments.

In the basic circuit configuration of the nonvolatile semiconductor memory device 1 according to the embodiments, as illustrated in FIG. 3, the memory cell 10 is connected to the cross-point between the first wiring layer 11 and the second wiring layer 12. In FIG. 3, the memory cell 10 is expressed as a serial structure of the variable resistance film 24 and the selector 22. Since the nonvolatile semiconductor memory device 1 has a four-layer stacked structure as illustrated in FIG. 1, for example, the circuit configuration illustrated in FIG. 3 is stacked in four layers, in this case.

Figure 4:
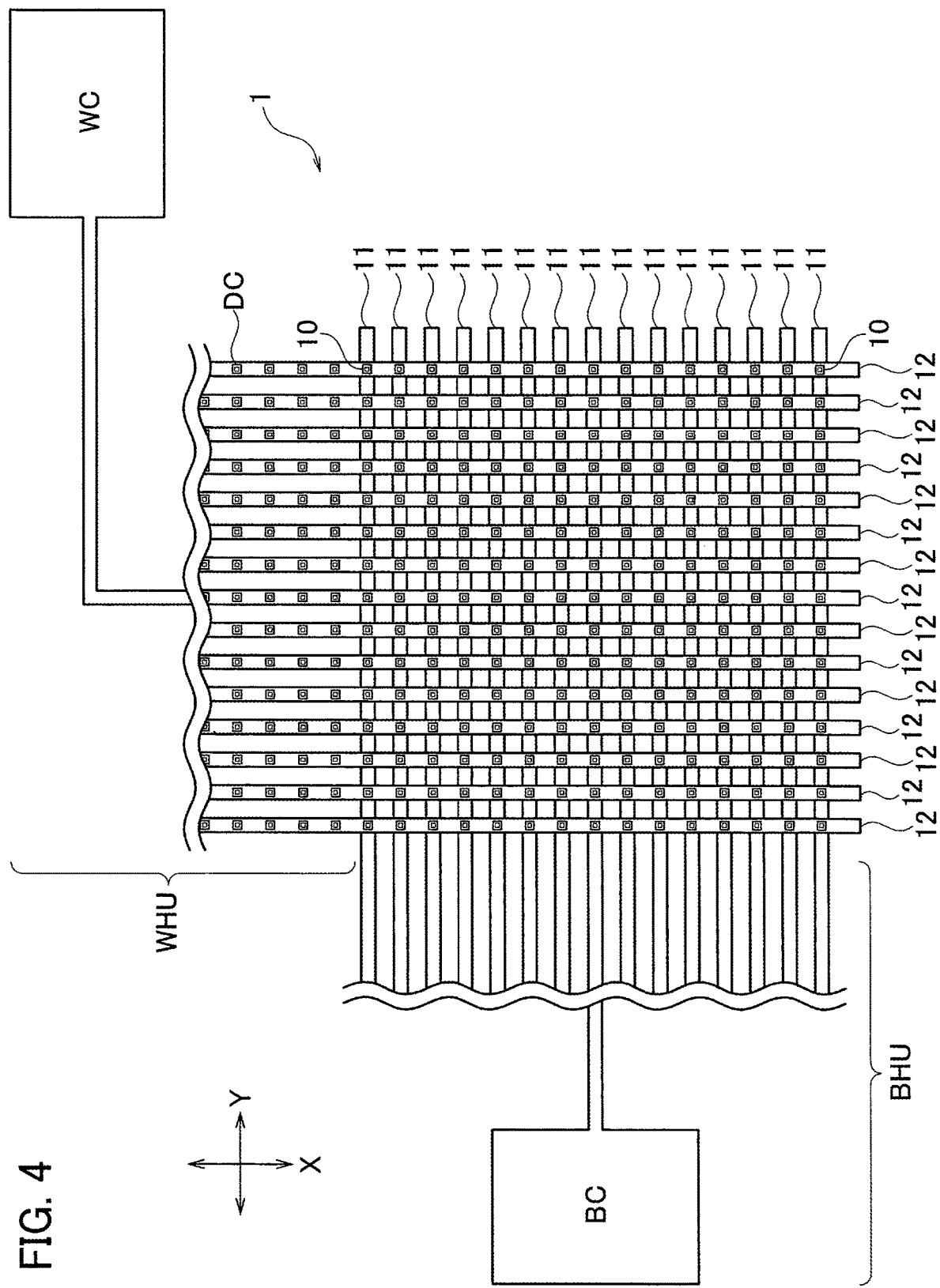
FIG. 4 is a schematic planar pattern configuration diagram of the nonvolatile semiconductor memory device according to the embodiments.

As illustrated in FIG. 4, an example of a schematic planar pattern configuration of the nonvolatile semiconductor memory device 1 according to the embodiments includes a plurality of first wiring layers (bit line) 11, a plurality of second wiring layers (word line) 12, and memory cells 10 respectively disposed at a cross-point between the plurality of bit lines 11 and the plurality of word lines 12. Moreover, there are provided a bit line hookup portion BHU in which the plurality of bit lines 11 are extended, and a word line hookup portion WHU in which the plurality of word lines 12 are extended. A bonding pad (bit line contact BC) for forming a contact with the bit lines 11 is formed in the bit line hookup portion BHU, and a bonding pad (word line contact WC) for forming a contact with the word lines 12 is formed in the word line hookup portion WHU.

As illustrated in FIG. 4, the nonvolatile semiconductor memory device 1 according to the embodiments includes a stacked structure composed of a stacked film structure similar to that of the memory cell 10 as a reinforcement structure for supporting the second wiring layer (word line) 12, in the word line hookup portion WHU. Therefore, a pattern collapse of the second wiring layer (word line) 12 and an occurrence of a pattern short between adjacent patterns can be suppressed, in a peripheral portion (word line hookup portion WHU) of the memory cells 10. In the following description, since the stacked structure includes the stacked film structure similar to that of the memory cell 10, the stacked structure may be expressed as a dummy cell (DC).

When the configuration of FIG. 4 is multilayered in the Z axial direction, a dummy cell (DC) structure composed of a stacked film structure similar to that of the memory cell 10 as a reinforcement structure for supporting the first wiring layer (bit line) 11 of upper layers is disposed also in the bit line hookup portion BHU, for example. Therefore, a pattern collapse of the first wiring layer (bit line) 11 and an occurrence of a pattern short between adjacent patterns can be suppressed also in the bit line hookup portion BHU.

In this case, since the dummy cell DC includes the stacked film structure similar to that of the memory cell 10, the dummy cell DC includes a material(s) stronger than that of the interlayer insulating film.

Figure 5:
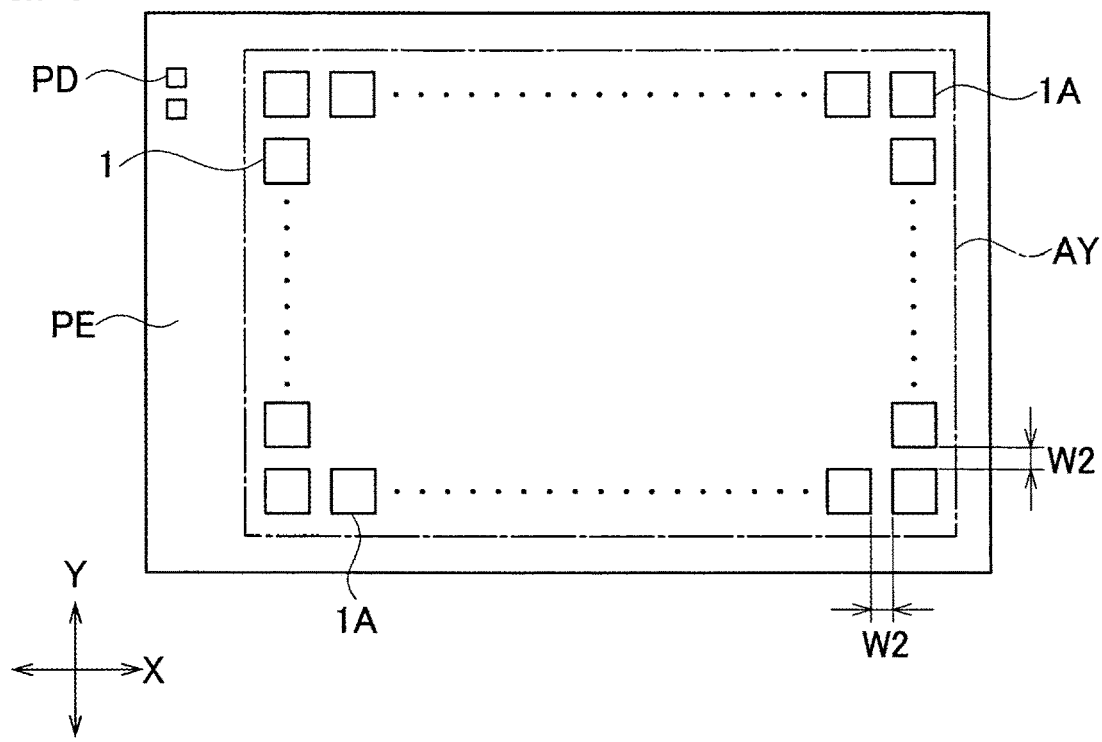
FIG. 5 illustrates an example of a schematic plane configuration of the nonvolatile semiconductor memory device according to the embodiments.

The nonvolatile semiconductor memory device according to the embodiments includes a peripheral portion PE and a cell unit AY, as illustrated in FIG. 5. The peripheral portion PE is disposed so as to surround the cell unit AY. In the peripheral portion PE, a logic circuit or the like configured to control the cell unit AY can be disposed. Moreover, an electrode pad PD configured to exchange data with the outside can be provided in the peripheral portion PE.

A plurality of memory cell arrays 1A are disposed in a matrix shape in the cell unit AY. The memory cell array 1A includes a plurality of first wiring layers 11 and a plurality of second wiring layers 12.

Figure 6A:
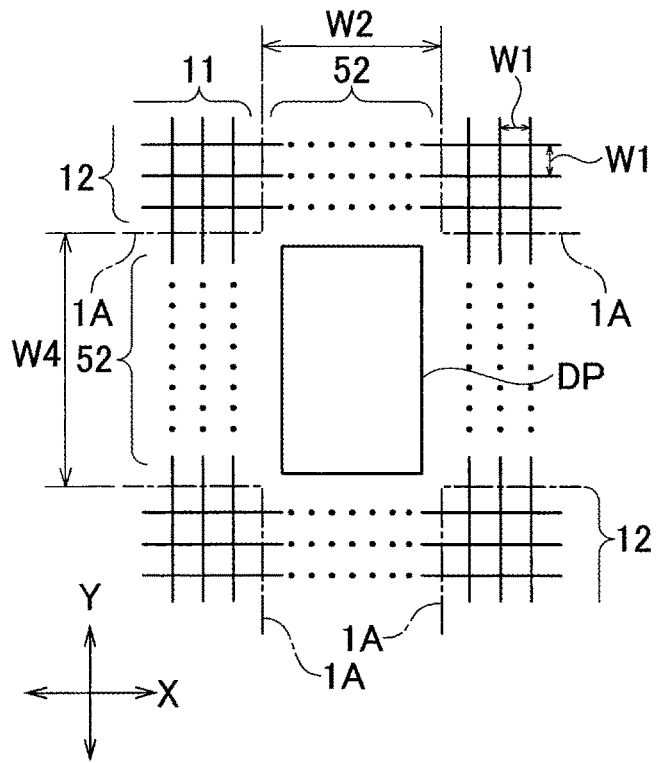
FIG. 6A illustrates an example of an enlarged schematic plane configuration of the nonvolatile semiconductor memory device according to the embodiments.

In this case, as illustrated in FIG. 6A, the first wiring layer 11 and the second wiring layer 12 are extended from each memory cell array 1A. Moreover, as illustrated in FIG. 6A, the first wiring layers 11 are extended to be connected to each other between the adjacent memory cell arrays 1A, and similarly the second wiring layers 12 are extended to be connected to each other between the adjacent memory cell arrays 1A. A region between the memory cell arrays 1A may be used as a stacked structure formation region 52. More specifically, in addition to the bit line hookup portion BHU and the word line hookup portion WHU, the region between the memory cell arrays 1A may also be used as the stacked structure formation region 52.

In the stacked structure formation region 52, a contact can be connected to the first wiring layer 11 and the second wiring layer 12. Although the first wiring layer 11 and the second wiring layer 12 appear to be linearly extended between the adjacent memory cell arrays 1A in FIG. 6A, the first wiring layer 11 and the second wiring layer 12 may be bent when connecting the contact thereto. Moreover, a dummy pattern DP can be disposed at a portion where corner portions of the respective memory cell arrays 1A are opposite to each other, to be also used as the stacked structure formation region 52.

No memory cell 10 is provided in the stacked structure formation region 52. Moreover, the width (the width W2 in the X direction and the width W4 in the Y direction) of the stacked structure formation region 52 is wider than the width W1 (width in the X direction and the width in the Y direction) between the memory cells 10 respectively composed of pillar-shaped stacked films.

Figure 6B:
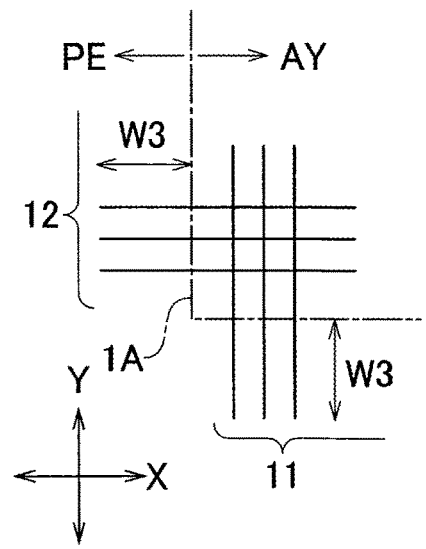
FIG. 6B illustrates an example of an enlarged schematic plane configuration of a boundary portion between a peripheral portion PE and a cell array unit AY.

Similarly, no memory cell 10 is basically disposed in the peripheral region PE. As illustrated in FIG. 6B, the first wiring layer 11 and the second wiring layer 12 are extended from the memory cell array 1A to the peripheral region PE. The distance W3 extended from the memory cell array 1A to an edge of the first wiring layer 11 is wider than the width W1 (width in the X direction and width in the Y direction) between the memory cells 10 respectively composed of the pillar-shaped stacked films.

As illustrated in FIGS. 5, 6A, and 6B, the stacked structure formation region 52 having the width W4 and the peripheral region PE having the width W3 to which the first wiring layer (bit line) 11 extends are used as the bit line hookup portion BHU. Similarly, the stacked structure formation region 52 having the width W2 and the peripheral region PE having the width W3 to which the second wiring layer (word line) 12 extends are used as the word line hookup portion WHU.

In the nonvolatile semiconductor memory device 1 according to the embodiments, the dummy cell DC composed of the stacked film structure similar to that of the memory cell 10 as the reinforcement structure for supporting the second wiring layer (word line) 12 is disposed in the word line hookup portion WHU. Therefore, a pattern collapse of the second wiring layer (word line) 12 and an occurrence of a pattern short between adjacent patterns can be suppressed, in a peripheral portion (word line hookup portion WHU) of the memory cells 10.

When the configuration of FIG. 4 is multilayered in the Z axial direction, the dummy cell (DC) structure composed of the stacked film structure similar to that of the memory cell 10 as the reinforcement structure for supporting the first wiring layer (bit line) 11 is disposed also in the bit line hookup portion BHU, for example. Therefore, a pattern collapse of the first wiring layer (bit line) 11 and an occurrence of a pattern short between adjacent patterns can be suppressed also in the bit line hookup portion BHU.

(Mechanical Strength)

Figure 7:
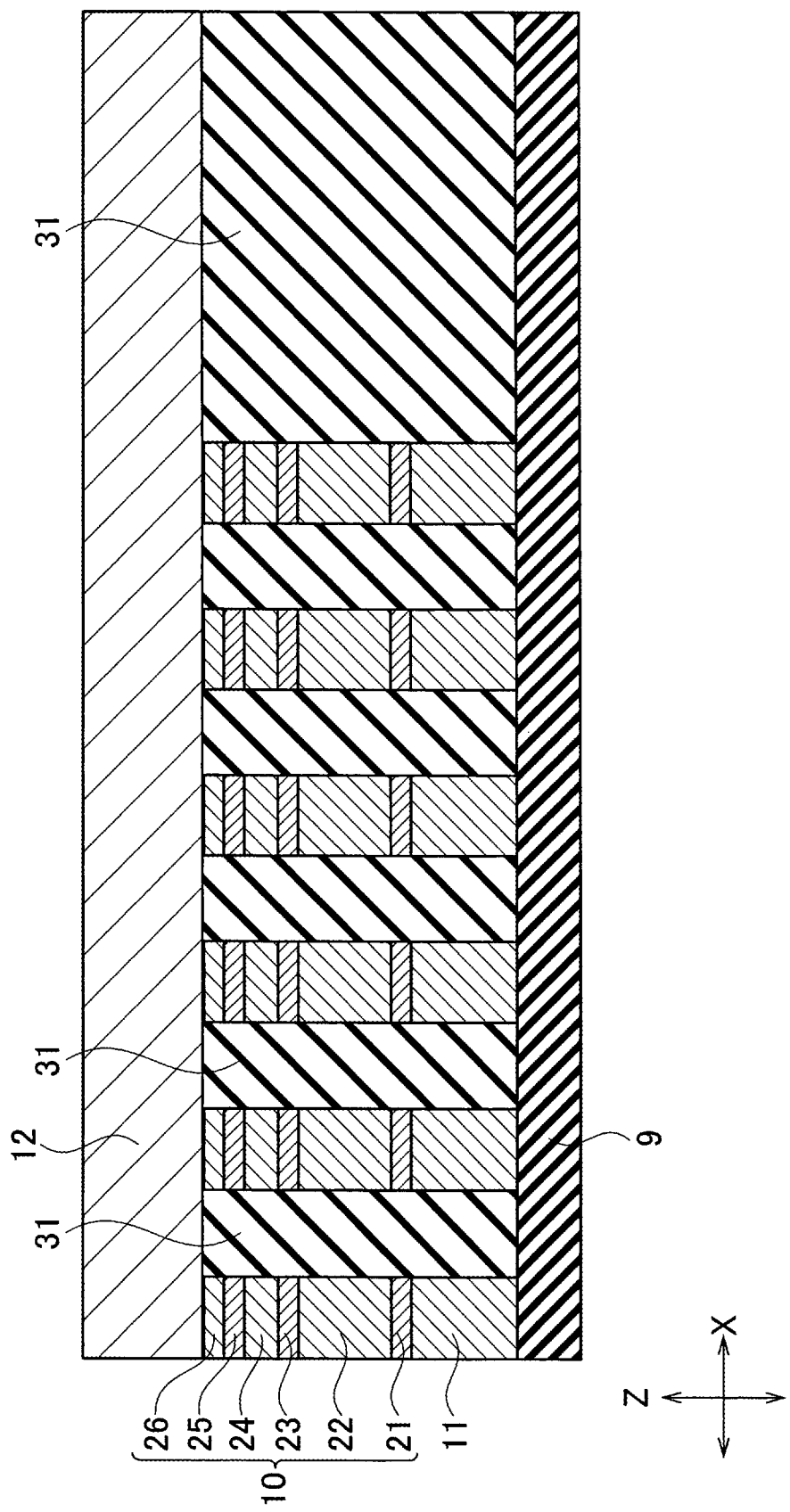
FIG. 7 is a schematic cross-sectional structure diagram for describing a mechanical strength of the nonvolatile semiconductor memory device according to the embodiments.

FIG. 7 illustrates a schematic cross-sectional structure for describing a mechanical strength of the nonvolatile semiconductor memory device according to the embodiments. In the example of FIG. 7, six memory cells 10 are disposed between the insulating substrate 9 and the second wiring layer 12. The interlayer insulating film 31 is disposed between the adjacent memory cells 10 and between the insulating substrate 9 and the second wiring layer 12. The interlayer insulating film 31 can be formed of PSZ (polysilazane), for example. The PSZ is an SiO film formed of a coating film, and can be formed by steam-oxidizing an SiON film to SiO. The first wiring layer 11 and the second wiring layer 12 are formed of tungsten (W), for example. Moreover, d-TEOS (tetraethoxysilane produced by dual plasma CVD-$SiO_2$) may be used for processing of W, for example.

In this case, the Young's modulus of W is approximately 345 GPa, and the Young's modulus of SiO is approximately 80.1 GPa. Assuming that the portion of the pillar structure including the memory cell 10 is formed of approximately W and the interlayer insulating film 31 is formed of SiO, a ratio of Young's modulus between a hard material portion and a soft material portion is approximately 3:1.

For example, if the number of the hard material portion is 0 and the number of the soft material portion is 12, the whole strength between the second wiring layer 12 and the insulating substrate 9 is expressed by 0×3 (relative strength)+ 12×1 (relative strength)=12 (arbitrary unit). On the other hand, if the number of the hard material portion is 6 and the number of the soft material portion is 6, the whole strength between the second wiring layer 12 and the insulating substrate 9 is expressed by 6×3 (relative strength)+6×1 (relative strength)=24 (arbitrary unit).

Since the strength $P_{cr}$ of the pillar structure is proportional to Young's modulus and inversely proportional to the square of the height, if the Young's modulus of the pillar is three times, it can withstand a collapse up to $\sqrt{3}$ times the height. More realistically, if the hard material portion and the soft material portion are installed at 1:1 interval, the Young's modulus is doubled and therefore the collapse can be withstood up to $\sqrt{2}$ times the height, as shown in the above-mentioned numerical example.

In the nonvolatile semiconductor memory device according to the embodiments, a pillar of the dummy cell DC structure composed of the stacked film structure similar to that of the memory cell 10, as the reinforcement structure for supporting the second wiring layer 12, is erected in the peripheral portion (HUP portion) of the memory cell 10, thereby increasing the mechanical strength and making the structure resistant to the collapse.

FIG. 8A illustrates a conceptual diagram illustrating a cause of the pattern collapse. In FIG. 8A, P denotes load, d denotes a distance between pillars, and θ denotes a buckling angle. In FIG. 8A, a pillar structure having two pillars adjacent to each other includes an interlayer insulating film 31 disposed on an insulating substrate 9, and a second wiring layer 12 disposed on the interlayer insulating film 31. FIG. 8B illustrates a schematic diagram of a buckling deformation, and FIG. 8C illustrates an explanatory diagram of a relationship between a displacement Δh and a load P in the buckling deformation.

The buckling a defect in which a depth direction of a line pattern is structurally deformed in a wave shape due to a compressive stress inherent in the material when processing in line and space, and there is a risk of inducing a short circuit between the adjacent patterns.

As illustrated in FIG. 8C, if a load P in a compression direction is applied to the pillar, an uniform compressive deformation occurs when the load P is equal to or less than a threshold value, as illustrated the curve A. When the load P exceeds the threshold value, as illustrated by the curve B, a lateral bending deformation becomes more stable than the uniform compressive deformation. Such a phenomenon is called buckling, and the threshold value at which the buckling occurs is defined as a buckling load $P_{cr}$. The buckling load $P_{cr}$ of the pillar is expressed by equation (1).

$$P_{cr} = \Pi^2 EI/4h^2 \qquad (1)$$

where E is Young's modulus of the material, I is a cross-sectional secondary moment, and h is the height of the pillar.

First Embodiment

Figure 9A:
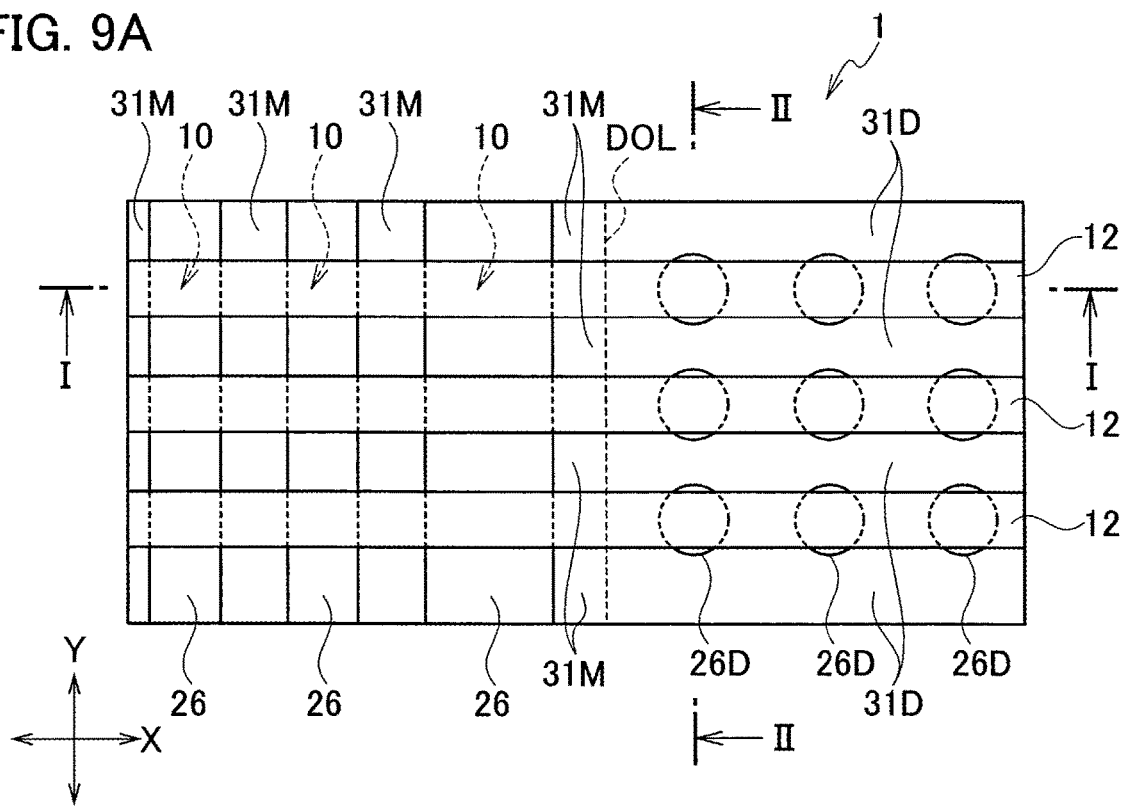
FIG. 9A is a schematic plane configuration diagram illustrating a nonvolatile semiconductor memory device according to the first embodiment.
Figure 9B:
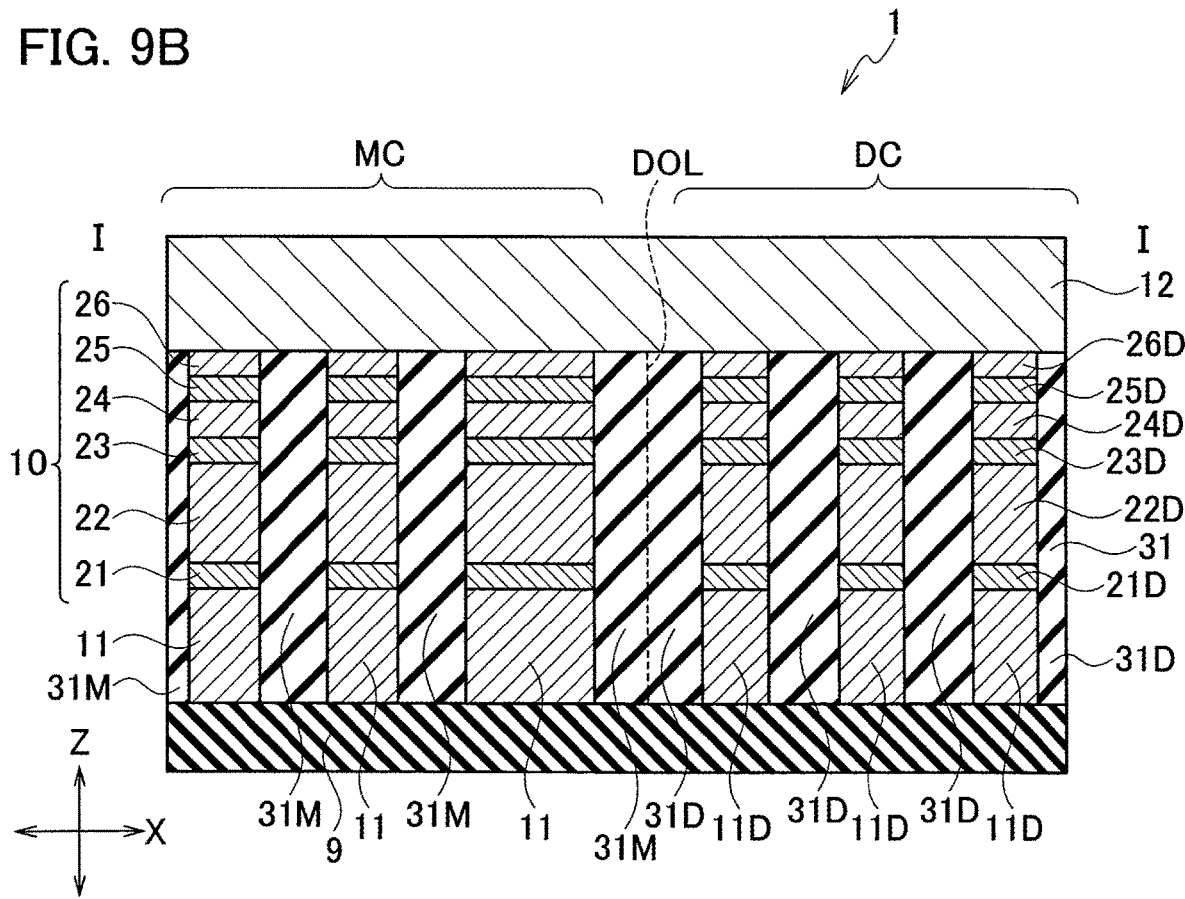
FIG. 9B is a schematic cross-sectional structure diagram taken in the line I-I of FIG. 9A.

FIG. 9A illustrates a schematic plane configuration of a nonvolatile semiconductor memory device 1 according to a first embodiment, and FIG. 9B illustrates a schematic cross-sectional structure taken in the line I-I of FIG. 9A.

As illustrated in FIGS. 9A and 9B, the nonvolatile semiconductor memory device 1 according to the first embodiment includes a plurality of first wiring layers 11 disposed on an insulating substrate 9 and extended in the Y direction. The first wiring layers 11 are arranged along the X direction. A plurality of second wiring layers 12 extended in the X direction are provided above the plurality of first wiring layers 11. The second wiring layers 12 are arranged along the Y direction. AT a crossing portion between each of the plurality of second wiring layers 12 and each of the plurality of first wiring layers 11, there are provided a plurality of first stacked structures disposed between the second wiring layer 12 and the first wiring layer 11, and a second stacked structure disposed to be adjacent to the first stacked structure in the X direction and in contact with the second wiring layer 12. The insulating substrate 9 includes an insulation layer formed on a semiconductor substrate, for example. The first stacked structure includes a plurality of memory cells (MC) 10 including a variable resistance film 24, and the second stacked structure including a dummy cell DC.

In the following description, the stacked films (21, 22, 23, 24, 25, 26) composing the memory cell 10, it may simply be referred to as a stacked film 10, and the stacked films (21D, 22D, 23D, 24D, 25D, 26D) composing the dummy cell DC having the same structure as the stacked film 10 may simply be referred to as a stacked film DC.

In the nonvolatile semiconductor memory device 1 according to the first embodiment, an example is illustrated in which the memory cell 10 and the dummy cell DC are disposed in one layer between the first wiring layer 11 and the second wiring layer 12. Hereinafter, the similar disposing example will be applied also to nonvolatile semiconductor memory devices 1 according to second to seventh embodiments.

The nonvolatile semiconductor memory device 1 according to the first embodiment includes a plurality of conductive layers 11D disposed so as to be adjacent to the plurality of first wiring layers 11 on the same surface as the first wiring layers 11. The dummy cell DC is disposed between the second wiring layer 12 and the conductive layer 11D.

The plurality of conductive layers 11D are disposed in a circular island shape on the insulating substrate 9.

The stacked films (21, 22, 23, 24, 25, 26) composing the memory cell 10 has the same stacked structure as the stacked films (21D, 22D, 23D, 24D, 25D, 26D) composing the dummy cell DC.

Moreover, the nonvolatile semiconductor memory device 1 according to the first embodiment includes an interlayer insulating film 31 (a first insulating layer 31M and a second insulation layer 31D) disposed between each of the plurality of second wiring layers 12 and each of the plurality of first wiring layers 11. The dummy cell DC includes stacked film having a larger Young's modulus than that of the second insulation layer 31D. The dummy cell DC may include a stacked film having a smaller shrinkage rate than that of the second insulation layer 31D.

In FIGS. 9A and 9B, the interlayer insulating film at the side of the memory cell MC is illustrated as the first insulating layer 31M, and the interlayer insulating film at the side of the dummy cell DC is illustrated as the second insulation layer 31D. A boundary DOL between the first insulating layer 31M and the second insulation layer 31D is illustrated as the dashed line. A position of the boundary DOL is dependent on design conditions and a fabricating process.

More specifically, the nonvolatile semiconductor memory device 1 according to the first embodiment further includes a first insulating layer 31M provided between the plurality of first stacked structures, and a second insulation layer 31D provided between the plurality of second stacked structures; and in the X direction, a first insulating layer 31M and a second insulation layer 31D may be provided so as to sandwich the boundary DOL between one of the plurality of first stacked structures closest to the second stacked structure and one of the plurality of second stacked structures closest to the first stacked structure. Moreover, the second insulation layer 31D may includes a film structure having a larger Young's modulus than that of the first insulating layer 31M.

In the structure where the Young's modulus of the first insulating layer 31M is different from the Young's modulus of the second insulation layer 31D, since the second insulation layer 31D is formed after forming the first insulating layer 31M, there is a difference between a dug amount of the first insulating layer 31M and a dug amount of the second insulation layer 31D when the first stacked structure and the second stacked structure are processed into pillar structures. The term "dug amount" used herein is an etching amount (etching process depth) of the first insulating layer 31M and an etching amount (etching process depth) of the second insulation layer 31D when the first stacked structure and the second stacked structure are processed into pillar structures by simultaneous processing.

Films having a higher Young's modulus have higher hardness and higher density. Therefore, it is difficult to be etched and a dug amount thereof is also small. The first insulating layer 31M disposed in the memory cell MC portion may include a porous film structure having a relatively low Young's modulus, for example. That is, since the second insulation layer 31D is formed after forming the first insulating layer 31M depending on a fabricating process, the dug amount of the second insulation layer 31D is different from the dug amount of the first insulating layer 31M. There may be a difference between the Young's moduli in accordance with the difference between the dug amounts. That is, the second insulation layer 31D may include a film structure having a larger Young's modulus than that of the first insulating layer 31M.

Since the interlayer insulating films 31M and 31D may include substantially the same material(s), the interlayer insulating films 31M and 31D are denoted to be not distinguished, but are simply denoted as interlayer insulating film 31 in the following description.

The Young's modulus of the cell materials of the memory cell 10 and the dummy cell DC is approximately 100 GPa, for example, and the Young's modulus of the interlayer insulating film 31 is approximately 50 GPa, for example.

On the other hand, although the shrinkage rate varies depending to the shrinking conditions, the shrinkage rate of the cell materials of the memory cell 10 and the dummy cell DC is approximately 0.1% to approximately 10% of the shrinkage rates of the interlayer insulating film 31. As a material of the interlayer insulating film 31, not only $SiO_2$ but also SiO, SiOC, SiON, or the like can be applied. Moreover, W, metallic compounds, and complexes thereof, or PCM including C etc. is also applicable to the Cell material.

The memory cells 10 are arranged in the same width and at the same interval in the Y direction. However, the width of the outermost memory cell 10 may be thicker or thinner than the width of the rest of the memory cells 10. Moreover, the distance between the outermost memory cell 10 and one inner memory cell 10 from the outermost memory cell 10 may be larger or smaller than the distance between the rest memory cells 10. Moreover, the memory cells 10 are arranged in the same width and at the same interval in the X direction. However, the width of the outermost memory cell 10 adjacent to the dummy cell DC may be thicker or thinner than the width of the rest of the memory cells 10. Moreover, the distance between the outermost memory cell 10 adjacent to the dummy cell DC and one inner memory cell 10 from the outermost memory cell 10 may be larger or smaller than the distance between the rest memory cells 10.

A plurality of the dummy cells DC may be arranged in the X direction, and may be arranged in the same width and at the same interval in the X and Y directions. The dummy cells DC may be arranged in the same width and at the same interval as those of the memory cells 10, and may be arranged in a different width and at a different interval from those of the memory cells 10.

Figure 10A:
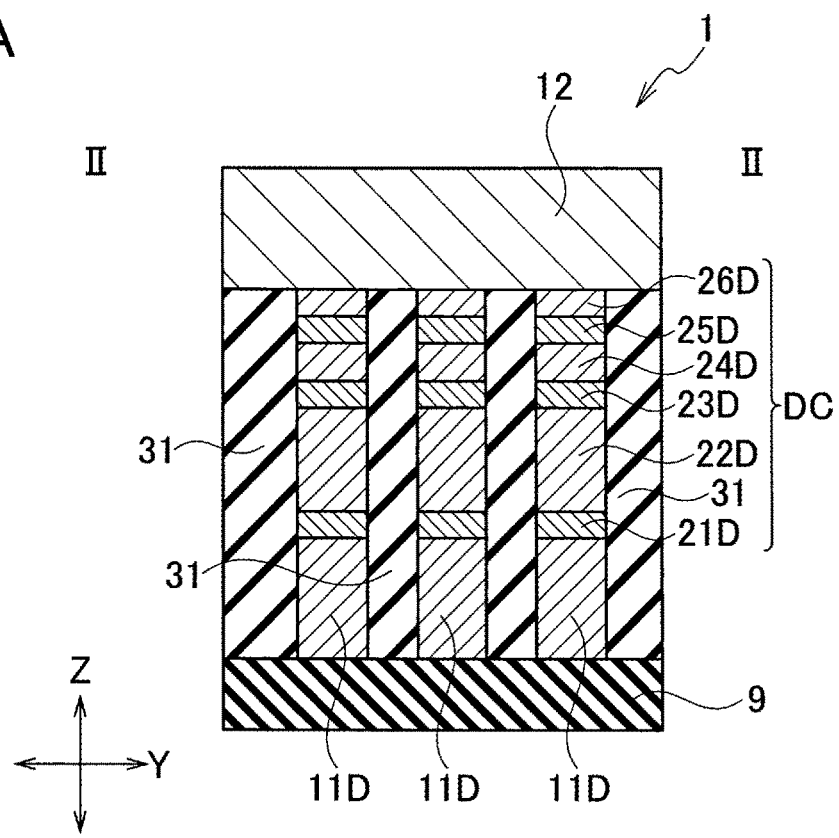
FIG. 10A is a schematic cross-sectional structure diagram of the nonvolatile semiconductor memory device according to the first embodiment, viewed from a Y direction, taken in line II-II of FIG. 9A, before processing of a second wiring layer.
Figure 10B:
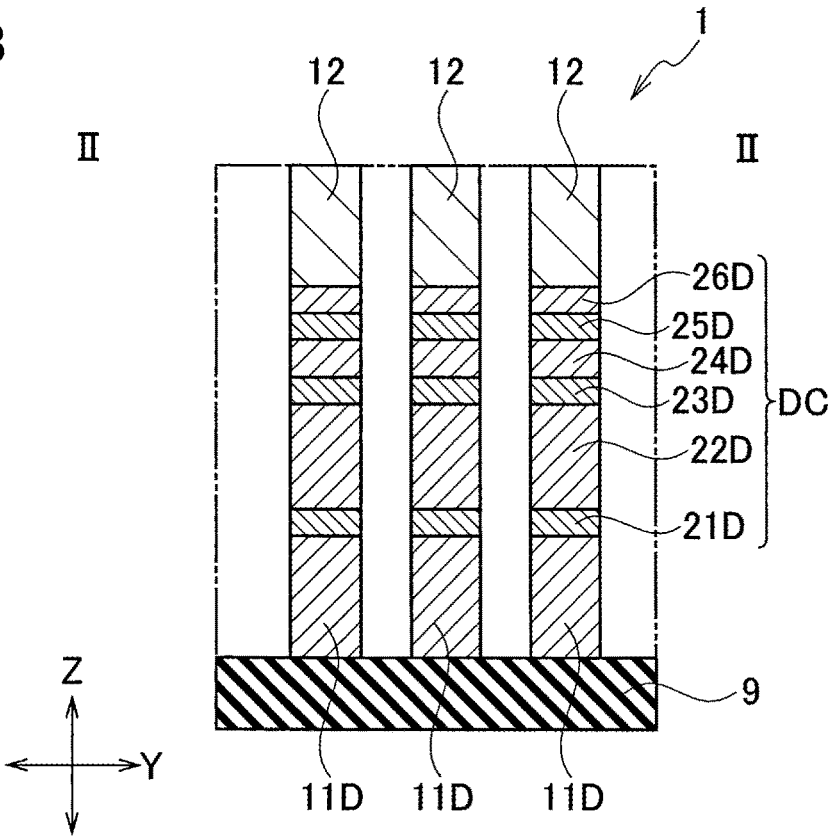
FIG. 10B is a schematic cross-sectional structure diagram of the nonvolatile semiconductor memory device according to the first embodiment, viewed from the Y direction, taken in line II-II of FIG. 9A, after processing of the second wiring layer.

In the nonvolatile semiconductor memory device 1 according to the embodiments, FIG. 10A illustrates a schematic cross-sectional structure viewed from the Y direction, taken in the line II-II of FIG. 9A, before processing of the second wiring layer 12, and FIG. 10B illustrates a schematic cross-sectional structure viewed from the Y direction, taken in the line II-II, after processing of the second wiring layer 12.

Figure 11A:
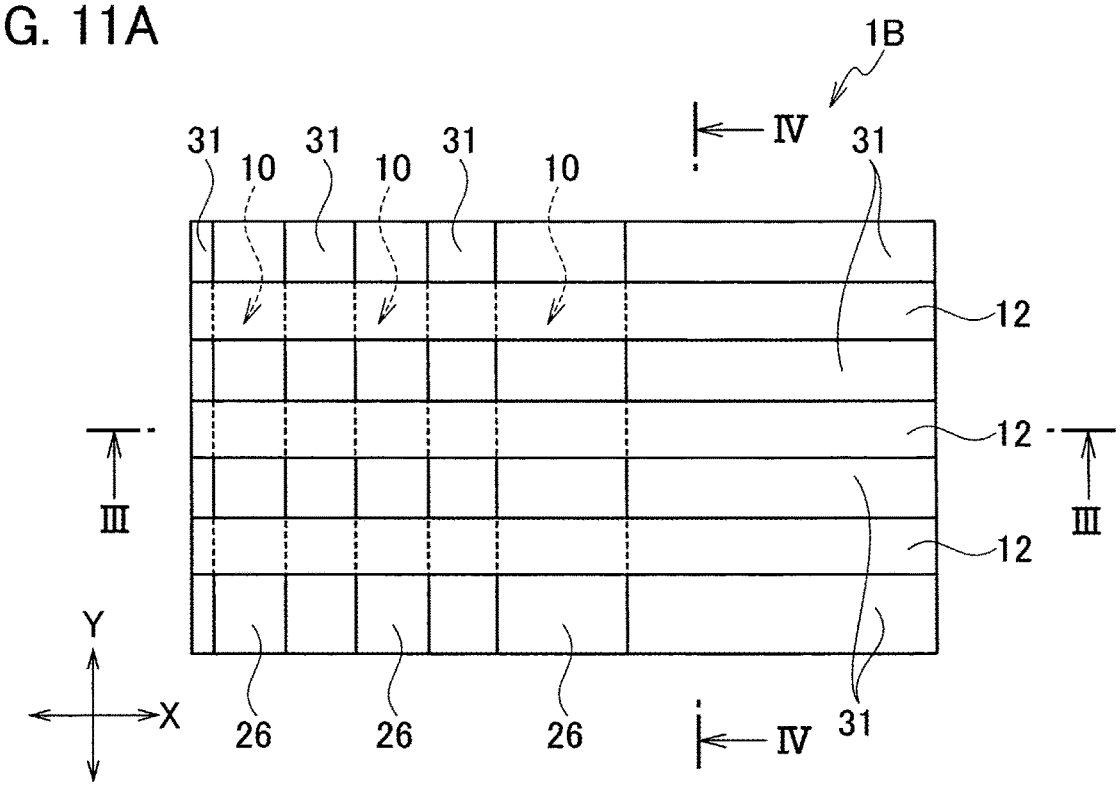
FIG. 11A is a schematic plane configuration diagram of a nonvolatile semiconductor memory device according to a comparative example.
Figure 11B:
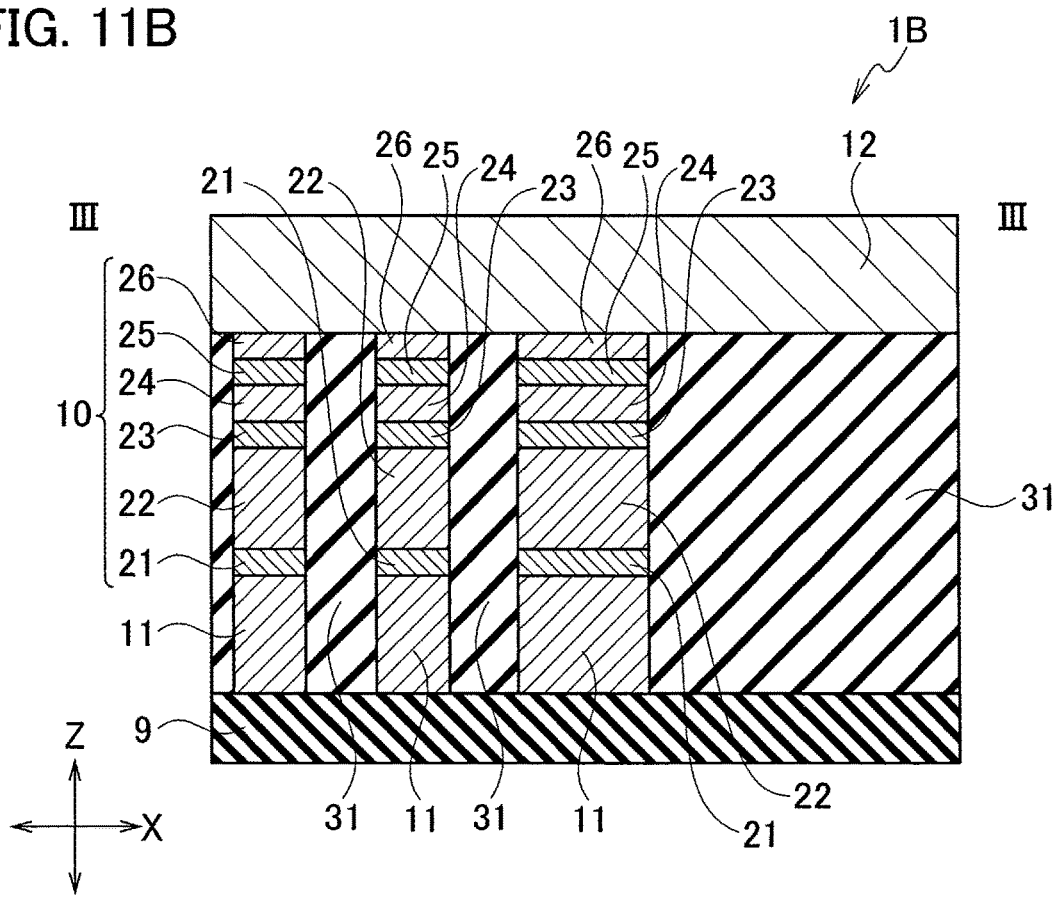
FIG. 11B is a schematic cross-sectional structure diagram of the nonvolatile semiconductor memory device according to the comparative example, taken in the line III-III of FIG. 11A.
Figure 12A:
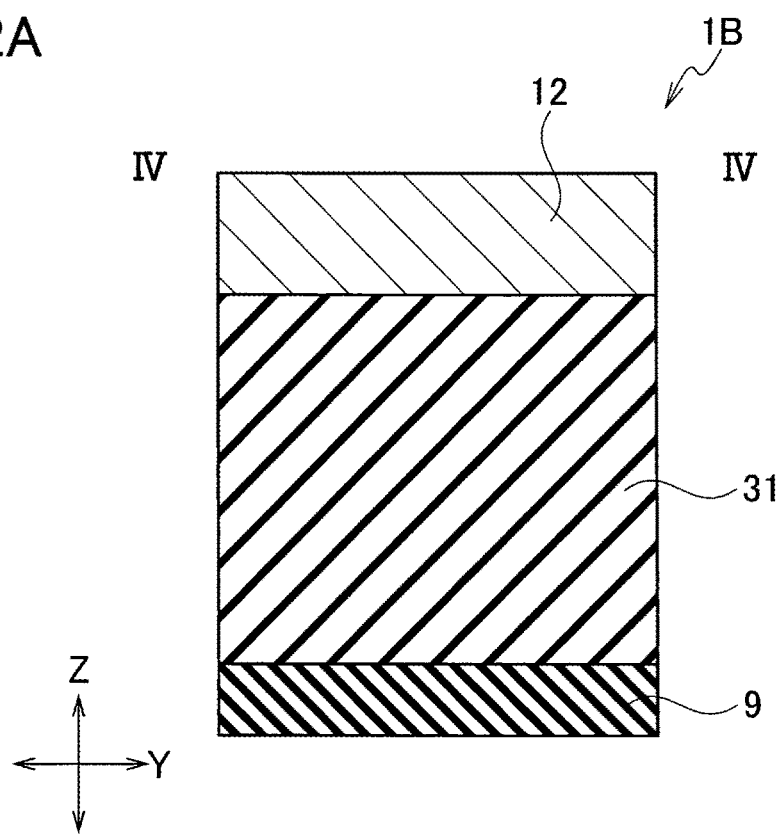
FIG. 12A is a schematic cross-sectional structure diagram of the nonvolatile semiconductor memory device according to the comparative example, viewed from the Y direction, taken in line IV-IV of FIG. 11A, before processing of the second wiring layer.
Figure 12B:
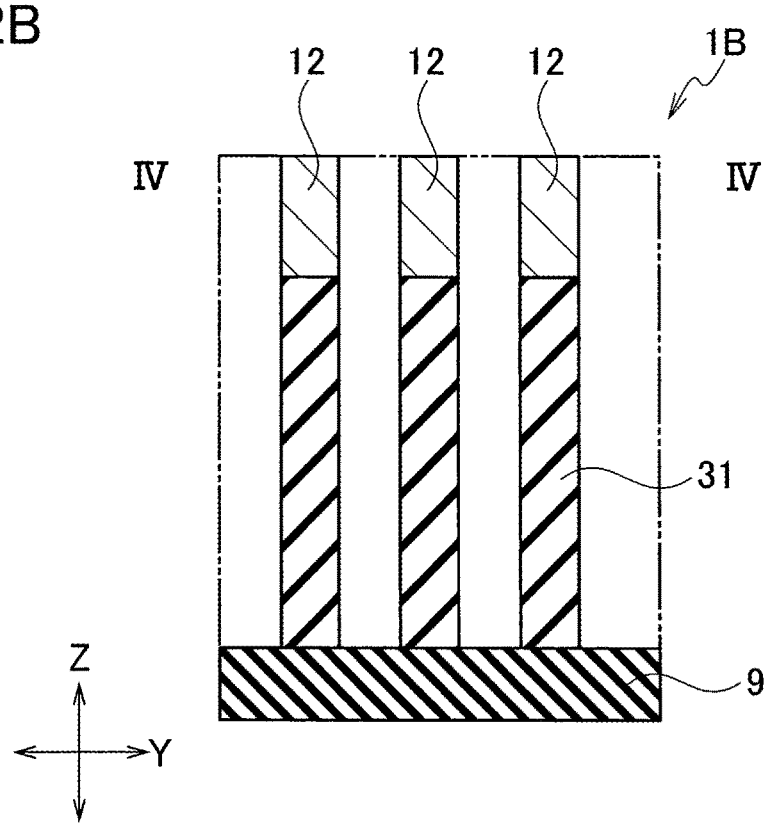
FIG. 12B is a schematic cross-sectional structure diagram of the nonvolatile semiconductor memory device according to the comparative example, viewed from the Y direction, taken in line IV-IV of FIG. 11A, after processing of the second wiring layer.

In a nonvolatile semiconductor memory device 1B according to a comparative example, FIG. 12A illustrates a schematic cross-sectional structure viewed from the Y direction, taken in the line IV-IV of FIG. 11A, before processing of the second wiring layer 12, and FIG. 12B illustrates a schematic cross-sectional structure viewed from the Y direction, taken in the line IV-IV of FIG. 11A, after processing of the second wiring layer 12.

In the nonvolatile semiconductor memory device 1B according to the comparative example, as illustrated in FIG. 12, the member for supporting the second wiring layer 12 is merely the interlayer insulating film 31 in the peripheral portion (HUP portion) of the memory cell 10, and therefore it is weak in terms of strength. Accordingly, a pattern collapse of the second wiring layer 12 and a pattern short between the adjacent patterns are easy to occur in the peripheral portion (HUP portion) of the memory cell 10.

On the other hand, in the nonvolatile semiconductor memory device 1 according to the first embodiment, as illustrated in FIG. 10, the dummy cell DC structure composed of the stacked film structure similar to that of the memory cell 10 as the reinforcement structure for supporting the second wiring layer 12 is arranged in the peripheral portion (HUP portion) of the memory cell 10. As a result, the strength is relatively strong as compared with the structure of the comparative example. Accordingly, a pattern collapse of the second wiring layer 12 and a pattern short between the adjacent patterns can be suppressed, in the peripheral portion (HUP portion) of the memory cell 10.

Second Embodiment

Figure 13A:
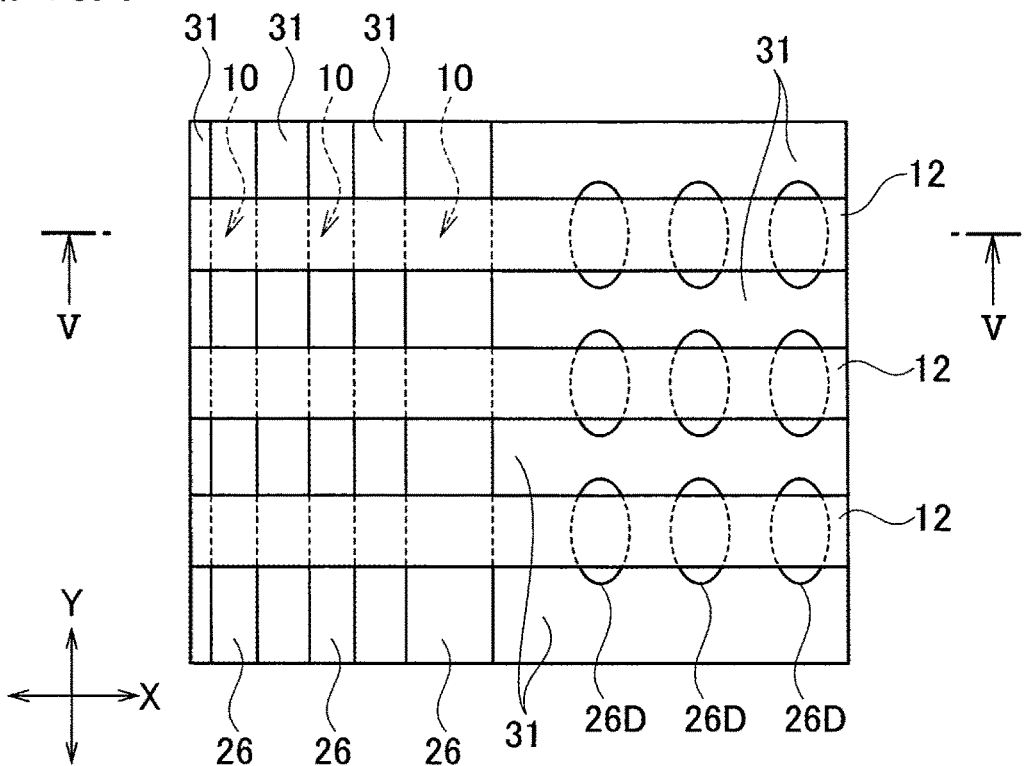
FIG. 13A is a schematic plane configuration diagram of a nonvolatile semiconductor memory device according to a second embodiment.
Figure 13B:
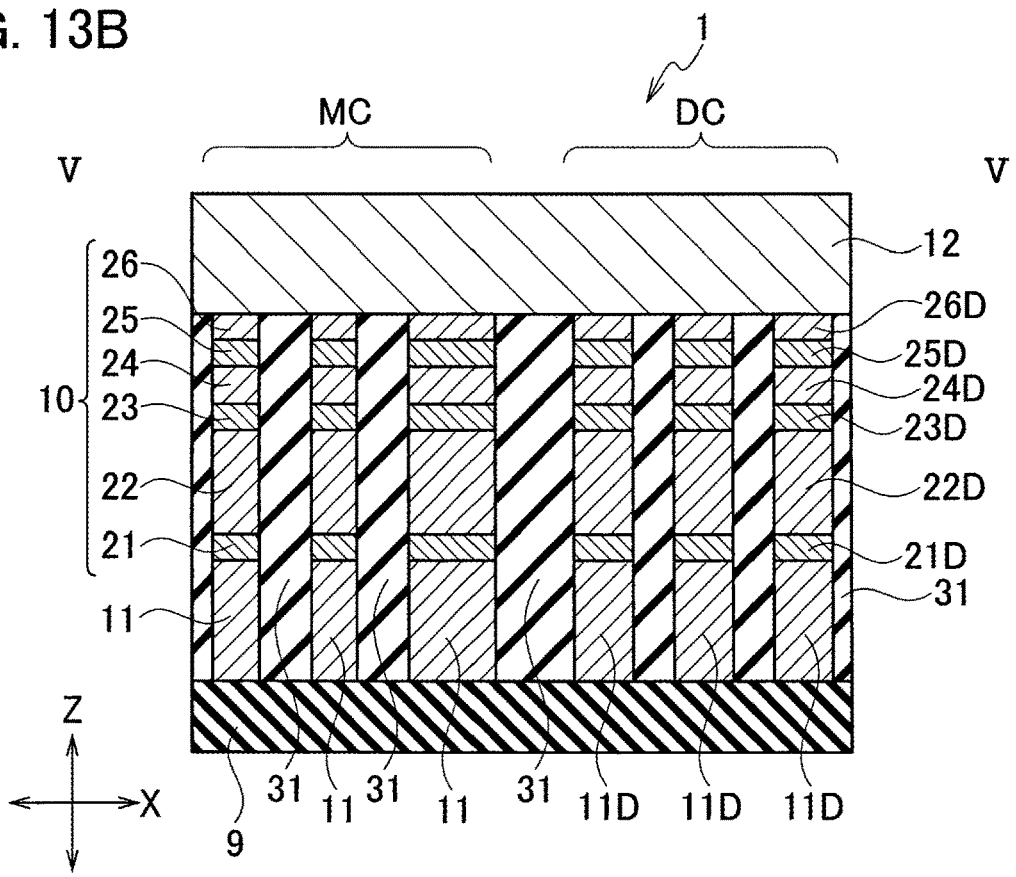
FIG. 13B is a schematic cross-sectional structure diagram of the nonvolatile semiconductor memory device according to the second embodiment, taken in the line V-V of FIG. 13A.

FIG. 13A illustrates a schematic plane configuration of a nonvolatile semiconductor memory device 1 according to a second embodiment, and FIG. 13B illustrates a schematic cross-sectional structure taken in the line V-V of FIG. 13A.

A plurality of conductive layers 11D are arranged in an elliptic island shape in the Y direction on the insulating substrate 9. The Memory cell 10 and the dummy cell DC include the same stacked structure. The rest of the configuration is the same as that of the first embodiment.

Third Embodiment

Figure 14A:
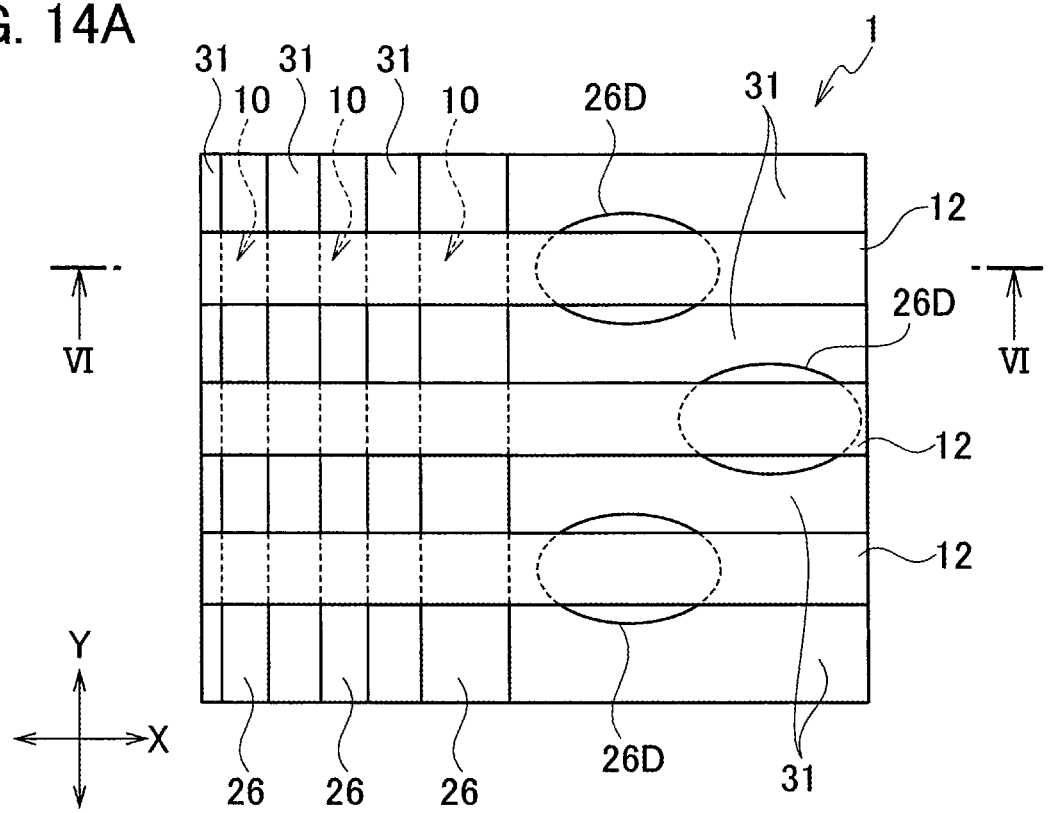
FIG. 14A is a schematic plane configuration diagram of a nonvolatile semiconductor memory device according to a third embodiment.
Figure 14B:
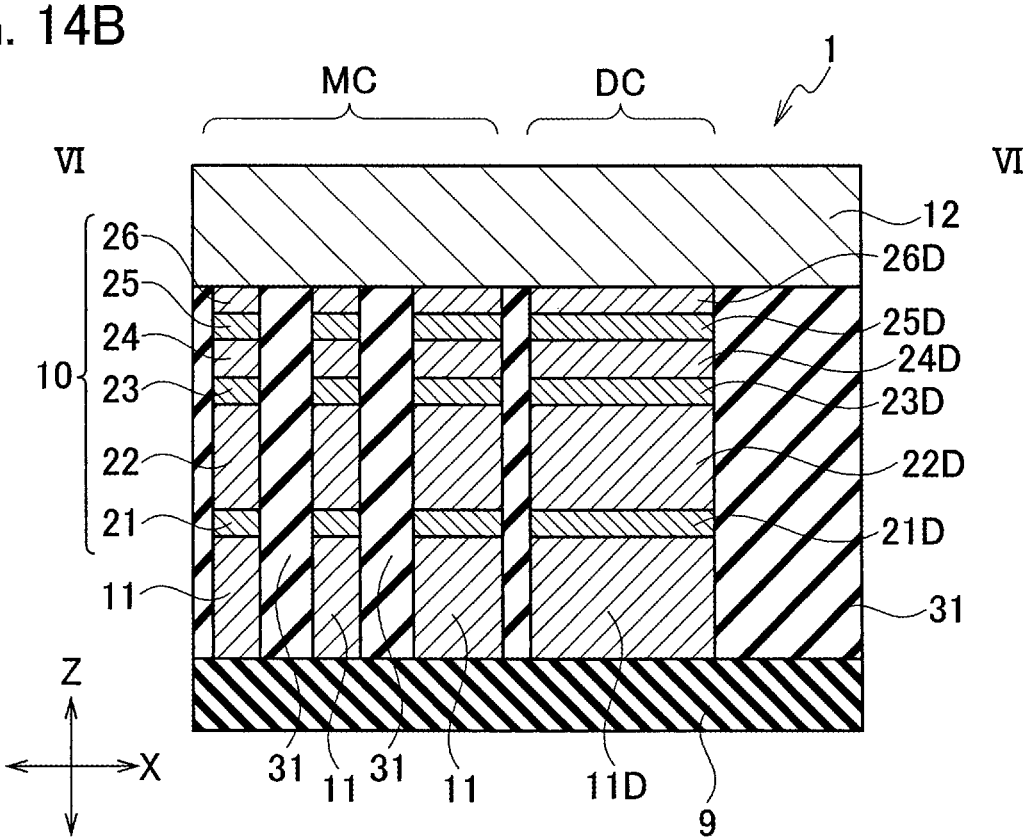
FIG. 14B is a schematic cross-sectional structure diagram of the nonvolatile semiconductor memory device according to the third embodiment, taken in the line VI-VI of FIG. 14A.

FIG. 14A illustrates a schematic plane configuration of a nonvolatile semiconductor memory device 1 according to a third embodiment, and a schematic cross-sectional structure taken in the line VI-VI of FIG. 14A is expressed as illustrated in FIG. 14B.

A plurality of conductive layers 11D are arranged in an elliptic island shape in the X direction on the insulating substrate 9. The Memory cell 10 and the dummy cell DC include the same stacked structure. The rest of the configuration is the same as that of the first embodiment.

Fourth Embodiment

Figure 15A:
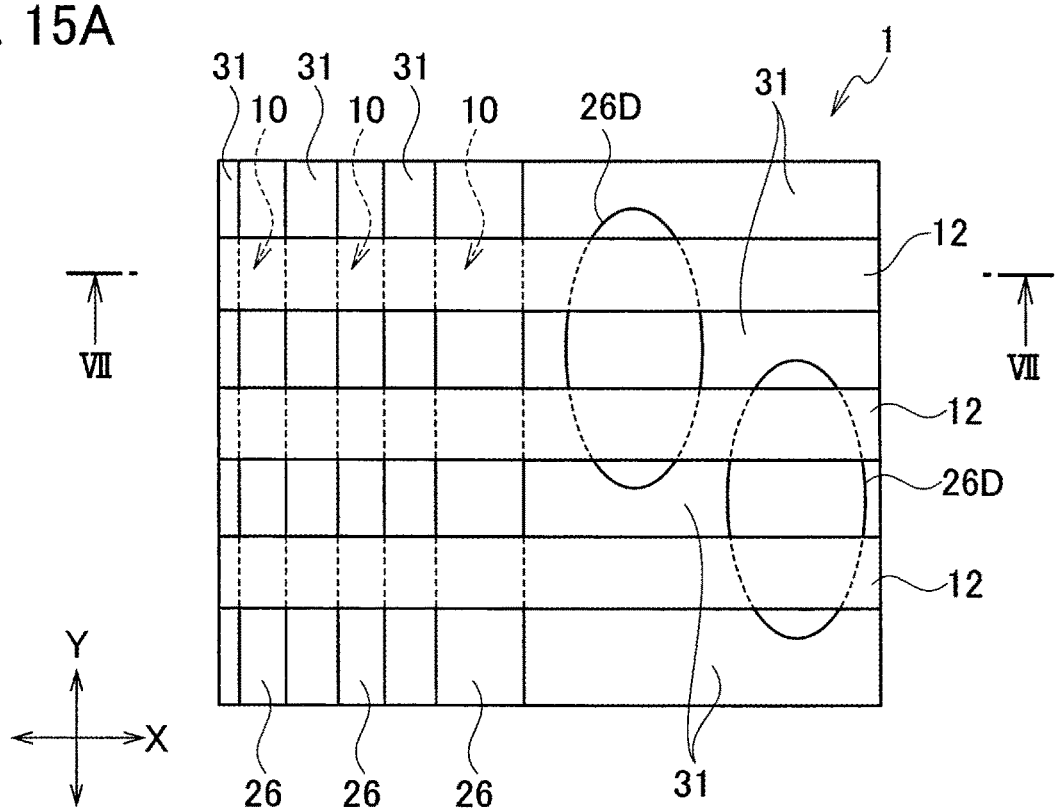
FIG. 15A is a schematic plane configuration diagram of a nonvolatile semiconductor memory device according to a fourth embodiment.
Figure 15B:
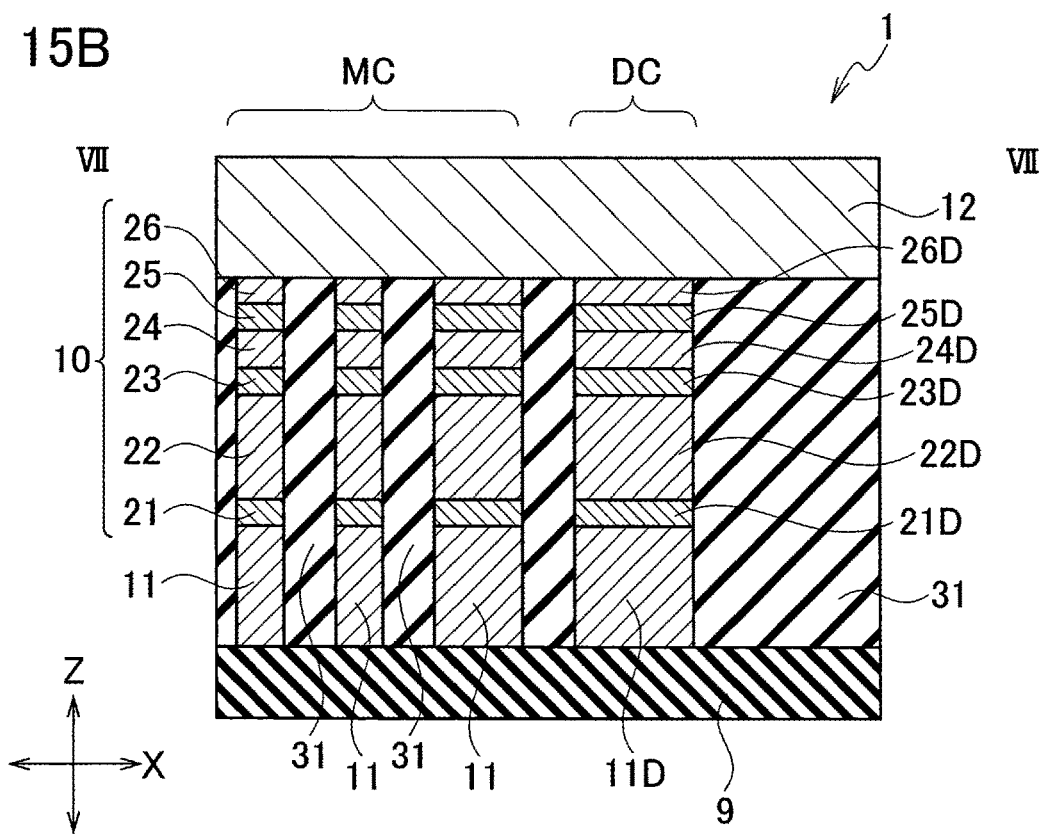
FIG. 15B is a schematic cross-sectional structure diagram of nonvolatile semiconductor memory device according to the fourth embodiment, taken in the line VII-VII of FIG. 15A.

FIG. 15A illustrates a schematic plane configuration of a nonvolatile semiconductor memory device 1 according to a fourth embodiment, and FIG. 15B illustrates a schematic cross-sectional structure taken in the line VII-VII of FIG. 15A.

A plurality of conductive layers 11D are arranged in an elliptic island shape in the Y direction on the insulating substrate 9. In addition, one conductive layer 11D is arranged so as to extend over two adjacent second wiring layers 12 in planar view. The Memory cell 10 and the dummy cell DC include the same stacked structure.

Even if the conductive layer 11D is arranged so as to extend over two adjacent second wiring layers 12 in planar view, since the stacked film 10 and the stacked film DC under between the second wiring layers 12 are also processed by the processing process of the second wiring layer 12, the dummy cell DC is divided. Accordingly, the pillar-shaped stacked film DC including the dummy cell DC is formed at the crossing portion between the second wiring layer 12 and the first conductive layer 11D, and the second wiring layer 12 may extend over the plurality of lower conductive layers 11D. The rest of the configuration is the same as that of the first embodiment.

Fifth Embodiment

Figure 16A:
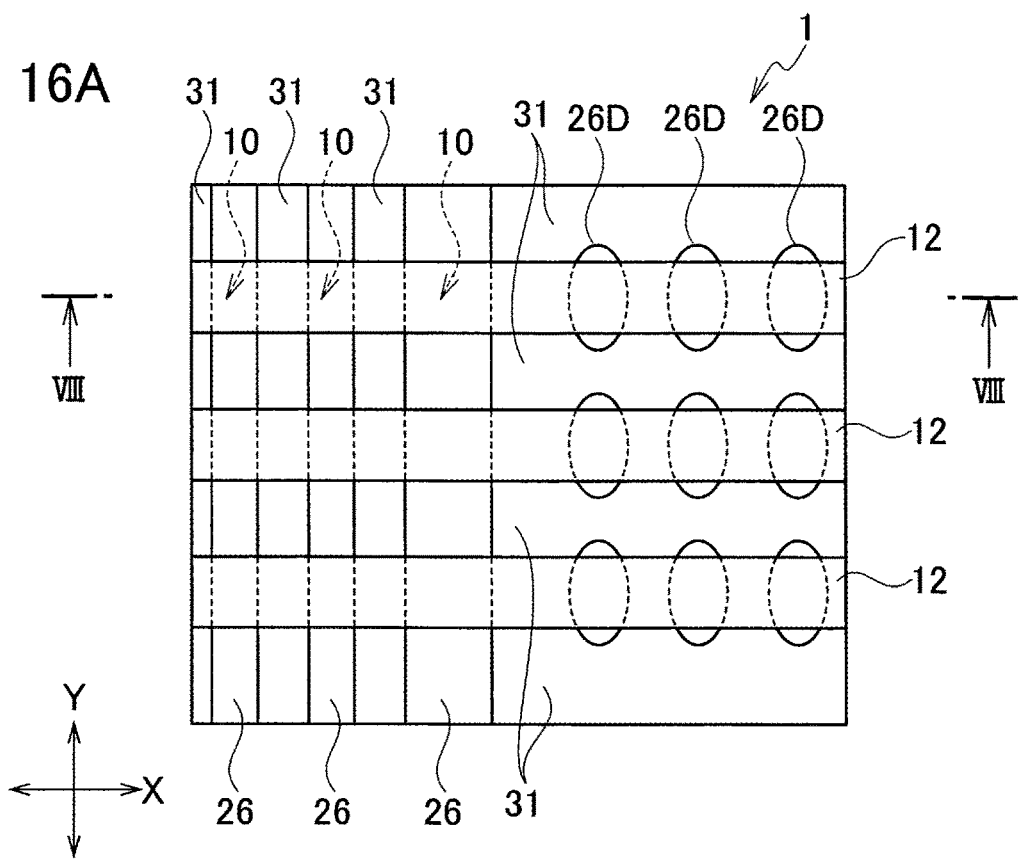
FIG. 16A is a schematic plane configuration diagram of a nonvolatile semiconductor memory device according to a fifth embodiment.
Figure 16B:
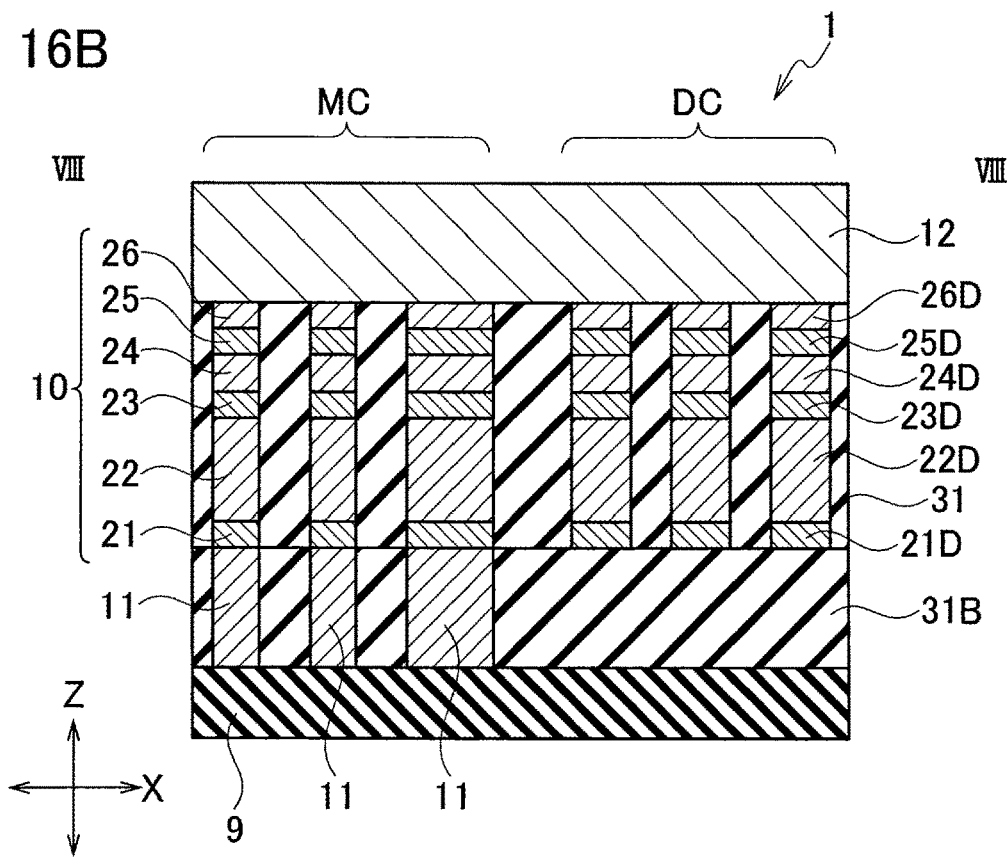
FIG. 16B is a schematic cross-sectional structure diagram of the nonvolatile semiconductor memory device according to the fifth embodiment, taken in the line VIII-VIII of FIG. 16A.

FIG. 16A illustrates a schematic plane configuration of a nonvolatile semiconductor memory device 1 according to a fifth embodiment, and FIG. 16B illustrates a schematic cross-sectional structure taken in the line VIII-VIII of FIG. 16A.

A plurality of dummy cells DC are arranged on the interlayer insulating film 31B formed on the insulating substrate 9 in an elliptic island shape in the Y direction. The Memory cell 10 and the dummy cell DC include the same stacked structure. The rest of the configuration is the same as that of the first embodiment.

Sixth Embodiment

Figure 17A:
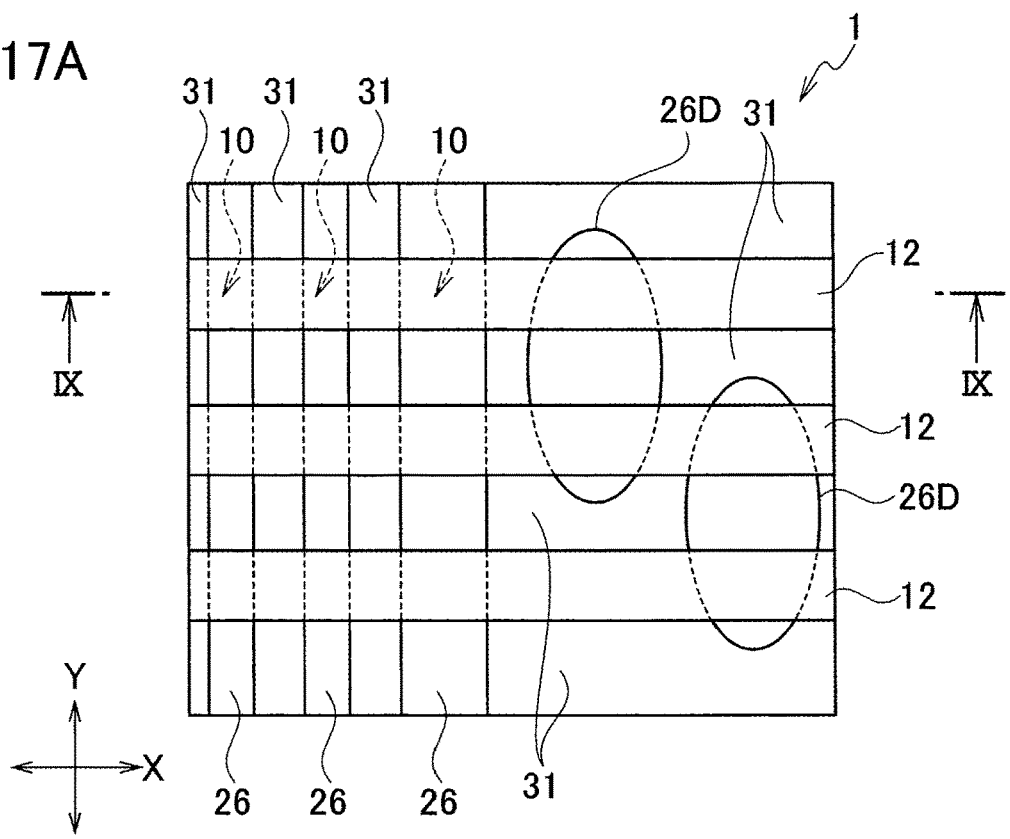
FIG. 17A is a schematic plane configuration diagram of a nonvolatile semiconductor memory device according to a sixth embodiment.
Figure 17B:
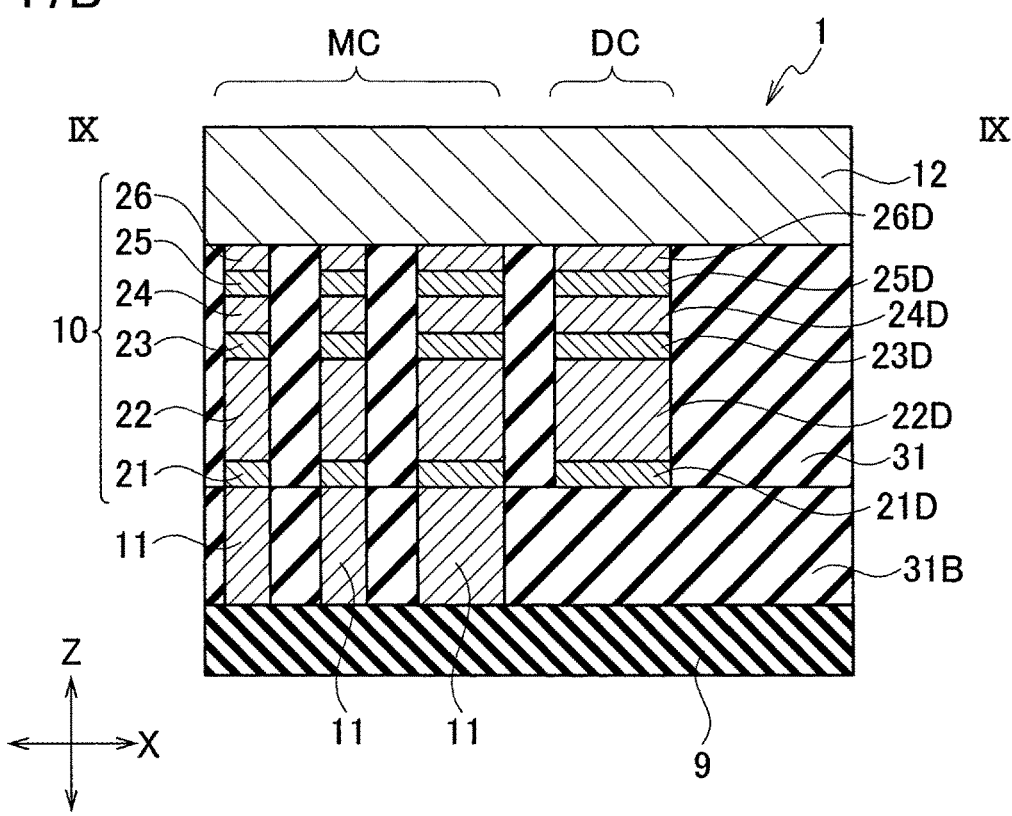
FIG. 17B is a schematic cross-sectional structure diagram of the nonvolatile semiconductor memory device according to the sixth embodiment, taken in the line IX-IX of FIG. 17A.

FIG. 17A illustrates a schematic plane configuration of a nonvolatile semiconductor memory device 1 according to a sixth embodiment, and FIG. 17B illustrates a schematic cross-sectional structure taken in the IX-IX of FIG. 17A.

A plurality of dummy cells DC are arranged on the interlayer insulating film 31B formed on the insulating substrate 9 in an elliptic island shape in the Y direction. In addition, one dummy cell DC is arranged so as to extend over two adjacent second wiring layers 12 in planar view. The Memory cell 10 and the dummy cell DC include the same stacked structure.

Even if one dummy cell DC is arranged so as to extend over two adjacent second wiring layers 12, since two second wiring layers 12 adjacent in the Y direction are divided from each other, there is no electrical connection. More specifically, since the second wiring layer 12 is processed into a line shape, and also the stacked film 10 and the stacked film DC under between the second wiring layers 12 processed into the line shape are also processed, the dummy cell DC is divided therefrom. Accordingly, the pillar-shaped stacked film DC may be formed at the crossing portion between the second wiring layer 12 and the interlayer insulating film 31B, and the second wiring layer 12 may extend over the plurality of lower dummy cells DC. The rest of the configuration is the same as that of the first embodiment.

Seventh Embodiment

Figure 19A:
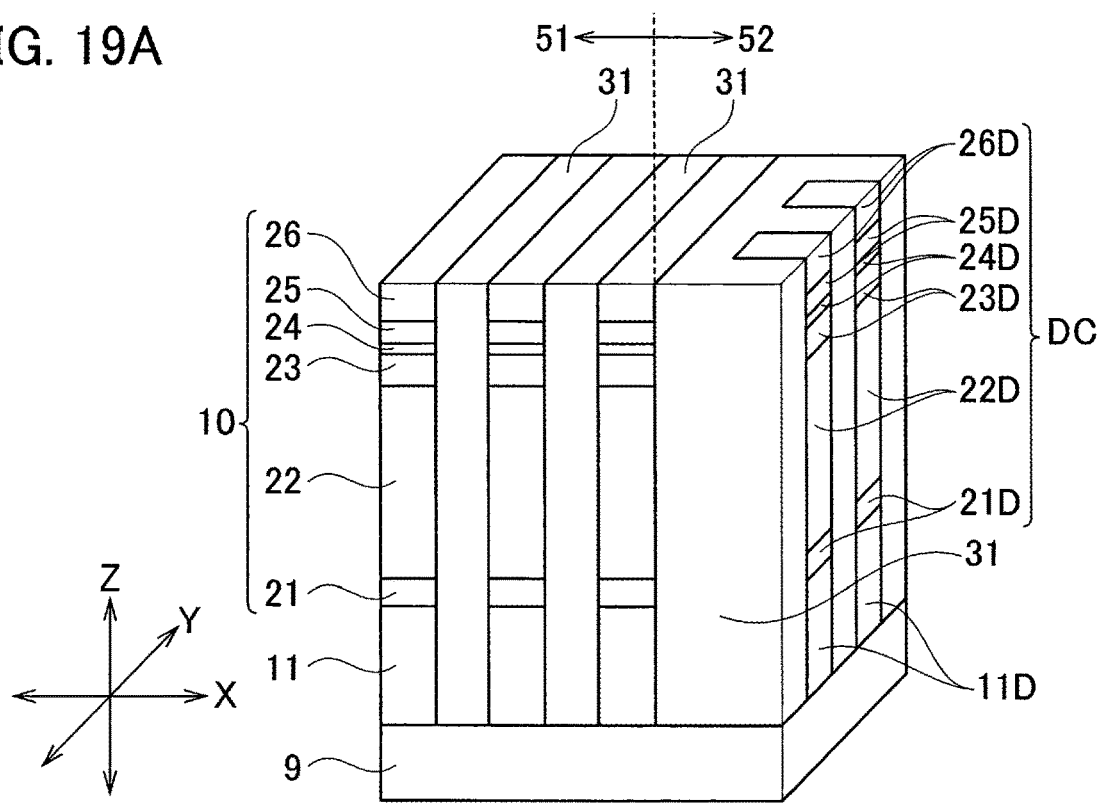
FIG. 19A is a schematic bird's-eye view configuration diagram for describing the first fabrication method of the nonvolatile semiconductor memory device according to the seventh embodiment, describing one process (Phase 3).
Figure 19B:
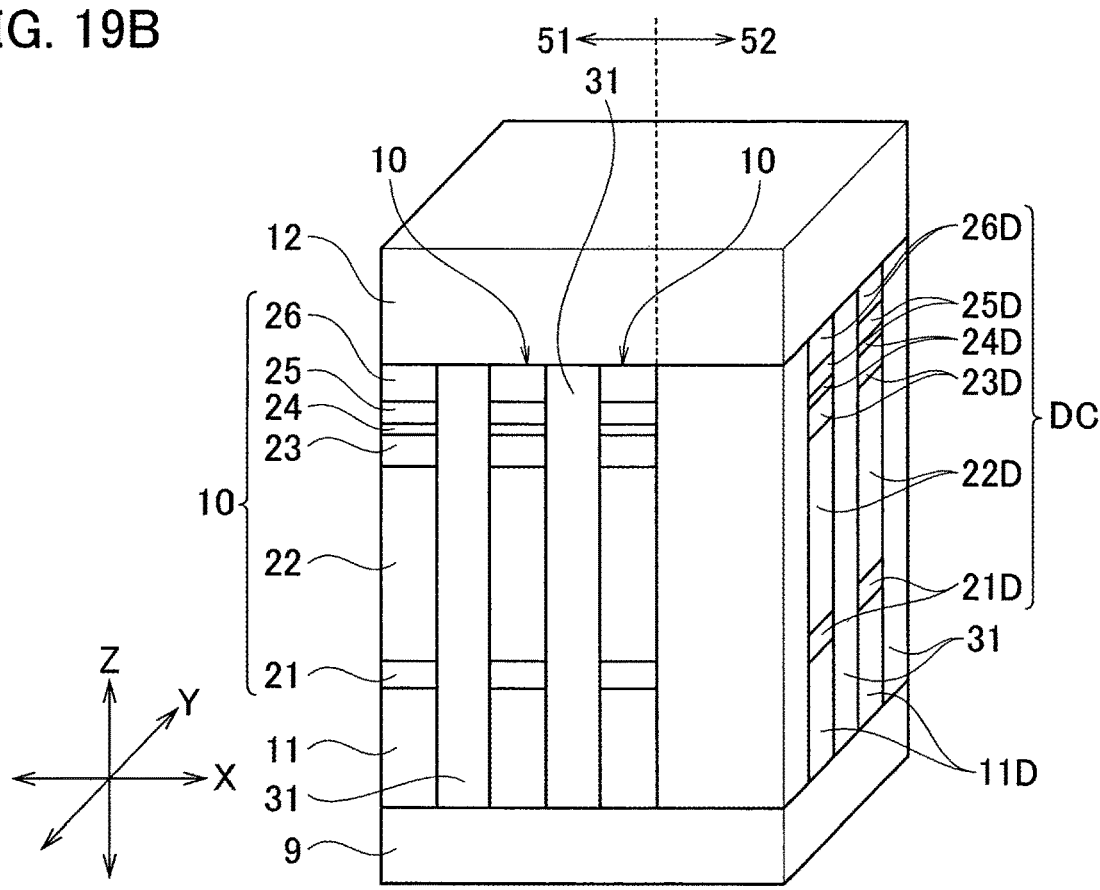
FIG. 19B is a schematic bird's-eye view configuration diagram for describing the first fabrication method of the nonvolatile semiconductor memory device according to the seventh embodiment, describing one process (Phase 4).
Figure 20:
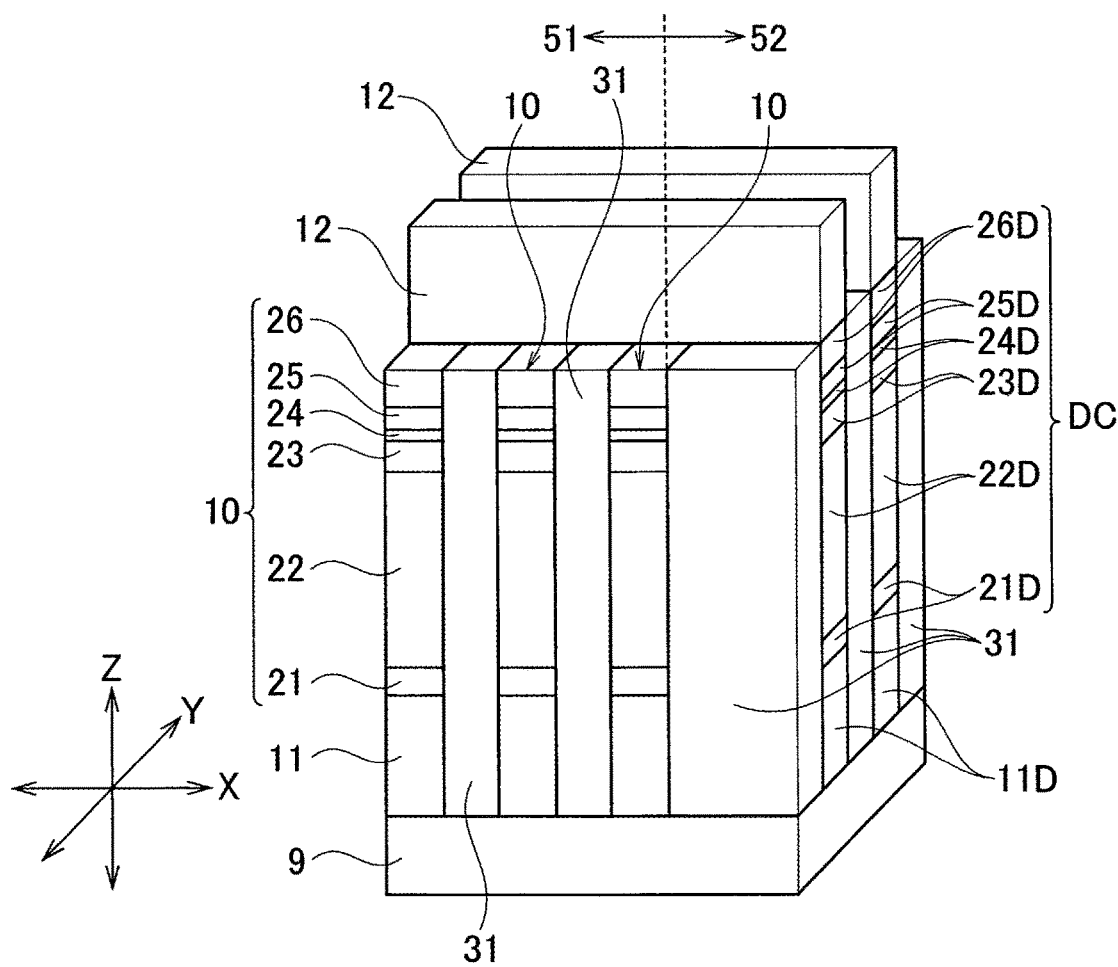
FIG. 20 is a schematic bird's-eye view configuration diagram for describing the first fabrication method of the nonvolatile semiconductor memory device according to the seventh embodiment, describing one process (Phase 5).
Figure 21:
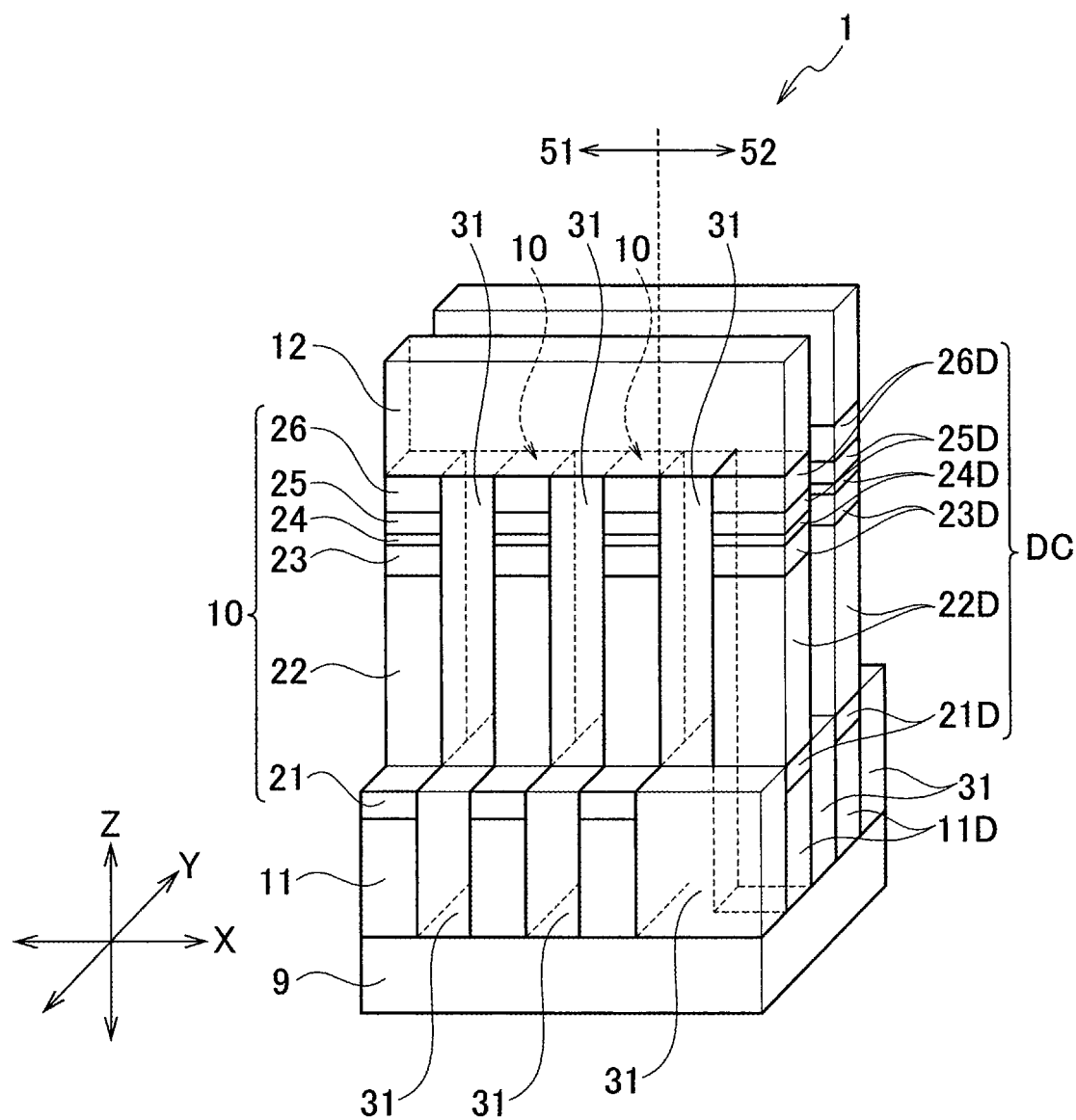
FIG. 21 is a schematic bird's-eye view configuration diagram for describing the first fabrication method of the nonvolatile semiconductor memory device according to the seventh embodiment, describing one process (Phase 6).

FIG. 21 illustrates a bird's-eye view structure of a nonvolatile semiconductor memory device 1 according to a seventh embodiment. Steps of a first fabrication method are expressed as illustrated in FIGS. 18 to 21.

In the seventh embodiment, a plurality of the conductive layers 11D have a rectangular shape, and the memory cell 10 and the dummy cell DC include the same stacked structure. Although two dummy cells DC are illustrated in FIG. 21, a plurality of the dummy cells DC can be separated from each other in the X and Y directions. The rest of the configuration is the same as that of the first embodiment.

(First Fabrication Method: One-Layered Cell Structure)

Hereinafter, a first fabrication method of the nonvolatile semiconductor memory device 1 according to the seventh embodiment will be described with reference to FIGS. 18 to 21. The first fabrication method can be similarly applied to the first to fourth embodiments.

Figure 18A:
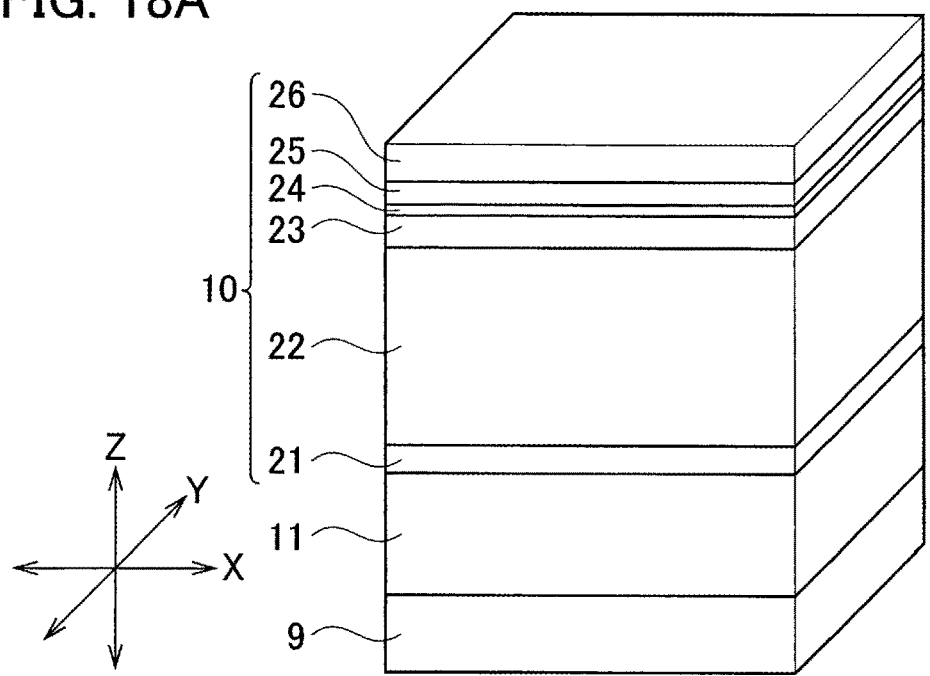
FIG. 18A is a schematic bird's-eye view configuration diagram for describing a first fabrication method of a nonvolatile semiconductor memory device according to a seventh embodiment, describing one process (Phase 1).
Figure 18B:
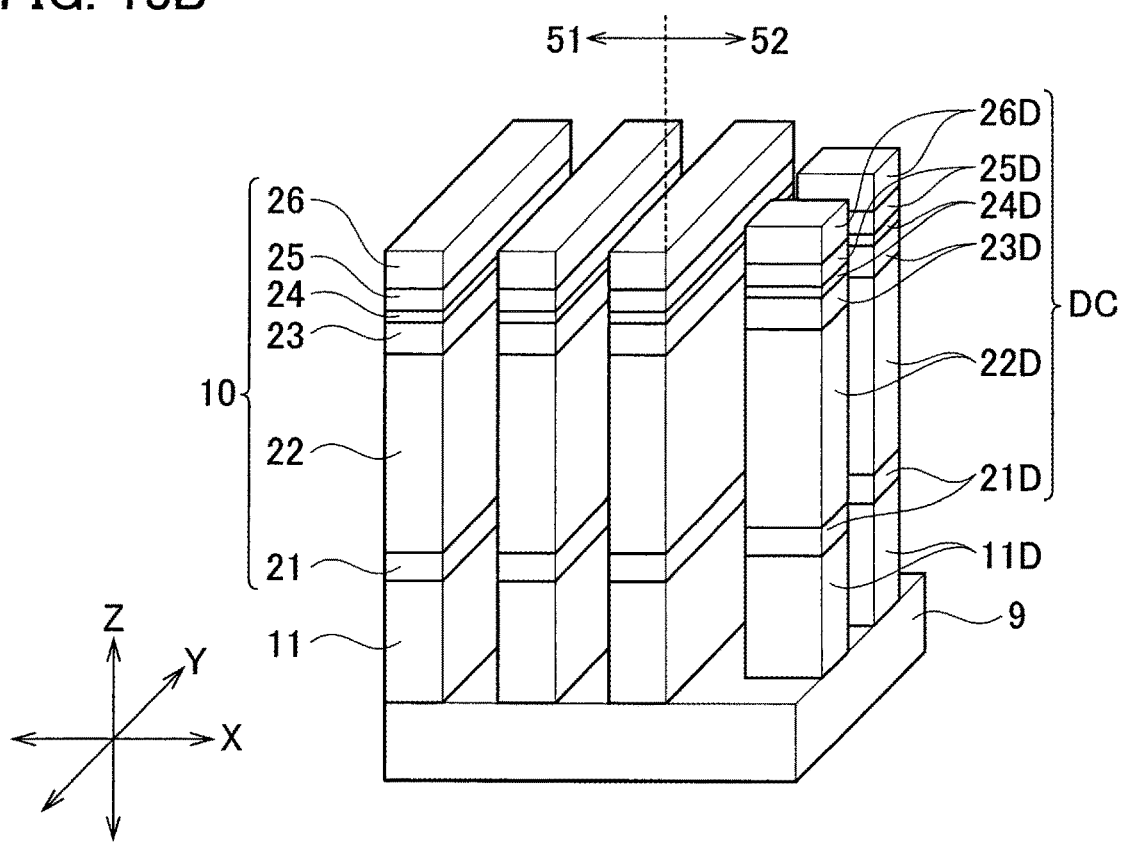
FIG. 18B is a schematic bird's-eye view configuration diagram for describing the first fabrication method of the nonvolatile semiconductor memory device according to the seventh embodiment, describing one process (Phase 2).

The first fabrication method includes, after stacking a stacked film 10 on a first wiring layer 11 formed on an insulating substrate 9, as illustrated in FIG. 18A, processing the stacked film 10 of a memory cell formation region 51 in a fin shape which extends in the Y direction, and processing the stacked film DC of the stacked structure formation region 52 into an island shape, as illustrated in FIG. 18B. Next, the first fabrication method includes forming an interlayer insulating film 31 so as to be planarized as illustrated in FIG. 19A. Next, the first fabrication method includes, after forming a metal layer (12) as illustrated in FIG. 19B, processing the metal layer (12) in a line shape to be extended in a second direction, thereby forming a second wiring layer 12 so as to be overlapped on the stacked film 10 of the memory cell formation region 51 and the stacked film DC of the stacked structure formation region 52, as illustrated in FIG. 20. Next, the first fabrication method includes processing the stacked film 10 and the interlayer insulating film 31 under between the second wiring layers 12, thereby forming a memory cell 10 having a pillar-shaped stacked film in the memory cell formation region 51 and forming a dummy cell DC having a pillar-shaped stacked film in the stacked structure formation region 52, as illustrated in FIG. 21. The details will be described below.

(a) First, as illustrated in FIG. 18A, after forming the first wiring layer 11 on the insulating substrate 9, the stacked films (21, 22, 23, 24, 25, 26) used as the memory cell 10 and the dummy cell DC are stacked on the first wiring layer 11. More specifically, the conductive film 21, the selector 22, the conductive film 23, the variable resistance film 24, the conductive film 25, and the electrode layer 26 are formed in order on the first wiring layer 11.

(b) Next, as illustrated in FIG. 18B, the stacked film 10 and the first wiring layer 11 are simultaneously process in a fin shape to be extended in the Y direction and the stacked film DC and the first conductive layer 11D are simultaneously process in an island shape, by using a Reactive Ion Etching (RIE) method. As a result, the stacked film 10 and the stacked film DC are formed.

The plurality of first wiring layers 11 and the plurality of stacked films 10 respectively formed on the first wiring layers 11 are arranged in the X direction which is orthogonal to the Y direction so as to sandwich a trench.

Moreover, the plurality of first conductive layers 11D and the stacked film DC on the first conductive layer 11D are arranged in the Y direction and the X direction so as to sandwich a trench.

(c) Next, as illustrated in FIG. 19A, the interlayer insulating films 31 are formed therebetween and are planarized using a Chemical Mechanical Polishing (CMP) technology or the like. Consequently, the interlayer insulating film 31 is embedded into the trench between the stacked films 10 and the trench between the stacked films DC formed by the processing.

In the memory cell formation region 51, the interlayer insulating film 31 is disposed in the region between the first wiring layers 11 adjacent to each other in the X direction, and is disposed in the region between the stacked films 10 adjacent to each other in the X direction. The interlayer insulating film 31 may be embedded via a liner film (not illustrated). The liner film is conformally formed, before forming the interlayer insulating film 31.

As the interlayer insulating film 31, a silicon oxide film or a silicon nitride film is formed by means of an Atomic Layer Deposition (ALD) method, a low-pressure Chemical Vapor Deposition (CVD), a flowable CVD method, or the like, for example.

The flowable CVD method is a kind of the plasma CVD method, and forms an SiOxNxHx film having flowability similar to a fluid by mixing impurities under a temperature of approximately 400° C., for example. Then, for example, by being baked in an O3 atmosphere at approximately 200° C. or by being subjected to water vapor gas processing under a temperature of approximately 350° C., $NH_3$ (gas) is extracted from the SiOxNxHx film to form SiO (silicon oxide film).

For example, the first wiring layer 11, the first conductive layer 11D, and the electrode layers 26 and 26D can be formed of tungsten, and the interlayer insulating film 31 can be formed of a silicon oxide film. Moreover, a silicon nitride film is formed as the liner film. Therefore, the liner film protects tungsten from oxidation and the like. The liner film may be eliminated depending on the materials of the first wiring layer and the materials of the interlayer insulating film 31.

The interlayer insulating film 31 formed in memory cell formation region 51 and the interlayer insulating film 31 formed in the stacked structure formation region 52 may be formed in multiple layers.

The interlayer insulating film 31 may include a silicon oxide film formed by means of a plasma Chemical Vapor Deposition (CVD) method, a low-pressure CVD method, an ALD method, a coating method, or the like, using material gas including TEOS (Tetraethyl orthosilicate, Tetraethoxysilane), for example.

Different kinds of films, e.g., a multilayer film including a silicon oxide film and a silicon nitride film, can be used for the interlayer insulating film 31. Alternatively, the same kind of a silicon oxide-based multilayer film can also be used for the interlayer insulating film 31, for example. However, a multilayer film of the same kind but different film quality can also be used for the interlayer insulating film 31.

For example, the silicon oxide film may contain hydrogen (H) caused by the material gas. Then, it is possible to control an amount of Si—H bond in the silicon oxide film in accordance with film formation methods or film formation conditions. Generally, a denser silicon oxide film tends to have a smaller amount of the Si—H bond. Accordingly, when the silicon oxide film is used as the interlayer insulating film 31, an etching rate can be controlled by controlling the amount of the Si—H bond in the interlayer insulating film to use a dense film, with respect to the RIE using a gas containing fluorocarbon ($C_4F_8$, $C_4F_6$, $CF_4$, or the like), for example.

While polishing and removing the interlayer insulating film 31 deposited above the stacked film 10 and the stacked film DC by the CMP method, for example, the upper surface of the interlayer insulating film 31 on the memory cell formation region 51 and the stacked structure formation region 52 is planarized. Furthermore, the liner film formed on the upper surface of the stacked film is removed, and thereby the upper surfaces of electrode layers 26 and 26D are exposed, as illustrated in FIG. 19A.

(d) Next, as illustrated in FIG. 19B, a metal layer used for the second wiring layer 12 is formed.

(e) Next, as illustrated in FIG. 20, the metal layer is processed into a line shape to be extended in the X direction. Consequently, the second wiring layer 12 is connected to the electrode layer 26 of the memory cell 10 and the electrode layer 26D of the dummy cell DC. Since the dummy cells DC are separated with each other, the second wiring layer 12 may be connected to the electrode layer 26D.

The plurality of second wiring layers 12 are arranged in the Y direction with a gap therebetween, and an upper surface of the stacked film 10 (an upper surface of the electrode layer 26) and an upper surface of the interlayer insulating film 31 are exposed between the second wiring layers 12 adjacent to one another in the Y direction.

The second wiring layer 12 is extended in the X direction on the memory cell formation region 51 in which the stacked film 10 is provided, and also extended on the dummy cell DC of the stacked structure formation region 52 around the memory cell formation region 51.

(f) Next, as illustrated in FIG. 21, the stacked film 10 and also the interlayer insulating film 31 under between the second wiring layers 12 processed into the line shape are processed by the RIE method using a mask which is not illustrated, and thereby the memory cell 10 is formed at the crossing portion between the second wiring layer 12 and the first wiring layer 11, and the dummy cell DC is formed at the crossing portion between the second wiring layer 12 and the first conductive layer 11D.

In this case, the RIE method using a gas containing fluorocarbon ($C_4F_8$, $C_4F_6$, $CF_4$, or the like) may be used for the etching of the stacked film 10 and the interlayer insulating film 31 under between the second wiring layers 12, for example. The stacked film 10 and the interlayer insulating film 31 under between the second wiring layers 12 are simultaneously etched to be removed.

(Second Fabrication Method: One-Layered Cell Structure)

Hereinafter, a second fabrication method of the nonvolatile semiconductor memory device 1 according to the seventh embodiment will be described with reference to FIGS. 22 to 23. The second fabrication method can be similarly applied to the first to sixth embodiments.

Figure 22:
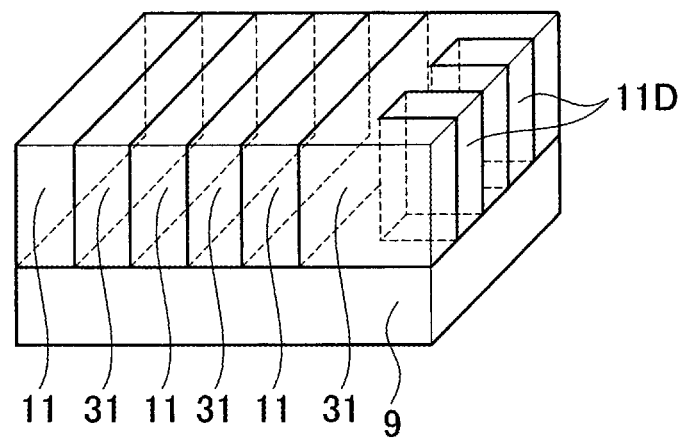
FIG. 22 is a schematic bird's-eye view configuration diagram for describing a second fabrication method of the nonvolatile semiconductor memory device according to the seventh embodiment, describing one process (Phase 1).
Figure 23A:
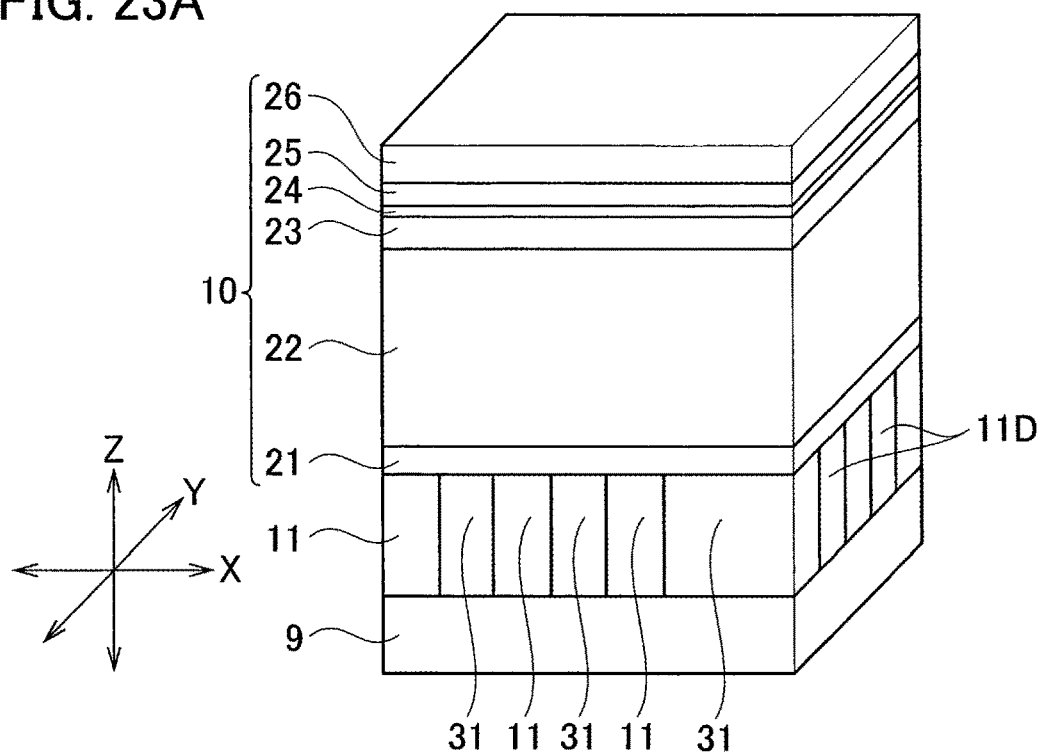
FIG. 23A is a schematic bird's-eye view configuration diagram for describing the second fabrication method of the nonvolatile semiconductor memory device according to the seventh embodiment, describing one process (Phase 2).
Figure 23B:
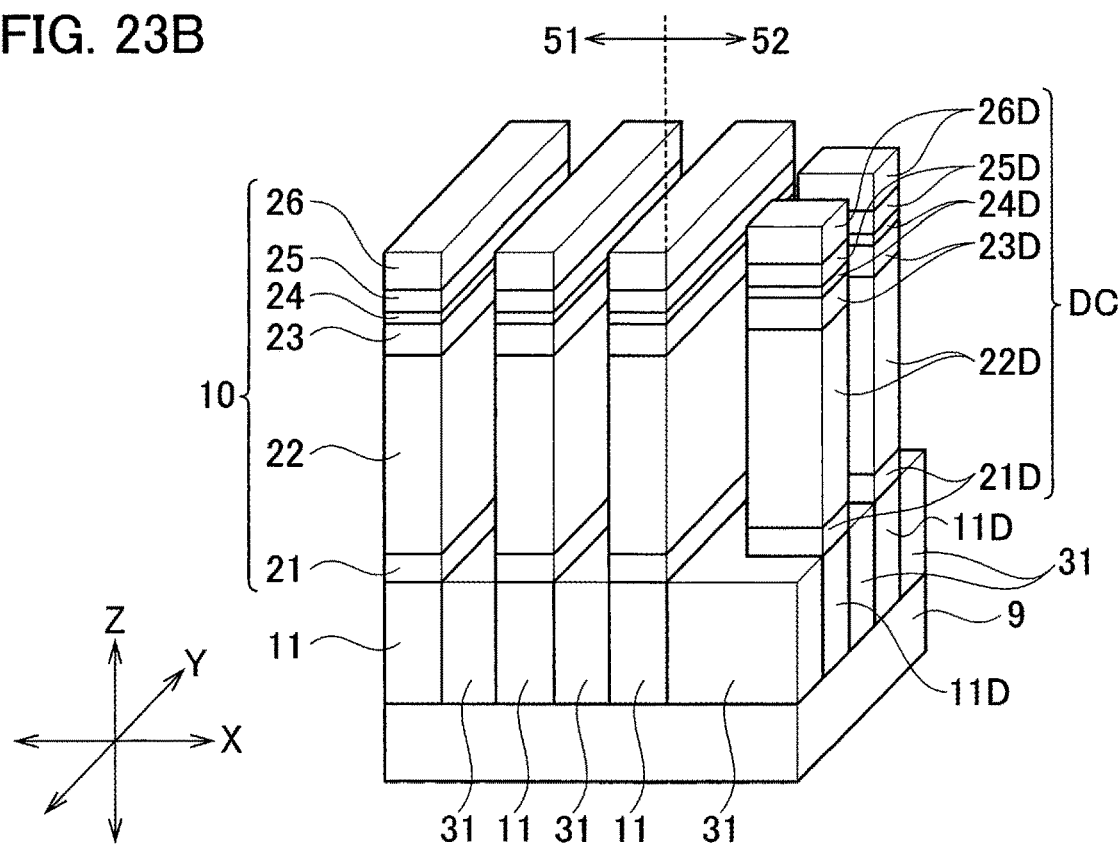
FIG. 23B is a schematic bird's-eye view configuration diagram for describing the second fabrication method of the nonvolatile semiconductor memory device according to the seventh embodiment, describing one process (Phase 3).

As illustrated in FIG. 22, the second fabrication method includes a step of pattern-forming a first wiring layer 11 on an insulating substrate 9 and then forming a first interlayer insulating film 31 so as to be planarized. Next, as illustrated in FIG. 23A, the second fabrication method includes a step of forming a stacked film 10 on the first wiring layer 11 and the interlayer insulating film 31. Next, as illustrated in FIG. 23B, the second fabrication method includes a step of processing the stacked film 10 on the first wiring layer 11 of the memory cell formation region 51 into a fin shape to be extended in the Y direction, and a step of processing the stacked film DC of the stacked structure formation region 52 into an island shape. Next, the third fabrication method includes forming a second interlayer insulating film 31 so as to be planarized, as in the case illustrated in FIG. 19A. Next, the second fabrication method includes, after forming a metal layer as illustrated in FIG. 19B, forming a second wiring layer 12 so as to be overlapped on the stacked film 10 of the memory cell formation region 51 and the stacked film DC of the stacked structure formation region 52 by processing the metal layer in a line shape to be extended in a second direction, as illustrated in FIG. 20. Next, the first fabrication method includes forming a memory cell 10 having a pillar-shaped stacked film in the memory cell formation region 51 and forming a dummy cell DC having a pillar-shaped stacked film in the stacked structure formation region 52 by processing the stacked film 10 and the interlayer insulating film 31 under between the second wiring layers 12, as illustrated in FIG. 21.

Moreover, the step of pattern-forming the first wiring layer 11 may include a step of simultaneously pattern-forming the first conductive layer 11D, as illustrated in FIG. 22.

Moreover, the step of forming the stacked film 10 on the first wiring layer 11 may include a step of simultaneously forming the stacked film 10 on the first conductive layer 11D, as illustrated in FIG. 23A.

Moreover, the step of processing the stacked film 10 on the first wiring layer 11 into a fin shape to be extended in the Y direction may have a step of simultaneously processing the stacked films DC on the first conductive layer 11D into an island shape.

In addition, the first conductive layer 11D may be arranged so as to extend over two adjacent second wiring layers 12 in planar view. The details will be described below.
(a) First, as illustrated in FIG. 22, after pattern-forming the first wiring layer 11 and the first conductive layer 11D on the insulating substrate 9, the interlayer insulating film 31 is formed on the whole surface of the device so as to be planarized using a CMP technique or the like. Consequently, the interlayer insulating film 31 is embedded between the pattern-formed first wiring layers 11 and between the first conductive layers 11D.
(b) Next, as illustrated in FIG. 23A, the stacked film used as the memory cell 10 and the dummy cell DC is formed. More specifically, a conductive film 21, a selector 22, a conductive film 23, a variable resistance film 24, a conductive film 25, and an electrode layer 26 are formed in order on the first wiring layer 11 and the first conductive layer 11D.
(c) Next, as illustrated in FIG. 23B, the stacked film 10 and the interlayer insulating film 31 are processed by using the RIE method or the like. As illustrated in FIG. 23B, the stacked film 10 on the first wiring layer 11 is processed into a fin shape to be extended in the Y direction, and the stacked film DC on the first conductive layer 11D is processed into an island shape. As a result, the stacked film 10 and the stacked film DC are formed.

The following steps are the same as those of the first fabrication method. More specifically, the nonvolatile semiconductor memory device 1 according to the seventh embodiment is formed in accordance with the steps illustrated in FIGS. 19 to 21.

(Third Fabrication Method: One-Layered Cell Structure)

Figure 24:
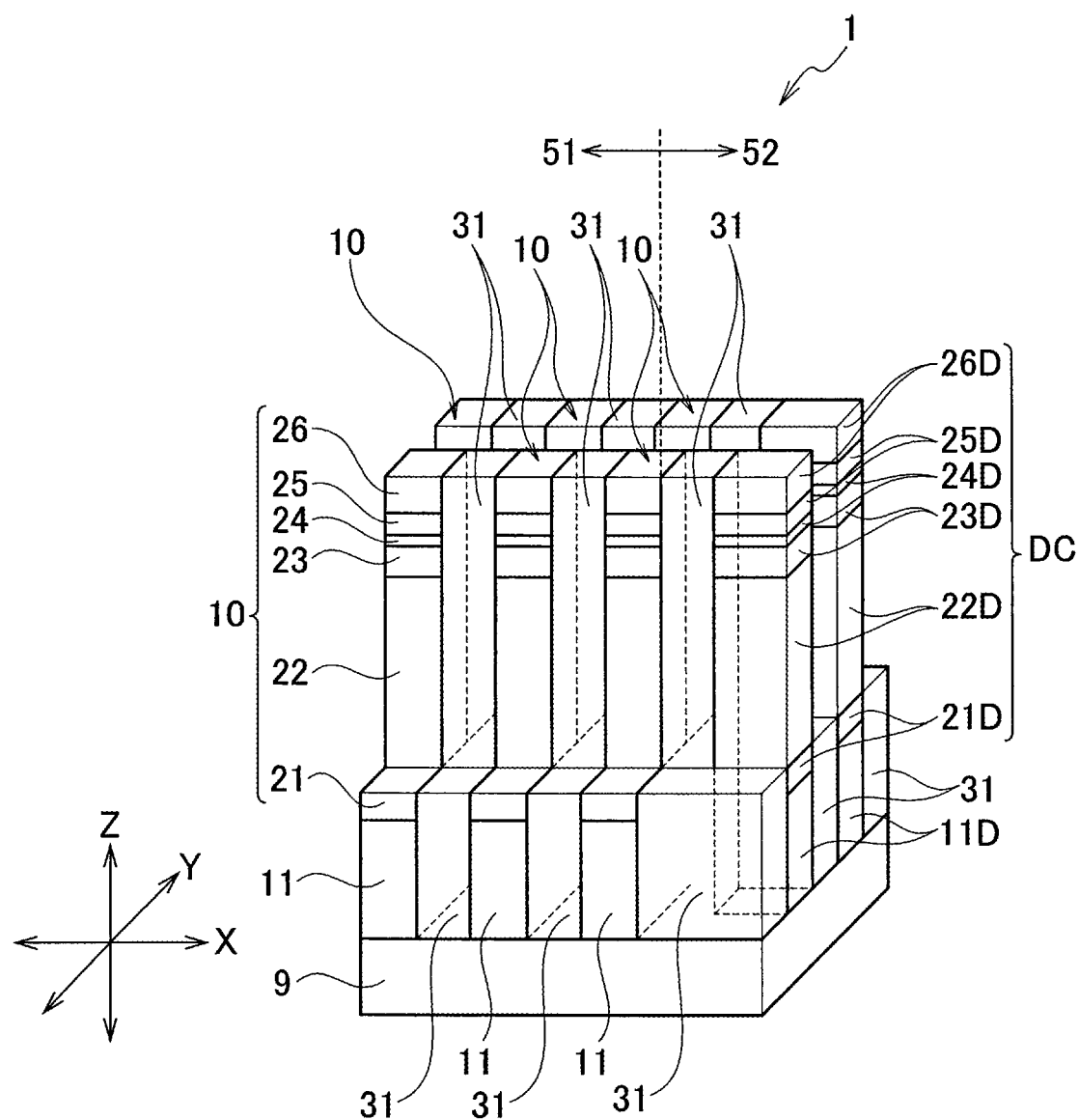
FIG. 24 is a schematic bird's-eye view configuration diagram for describing a third fabrication method of the nonvolatile semiconductor memory device according to the seventh embodiment, describing one process.

Hereinafter, a third fabrication method of the nonvolatile semiconductor memory device 1 according to the seventh embodiment will be described with reference to FIG. 24. The third fabrication method can be similarly applied to the first to sixth embodiments.

As illustrated in FIG. 22, the third fabrication method includes a step of pattern-forming a first wiring layer 11 on an insulating substrate 9 and then forming a first interlayer insulating film 31 so as to be planarized. Next, as illustrated in FIG. 23A, the third fabrication method includes a step of forming a stacked film 10 on the first wiring layer 11 and the interlayer insulating film 31. Next, as illustrated in FIG. 23B, the third fabrication method includes a step of processing the stacked film 10 on the first wiring layer 11 of the memory cell formation region 51 into a fin shape to be extended in the Y direction, and a step of processing the stacked film DC of the stacked structure formation region 52 into an island shape. Next, the third fabrication method includes forming a second interlayer insulating film 31 so as to be planarized, as in the case illustrated in FIG. 19A. Next, as illustrated in FIG. 24, the third fabrication method includes forming the stacked film 10 formed on the first wiring layer 11 is processed in the X direction crossing the Y direction to form the pillar-shaped stacked film 10 in the memory cell formation region 51 and to form the pillar-shaped stacked film DC in the stacked structure formation region 52. Next, the third fabrication method includes forming a third interlayer insulating film so as to be planarized. Next, the third fabrication method includes, after forming a metal layer as illustrated in FIG. 19B, forming a second wiring layer 12 so as to be overlapped on the stacked film 10 of the memory cell formation region 51 and the stacked film DC of the stacked structure formation region 52 by processing the metal layer in a line shape to be extended in a second direction, as illustrated in FIG. 20.

Moreover, the step of pattern-forming the first wiring layer 11 may include a step of simultaneously pattern-forming the first conductive layer 11D, as illustrated in FIG. 22.

Moreover, the step of forming the stacked film 10 on the first wiring layer 11 may include a step of simultaneously forming the stacked film 10 on the first conductive layer 11D, as illustrated in FIG. 23A.

Moreover, the step of processing the stacked film 10 on the first wiring layer 11 into a fin shape to be extended in the Y direction may have a step of simultaneously processing the stacked films DC on the first conductive layer 11D into an island shape.

In addition, the first conductive layer 11D may be arranged so as to extend over two adjacent second wiring layers 12 in planar view. The details will be described below.
(a) First, as illustrated in FIG. 22, after pattern-forming the first wiring layer 11 and the first conductive layer 11D on the insulating substrate 9, the interlayer insulating film 31 is formed on the whole surface of the device so as to be planarized using a CMP technique or the like. Consequently, the interlayer insulating film 31 is embedded between the pattern-formed first wiring layers 11 and the first conductive layers 11D.
(b) Next, as illustrated in FIG. 23A, the stacked film used as the memory cell 10 and the dummy cell DC is formed. More specifically, a conductive film 21, a selector 22, a conductive film 23, a variable resistance film 24, a conductive film 25, and an electrode layer 26 are formed in order on the first wiring layer 11 and the first conductive layer 11D.
(c) Next, as illustrated in FIG. 23B, the stacked film 10 and the interlayer insulating film 31 are processed by using the RIE method or the like. The stacked film 10 on the first wiring layer 11 is processed into a fin shape to be extended in the Y direction, and the stacked film DC on the first conductive layer 11D is processed into an island shape. As a result, the stacked film 10 and the stacked film DC are formed.
(d) Next, as in the case illustrated in FIG. 19A, the interlayer insulating film 31 are formed so ad to be planarized by using the CMP technique or the like. Consequently, the interlayer insulating film 31 is embedded into the trench between the stacked films 10 and the trench between the stacked films DC formed by the processing.
(e) Next, as illustrated in FIG. 24, the stacked film 10 formed on the first wiring layer 11 is processed in the X direction crossing the Y direction to form the pillar-shaped stacked film 10 including the memory cell and the pillar-shaped stacked film DC including the dummy sell.
(f) Next, the interlayer insulating films 31 are formed so as to be planarized by using the CMP technique or the like.

Consequently, the interlayer insulating film 31 is embedded into the trench between the pillar-shaped stacked films 10 and the trench between the pillar-shaped stacked films DC formed by the processing.

(g) Next, as in the case illustrated in FIG. 19B, a metal layer used for the second wiring layer 12 is formed.

(h) Next, as in the case illustrated in FIG. 20, the metal layer used for the second wiring layer 12 is processed into a line shape to be extended in the X direction.

Consequently, the second wiring layer 12 is connected to the electrode layer 26 of the memory cell 10 and the electrode layer 26D of the dummy cell DC, and thereby the nonvolatile semiconductor memory device 1 according to the seventh embodiment is formed.

(Aspect Ratio)

The following magnitude relationships between aspect ratios are established: AG1 is smaller than AS1; AS1 is substantially the same degree as AT1; and AG1 is substantially the same degree as AG2, or AG2 is slightly larger than AG, where AG1 is an aspect ratio at the time of processing the first wiring layer 11 as illustrated in FIG. 22, AS1 is an aspect ratio at the time of processing the stacked film 10 as illustrated in FIG. 23B, AT1 is an aspect ratio at the time of processing the stacked film 10 as illustrated in FIG. 24, and AG2 is an aspect ratio at the time of processing the second wiring layer 12 as illustrated in FIG. 20. Accordingly, the relationship of AG1≈AG2<AS1≈AT1 is realized.

In the first fabrication method, an aspect ratio at the time of forming the structure illustrated in FIG. 18B is AG1+AS1. Furthermore, an aspect ratio at the time of forming the structure illustrated in FIG. 21 is AG2+AS1.

In the second fabrication method, an aspect ratio at the time of forming the structure illustrated in FIG. 22 is AG1. Furthermore, an aspect ratio at the time of forming the structure illustrated in FIG. 23B is AS1. Furthermore, an aspect ratio at the time of forming the structure illustrated in FIG. 21 is AG2+AS1.

In the third fabrication method, an aspect ratio at the time of forming the structure illustrated in FIG. 22 is AG1. Furthermore, an aspect ratio at the time of forming the structure illustrated in FIG. 23B is AS1. Furthermore, an aspect ratio at the time of forming the structure illustrated in FIG. 24 is AT1. Furthermore, an aspect ratio at the time of forming the structure illustrated in FIG. 20 is AG2.

In the first fabrication method, although the mask patterning process is performed twice, the aspect ratios at the time of etching are respectively AG1+AS1 and AG2+AS1, and there are two etching processes with relatively high aspect ratios. On the other hand, in the first fabrication method, since the first wiring layer 11 and the stacked film 10 are simultaneously processed and the second wiring layer 12 and the stacked film 10 are simultaneously processed, no fine overlay process is performed.

In the second fabrication method, although the mask patterning process is performed three times, the aspect ratios at the time of etching are respectively AG1, AS1, and AG2+AS1, and the etching processes with relatively high aspect ratio is only one time. In the second fabrication method, since the stacked film 10 is processed after the processing of the first wiring layer 11, the precision of the fine overlay process is required in the processing of the stacked film 10. On the other hand, since the second wiring layer 12 and the stacked film 10 are simultaneously processed, no fine overlay process is performed in this step.

In the third fabrication method, although the mask patterning process is performed four times, the aspect ratios at the time of etching are respectively AG1, AS1, AT1, and AG1, and no the etching processes with relatively high aspect ratio is performed. In the third fabrication method, since the stacked film 10 is processed after the processing of the first wiring layer 11, the precision of the fine overlay process is required in the processing of the stacked film 10. Furthermore, since the second wiring layer 12 is processed after the processing of the stacked film 10, the precision of the fine overlay process is required in the processing of the second wiring layer 12.

In the first fabrication method, since the aspect ratio at the time of simultaneous processing of etching of the first wiring layer 11 and the stacked film 10 is high, a tendency for the width of the bottom of W to widen to a taper shape may also observed when the first wiring layer 11 is formed of W, for example. On the other hand, in the second fabrication method and the third fabrication method, such a tendency can be eliminated since the processing of the first wiring layer 11 is divided to be performed.

The first to third fabrication methods can be appropriately selected on the basis of the number of times of the mask patterning process, the magnitude relationship of the aspect ratios, the precision of the fine overlay process, and the pattern dimension of L/S (Line and Space).

Eighth Embodiment: Two-Layered Cell

Figure 30:
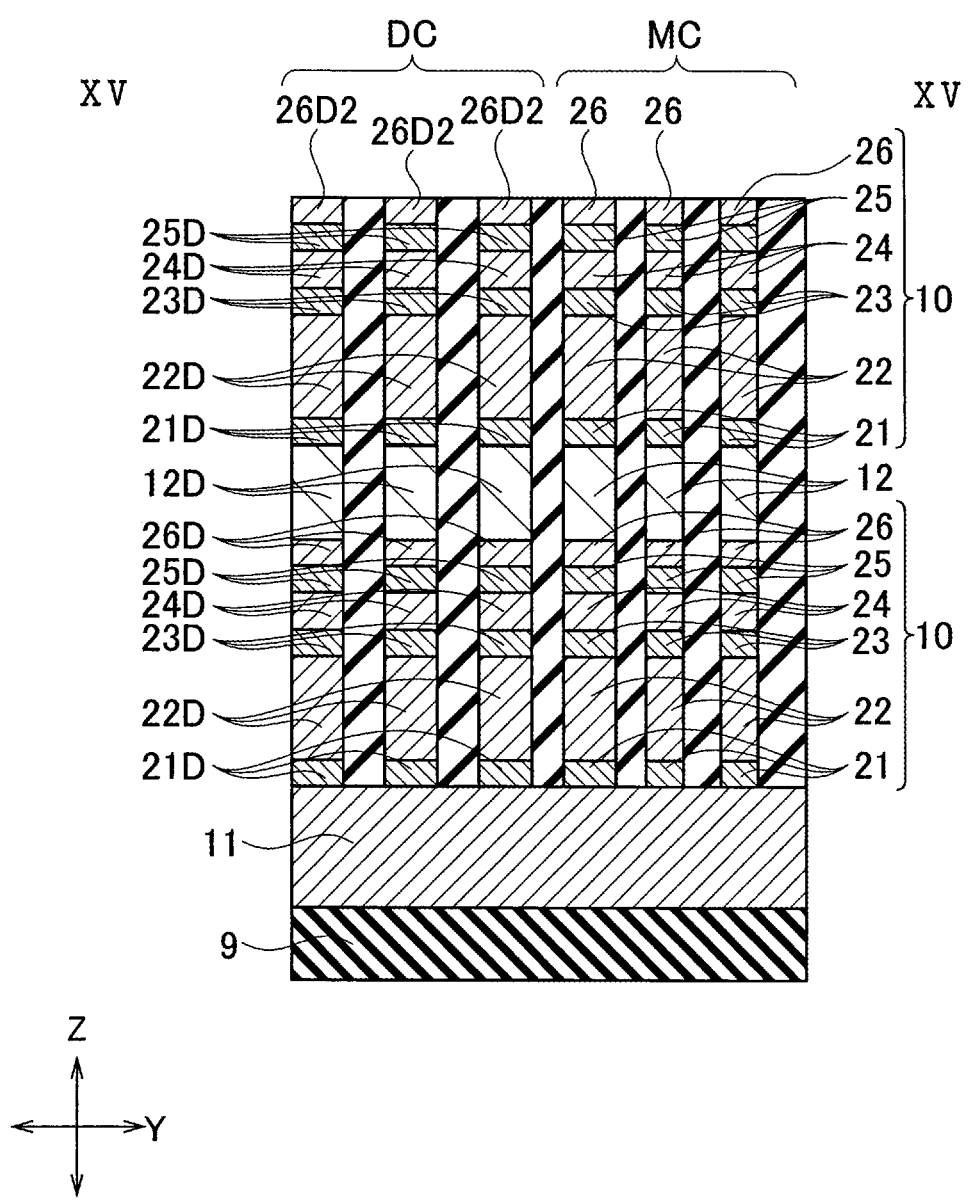
FIG. 30 is a schematic cross-sectional structure diagram for describing the fabrication method of the nonvolatile semiconductor memory device according to the eighth embodiment, taken in the line XV-XV of FIG. 26A.
Figure 31:
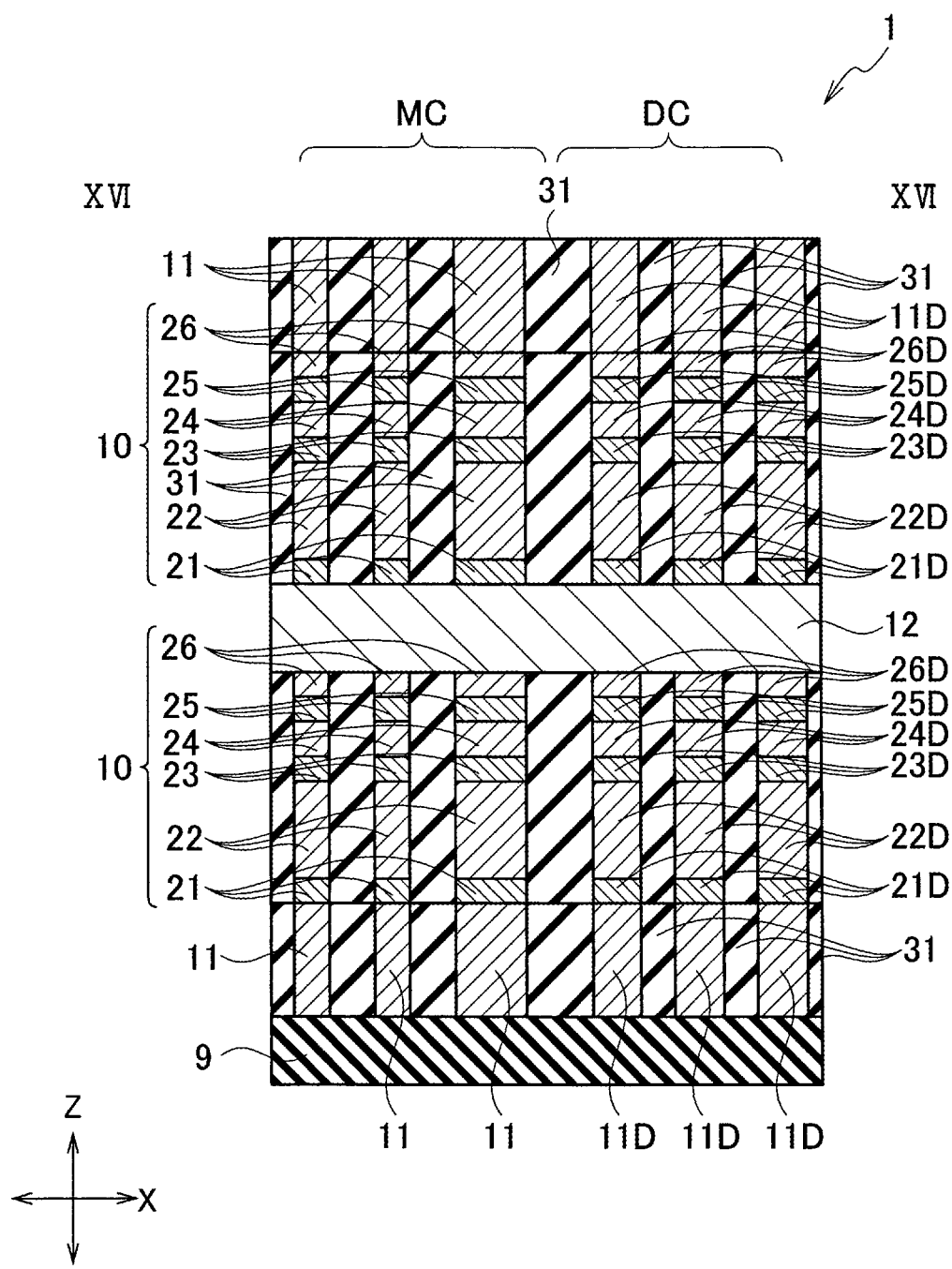
FIG. 31 is a schematic cross-sectional structure diagram for describing the fabrication method of the nonvolatile semiconductor memory device according to the eighth embodiment, taken in the line XVI-XVI of FIG. 26B.
Figure 32:
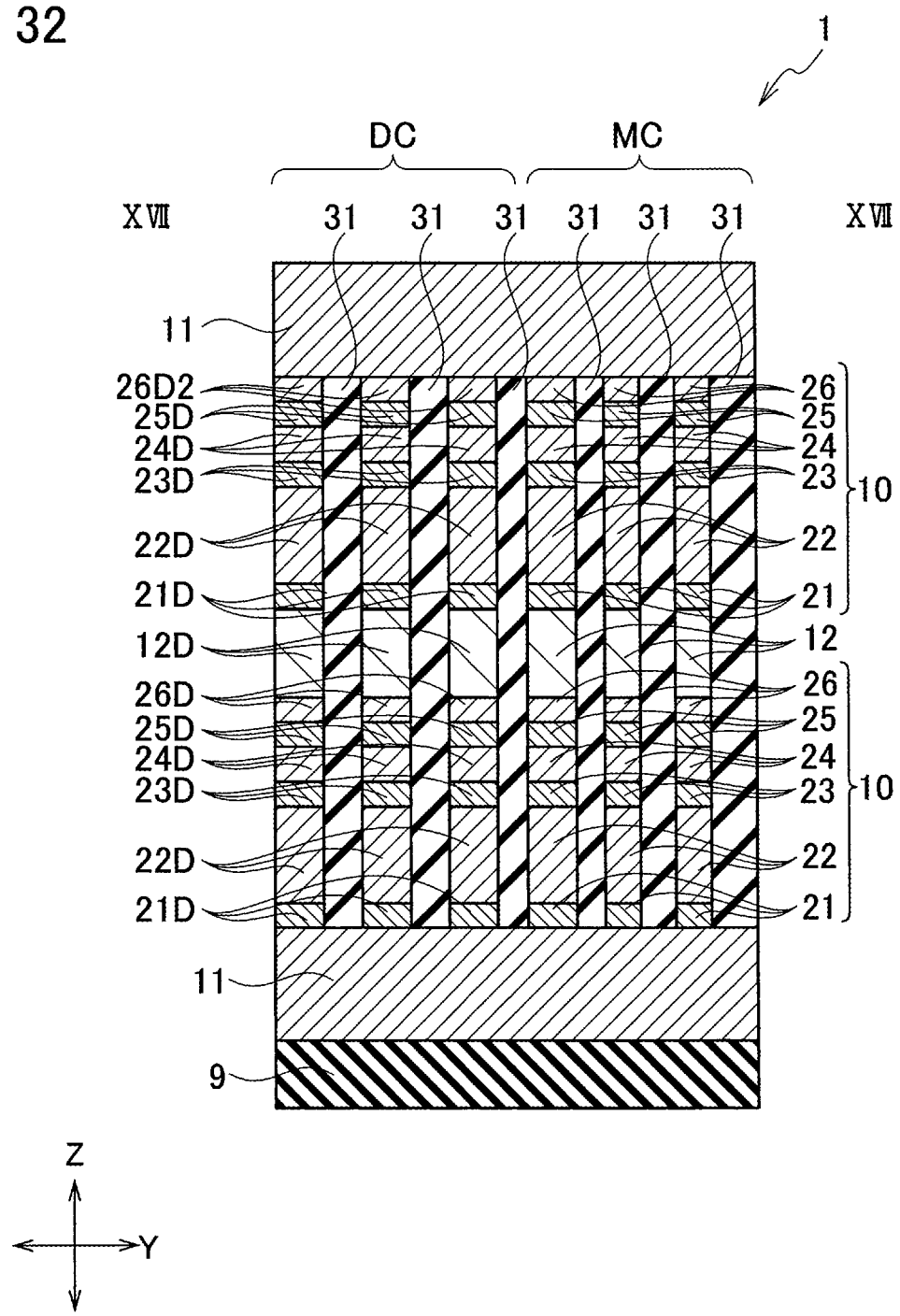
FIG. 32 is a schematic cross-sectional structure diagram for describing the fabrication method of the nonvolatile semiconductor memory device according to the eighth embodiment, taken in the line XVII-XVII of FIG. 26B.

FIGS. 31 and 32 illustrate a schematic cross-sectional structure of nonvolatile semiconductor memory device 1 according to an eighth embodiment. A fabrication method thereof is expressed as illustrated in FIGS. 25 to 32. Illustration of the liner film is omitted in each drawing.

In the example illustrated in FIGS. 31 and 32 of the nonvolatile semiconductor memory device 1 according to the eighth embodiment, the first memory cell 10 and the first dummy cell DC are arranged in one layer between the first wiring layer 11 and the second wiring layer 12, and the second memory cell 10 and the second dummy cell DC are further arranged in one layer between the second wiring layer 12 and the third wiring layer 11. More specifically, in the example of the nonvolatile semiconductor memory device 1 according to the eighth embodiment, the memory cell 10 and the dummy cell DC are respectively arranged in two layers.

As illustrated in FIGS. 31 and 32, the nonvolatile semiconductor memory device 1 according to the eighth embodiment includes: a plurality of first wiring layers 11 extended in the Y direction; a plurality of second wiring layers 12 extended in the X direction crossing the Y direction above the plurality of first wiring layers 11; and a first memory cell 10 disposed between the second wiring layer 12 and the first wiring layer 11 at a crossing portion between each of the plurality of second wiring layers 12 and each of the plurality of first wiring layers 11; and a first dummy cell DC disposed so as to be adjacent to the first memory cell 10 and configured to support the second wiring layer 12.

Figure 25A:
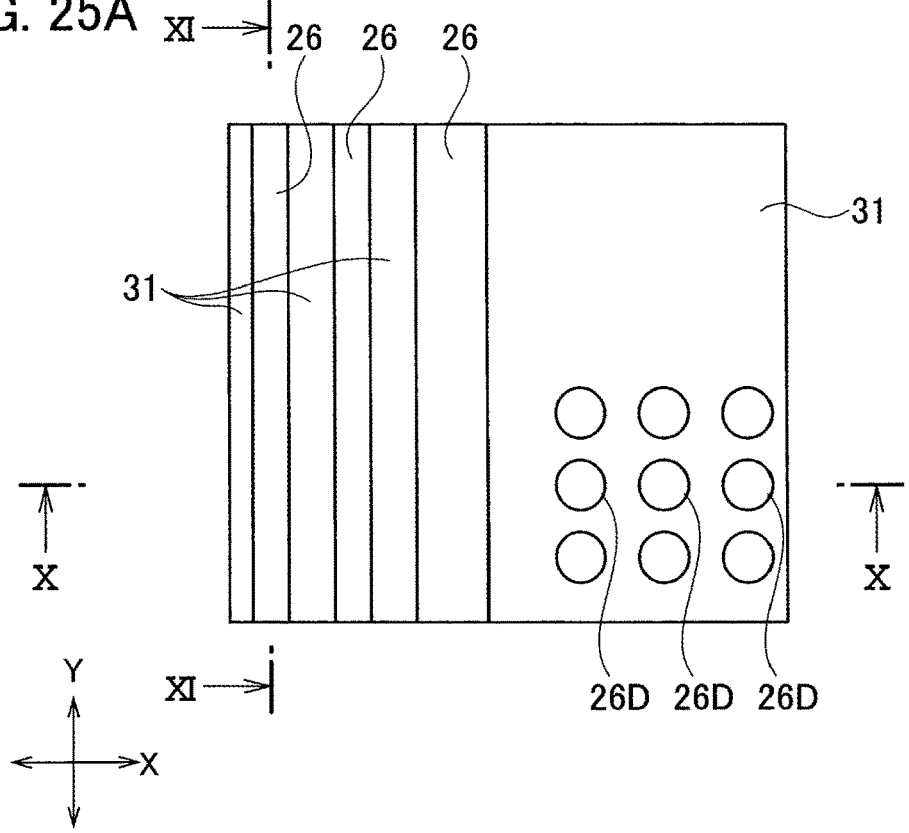
FIG. 25A is a schematic planar pattern configuration diagram for describing a fabrication method of a nonvolatile semiconductor memory device according to an eighth embodiment, describing one process (Phase 1).
Figure 25B:
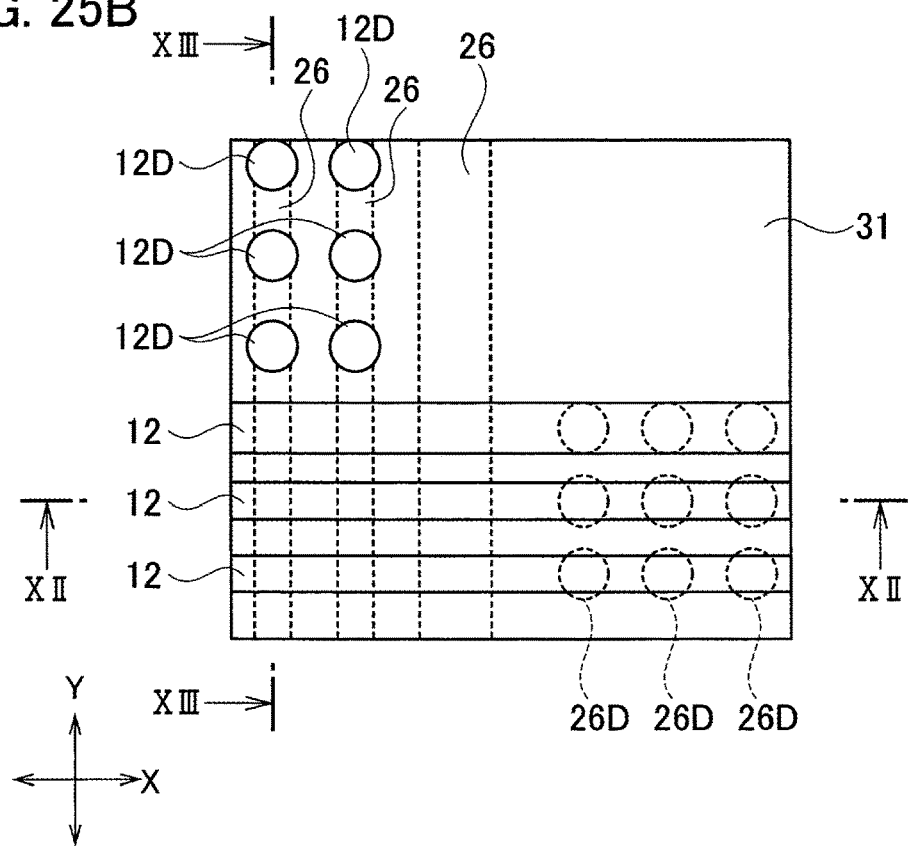
FIG. 25B is a schematic planar pattern configuration diagram for describing the fabrication method of the nonvolatile semiconductor memory device according to the eighth embodiment, describing one process (Phase 2).

As illustrated in FIGS. 25A and 25B, the first dummy cell DC having an electrode layer 26D formed on an uppermost surface thereof is disposed so as to be substantially overlapped on the second wiring layer 12, in the extending direction of the second wiring layer 12, in planar view.

Moreover, the nonvolatile semiconductor memory device 1 according to the eighth embodiment includes a first conductive layer 11D disposed so as to be adjacent to the first wiring layer 11 on the same plane as the plurality of first wiring layers 11, and The first dummy cell DC is disposed between the second wiring layer 12 and the first conductive layer 11D at the crossing portion between the first conductive layer 11D and the second wiring layer 12.

Furthermore, the nonvolatile semiconductor memory device 1 according to the eighth embodiment includes: a plurality of third wiring layers 11 extended in the first direction above the plurality of second wiring layers 12; and a second memory cell 10 disposed between the third wiring layer 11 and the second wiring layer 12 at a crossing portion between each of the plurality of third wiring layers 11 and each of the plurality of second wiring layers 12; and a second dummy cell DC disposed so as to be adjacent to the second memory cell 10 and configured to support the third wiring layer 11.

Figure 26A:
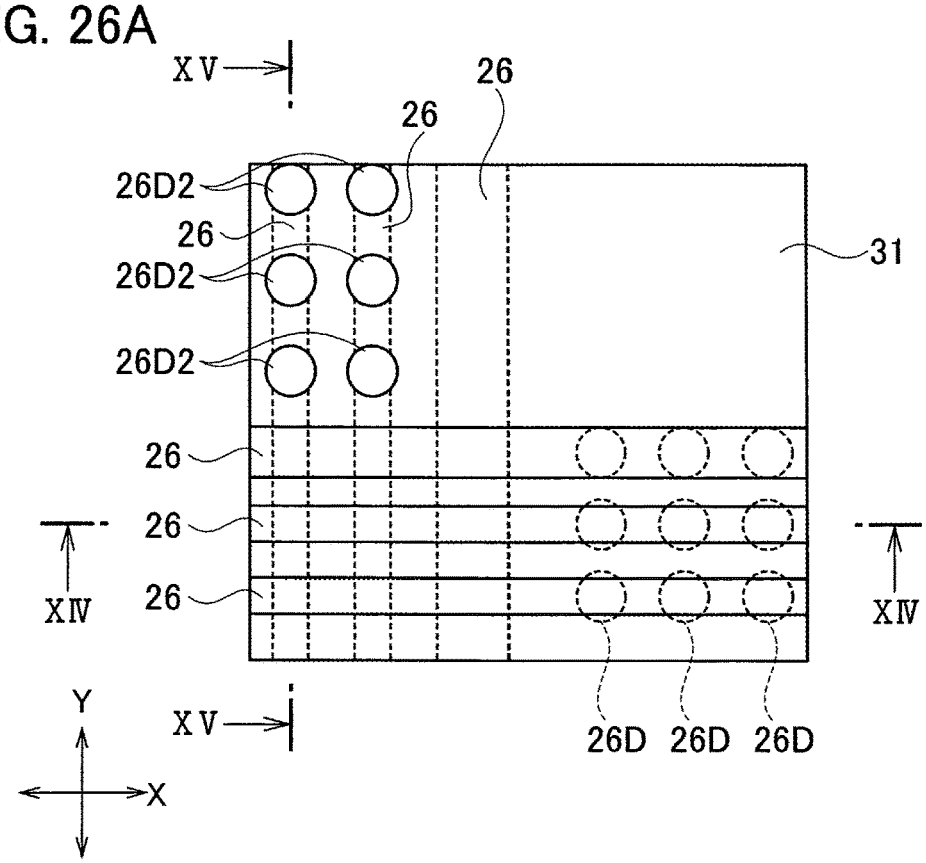
FIG. 26A is a schematic planar pattern configuration diagram for describing the fabrication method of the nonvolatile semiconductor memory device according to the eighth embodiment, describing one process (Phase 3).
Figure 26B:
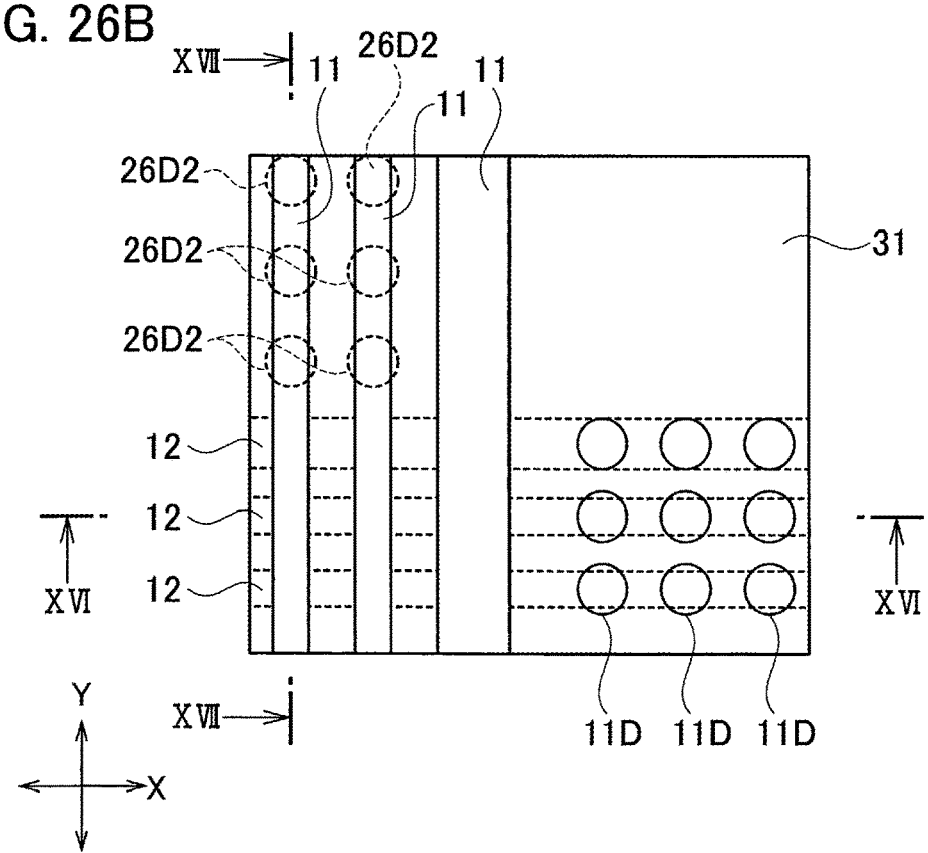
FIG. 26B is a schematic planar pattern configuration diagram for describing the fabrication method of the nonvolatile semiconductor memory device according to the eighth embodiment, describing one process (Phase 4).

As illustrated in FIGS. 26A and 26B, the second dummy cell DC having an electrode layer 26D2 formed on an uppermost surface thereof is disposed so as to be substantially overlapped on the third wiring layer 11, in the extending direction of the third wiring layer 11, in a planar view.

Moreover, the nonvolatile semiconductor memory device 1 according to the eighth embodiment includes a second conductive layer 12D disposed so as to be adjacent to the second wiring layer 12 on the same plane as the plurality of second wiring layers 12, and the second dummy cell DC is disposed between the third wiring layer 11 and the second conductive layer 12D at the crossing portion between the second conductive layer 12D and the third wiring layer 11.

The first conductive layer 11D and the second conductive layer 12D may have a rectangular shape, a circle shape, or an elliptical shape, and may be arranged in an island shape, in planar view.

The first conductive layer 11D may be arranged so as to extend over two adjacent second wiring layers 12 in planar view.

The second conductive layer 12D may be arranged so as to extend over two adjacent third wiring layers 11 in planar view.

The first dummy cell DC includes the same stacked structure as that of the first memory cell 10.

The second dummy cell DC includes the same stacked structure as that of the second memory cell 10.

(Fabrication Method: Two-Layered Cell)

In a fabrication method of the nonvolatile semiconductor memory device according to the eighth embodiment, and a schematic planar pattern configuration for explaining one step is expressed as illustrated in FIGS. 25A and 25B and FIG. 26A and FIG. 26B.

Figure 27A:
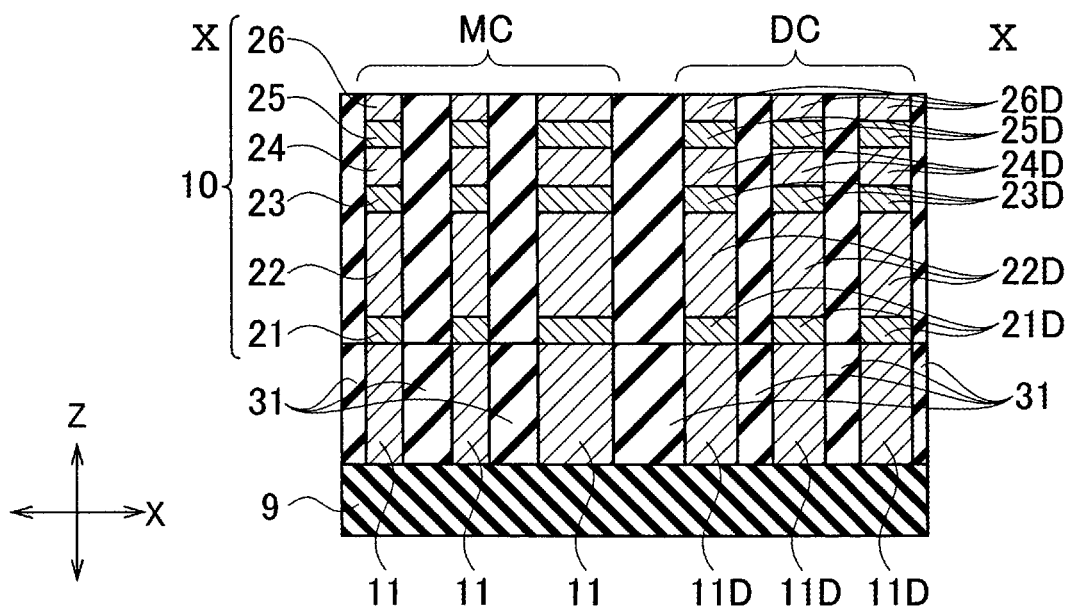
FIG. 27A is a schematic cross-sectional structure diagram for describing the fabrication method of the nonvolatile semiconductor memory device according to the eighth embodiment, taken in the line X-X of FIG. 25A.
Figure 27B:
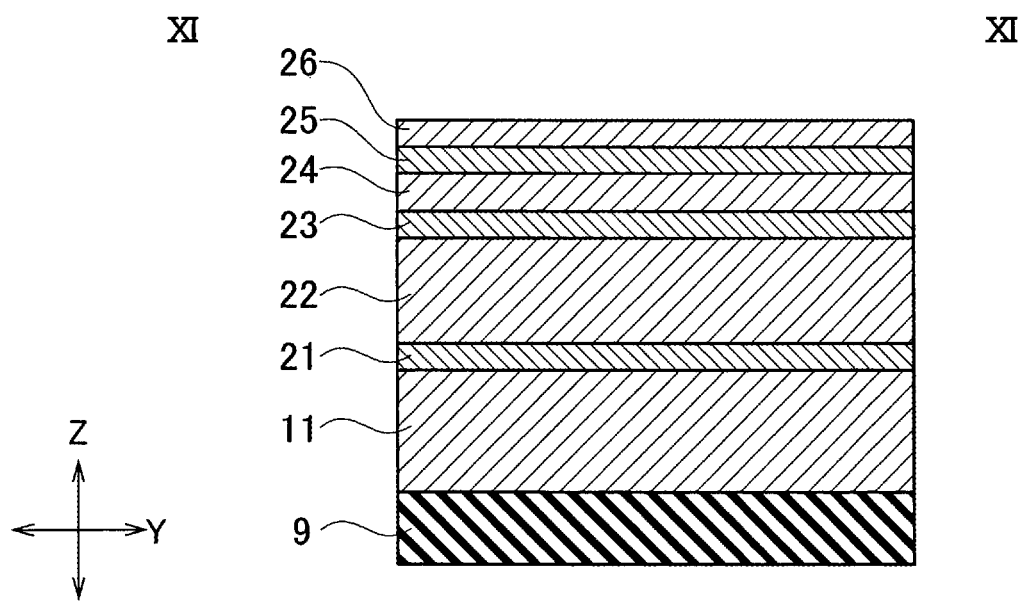
FIG. 27B is a schematic cross-sectional structure diagram for describing the fabrication method of the nonvolatile semiconductor memory device according to the eighth embodiment, taken in the line XI-XI of FIG. 25A.

(A) FIG. 27A illustrates a schematic cross-sectional structure taken in the line X-X of FIG. 25A, and FIG. 27B illustrates a schematic cross-sectional structure taken in the line XI-XI of FIG. 25A.

First, as in the case of FIG. 22, after the first wiring layer 11 and the first conductive layer 11D are pattern-formed on the insulating substrate 9, the interlayer insulating film 31 is formed, and then to be planarized. Consequently, the interlayer insulating film 31 is embedded between the pattern-formed first wiring layers 11 and the first conductive layers 11D.

Next, as in the case of FIG. 23A, the stacked film 10 used as the memory cell 10 and the dummy cell DC is formed.

Next, as in the case illustrated in FIG. 23B, the stacked film 10 and the interlayer insulating film 31 are processed. The stacked film 10 on the first wiring layer 11 is processed into a fin shape to be extended in the Y direction, and the stacked film DC on the first conductive layer 11D is processed into an island shape. Consequently, the stacked films (21, 22, 23, 24, 25, 26) used as the memory cell 10 and the stacked films (21D, 22D, 23D, 24D, 25D, 26D) used as the dummy cell DC are formed.

Alternatively, as in the case of the first fabrication method illustrated in FIGS. 18A and 18B, after stacking the memory cell 10 and the stacked films (21, 22, 23, 24, 25, 26) used as the dummy cell DC on the first wiring layer 11, the stacked film 10 and the first wiring layer 11 may be simultaneously processed in a fin shape to be extended in the Y direction, and the stacked film DC and the first conductive layer 11D may be simultaneously processed into an island shape.

Next, the interlayer insulating film 31 is formed to be planarized, as in the case of FIG. 19A. Consequently, as illustrated in FIG. 27A and FIG. 27B, the interlayer insulating film 31 is embedded in the trench between the stacked films 10 and in the trench between the stacked films DC which are formed by the processing.

Figure 28A:
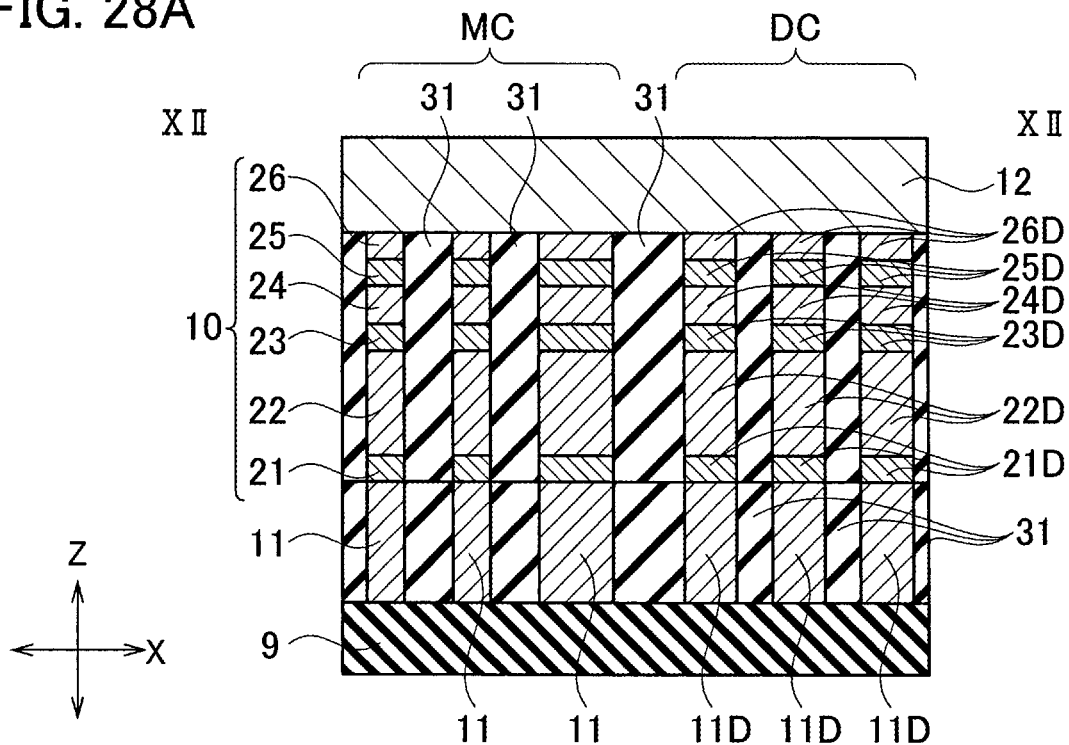
FIG. 28A is a schematic cross-sectional structure diagram for describing the fabrication method of the nonvolatile semiconductor memory device according to the eighth embodiment, taken in the line XII-XII of FIG. 25B.
Figure 28B:
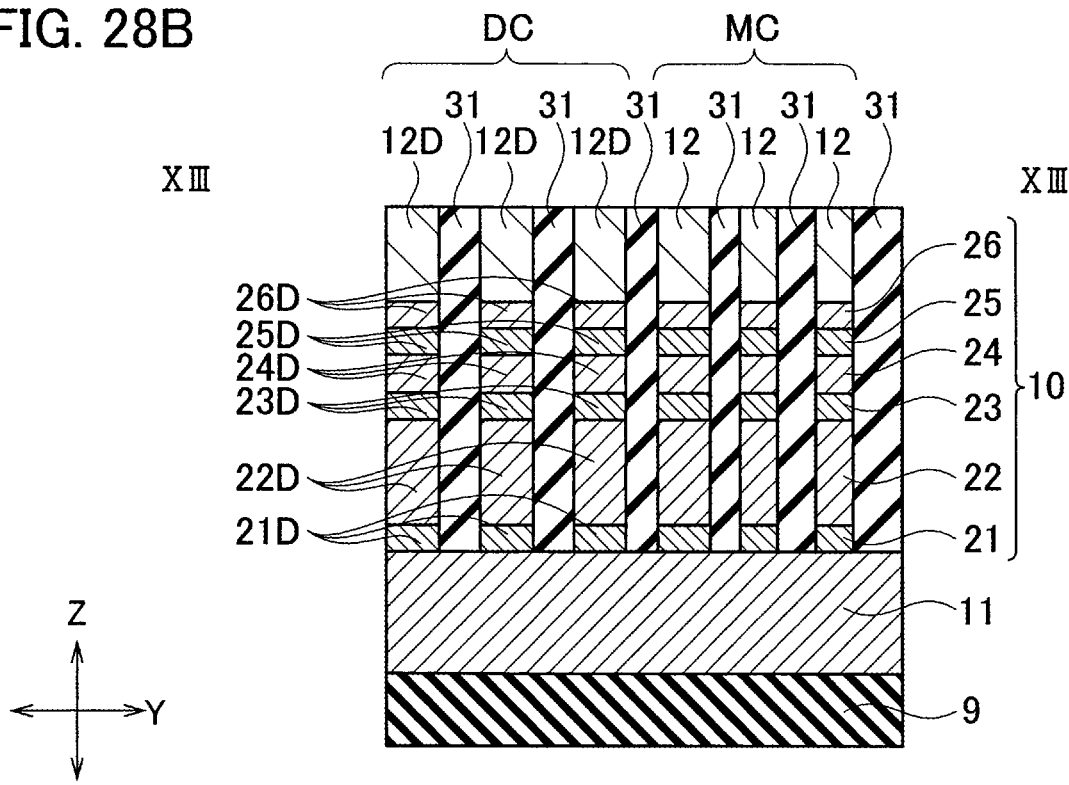
FIG. 28B is a schematic cross-sectional structure diagram for describing the fabrication method of the nonvolatile semiconductor memory device according to the eighth embodiment, taken in the line XIII-XIII of FIG. 25B.

(B) FIG. 28A illustrates a schematic cross-sectional structure taken in the line XII-XII of FIG. 25B, and FIG. 28B illustrates a schematic cross-sectional structure taken in the line XIII-XIII of FIG. 25B.

As in the case illustrated in FIG. 19B, a metal layer used for the second wiring layer 12 is formed. Next, as in the case illustrated in FIG. 20, the metal layer used for the second wiring layer 12 is processed into a line shape to be extended in the X direction. Consequently, the second wiring layer 12 is electrically connected to the electrode layer 26 of the memory cell 10 and the electrode layer 26D of the dummy cell DC.

Next, the stacked film 10 and the interlayer insulating film 31 under between the second lower wiring layers 12 which are processed into the line shape are also processed by using the RIE method, and thereby the pillar-shaped stacked films (21, 22, 23, 24, 25, 26) including the memory cell 10 and the pillar-shaped stacked films (21D, 22D, 23D, 24D, 25D, 26D) including the dummy cell DC are formed at the crossing portion between the second wiring layer 12 and the first wiring layer 11.

Next, as illustrated in FIGS. 28A and 28B, the interlayer insulating film 31 is formed to be planarized.

Figure 29:
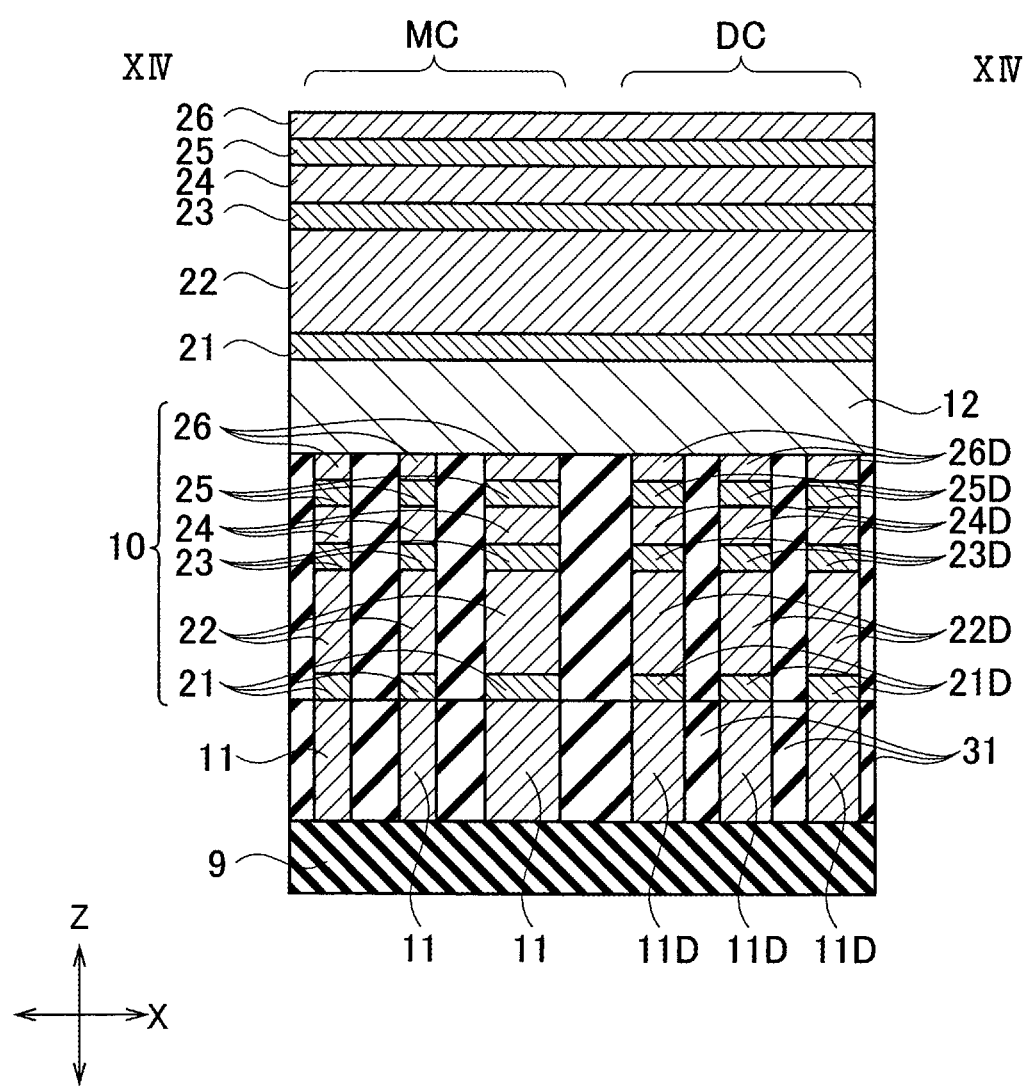
FIG. 29 is a schematic cross-sectional structure diagram for describing the fabrication method of the nonvolatile semiconductor memory device according to the eighth embodiment, taken in the line XIV-XIV of FIG. 26A.

(C) FIG. 29 illustrates a schematic cross-sectional structure taken in the line XIV-XIV of FIG. 26A, and FIG. 30 illustrates a schematic cross-sectional structure taken in the line XV-XV of FIG. 26A.

As in the case of FIG. 23A, the stacked film 10 used as the second memory cell 10 and the second dummy cell DC is formed.

Next, the stacked film 10 is processed as in the case of FIG. 23B. The stacked film 10 on the second wiring layer 12 is processed into a fin shape to be extended in the X direction, and the stacked film DC on the second conductive layer 12D is processed into an island shape. Consequently, the stacked films (21, 22, 23, 24, 25, 26) used as the second memory cell 10 and the stacked films (21D, 22D, 23D, 24D, 25D, 26D) used as the second dummy cell DC are formed.

Next, the interlayer insulating film 31 is formed on the whole surface of the device to be planarized, as in the case of FIG. 19A. Consequently, as illustrated in FIG. 29 and FIG. 30, the interlayer insulating film 31 is embedded in the trench between the stacked films 10 and in the trench between the stacked films DC which are formed by the processing.

(D) FIG. 31 illustrates a schematic cross-sectional structure taken in the line XVI-XVI of FIG. 26B, and FIG. 32 illustrates a schematic cross-sectional structure taken in the line XVII-XVII of FIG. 26B.

As in the case illustrated in FIG. 19B, a metal layer used for the second wiring layer 12 is formed. Next, as in the case illustrated in FIG. 20, the metal layer used for the third wiring layer 11 is processed into a line shape to be extended in the Y direction. Consequently, the third wiring layer 11 is electrically connected to the electrode layer 26 of the second memory cell 10 and the electrode layer 26D of the second dummy cell DC.

Next, the stacked film 10 and the interlayer insulating film 31 under between the third lower wiring layers 11 which are processed into the line shape are also processed by using the RIE method, and thereby the pillar-shaped stacked films (21, 22, 23, 24, 25, 26) including the second memory cell 10 and the pillar-shaped stacked films (21D, 22D, 23D, 24D, 25D, 26D) including the second dummy cell DC are formed at the crossing portion between the third wiring layer 11 and the second wiring layer 12.

Next, the interlayer insulating film 31 is formed on the whole surface of the device to be planarized, as illustrated in FIGS. 31 and 32. When the number of layers is further increased, the above-described steps are repeated in accordance with the number of the stacked memory cell arrays.

Ninth Embodiment: Multilayered Cell

Figure 33A:
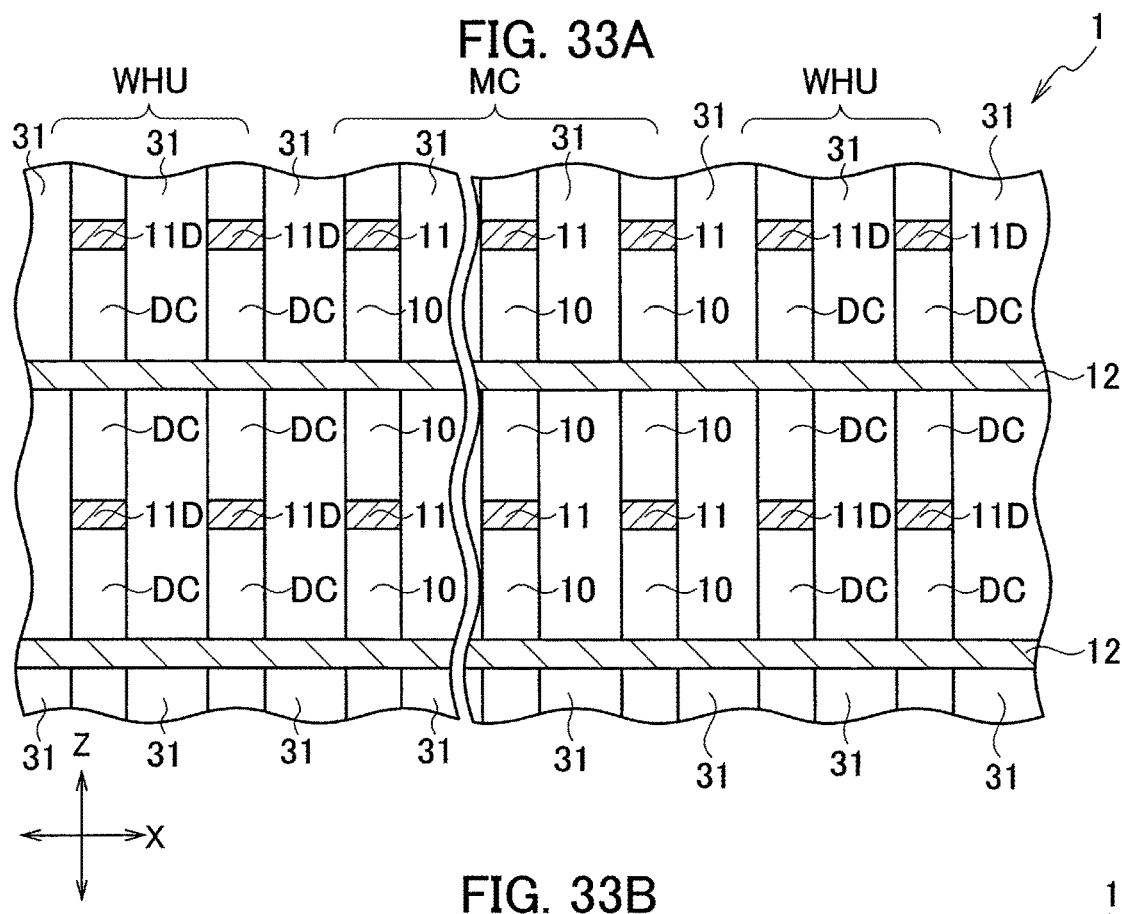
FIG. 33A is a schematic cross-sectional structure diagram of a nonvolatile semiconductor memory device according to a ninth embodiment, along a direction of X-Z.
Figure 33B:
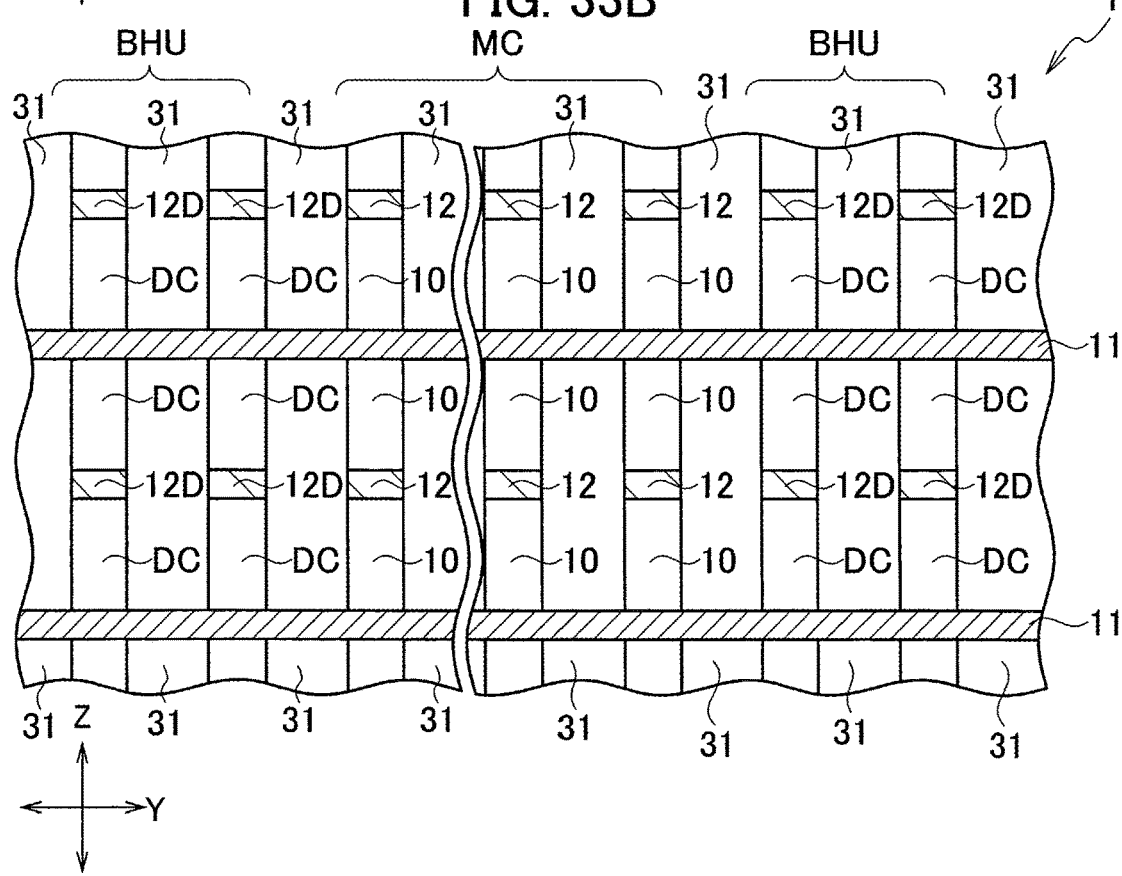
FIG. 33B is a schematic cross-sectional structure diagram of the nonvolatile semiconductor memory device according to the ninth embodiment, along the direction of Y-Z.

FIG. 33A illustrates a schematic cross-sectional structure along the X-Z direction of a nonvolatile semiconductor memory device according to a ninth embodiment, and FIG. 33B illustrates a schematic cross-sectional structure along the Y-Z direction thereof. The example of the nonvolatile semiconductor memory device according to the ninth embodiment illustrates an example in which the memory cell 10 and the dummy cell DC are stacked into a multilayered structure having four or more layers. Although a plurality of the first wiring layers 11, a plurality of the second wiring layers 12, a plurality of the memory cells 10, a plurality of the dummy cells DC, a plurality of the first conductive layers 11D, and a plurality of the second conductive layers 12D are disposed therein, in FIGS. 33A and 33B, the rest of regions are filled up with the interlayer insulating film 31.

The plurality of memory cells 10 are disposed in a matrix respectively at cross-points between the plurality of first wiring layers 11 and the plurality of second wiring layers 12, in the memory cell array 1A. On the other hand, the dummy cells DC are respectively disposed in a word line hookup portion WHU and a bit line hookup portion BHU of the peripheral portion of the memory cell array 1A. The memory cell array 1A including the first wiring layer 11, the second wiring layer 12, the memory cell 10, and the dummy cell DC is multilayered in accordance with the number of stacked layers.

As illustrated in FIG. 33A, the nonvolatile semiconductor memory device according to the ninth embodiment includes: a plurality of first wiring layers 11 extended in the Y direction; a plurality of second wiring layers 12 extended in the X direction crossing the Y direction above the plurality of first wiring layers 11; a first memory cell 10, including a first variable resistance film, disposed between the second wiring layer 12 and the first wiring layer 11 at a crossing portion between each of the plurality of second wiring layers 12 and each of the plurality of first wiring layers; a plurality of first wiring layers 11D disposed on the same plane as the plurality of first conductive layers 11 in an island shape; and a plurality of first dummy cells DC adjacent to the first memory cell 10, disposed between the first conductive layer 11D and the second wiring layer 12, and configured to support the second wiring layer 12.

As illustrated in FIG. 33B, the nonvolatile semiconductor memory device according to the ninth embodiment includes: a plurality of second wiring layers 12 extended in the X direction; a plurality of third wiring layers 11 extended in the Y direction crossing the X direction above the plurality of second wiring layers 12; a second memory cell 10, including a second variable resistance film, disposed between the second wiring layer 12 and the third wiring layer 11 at a crossing portion between each of the plurality of second wiring layers 12 and each of the plurality of third wiring layers 11; a plurality of second conductive layers 12D disposed on the same plane as the plurality of second wiring layers 12 in an island shape; and a plurality of second dummy cells DC adjacent to the second memory cell 10, disposed between the second conductive layer 12D and the third wiring layer 11, and configured to support the third wiring layer 11.

Moreover, the nonvolatile semiconductor memory device according to the ninth embodiment may include: the memory cell array 1A (refer to FIGS. 4 and 5) in which the memory cells MC are arranged in a matrix; and the bit line hookup portion BHU/word line hookup portion WHU disposed around the memory cell array 1A, wherein the first dummy cell DC/second dummy cell DC may be respectively disposed in the bit line hookup portion BHU/word line hookup portion WHU.

Moreover, the dummy cell DC may be stacked in two layers via the first conductive layer 11D between the second wiring layers 12 adjacent to each other in the Z axial direction.

Moreover, the second dummy cell DC may be stacked in two layers via the second conductive layer 12D between the first wiring layers 11 adjacent to each other in the Z axial direction.

Tenth Embodiment: Example of Stacked Structure of Insulating Isolation Region

Figure 34A:
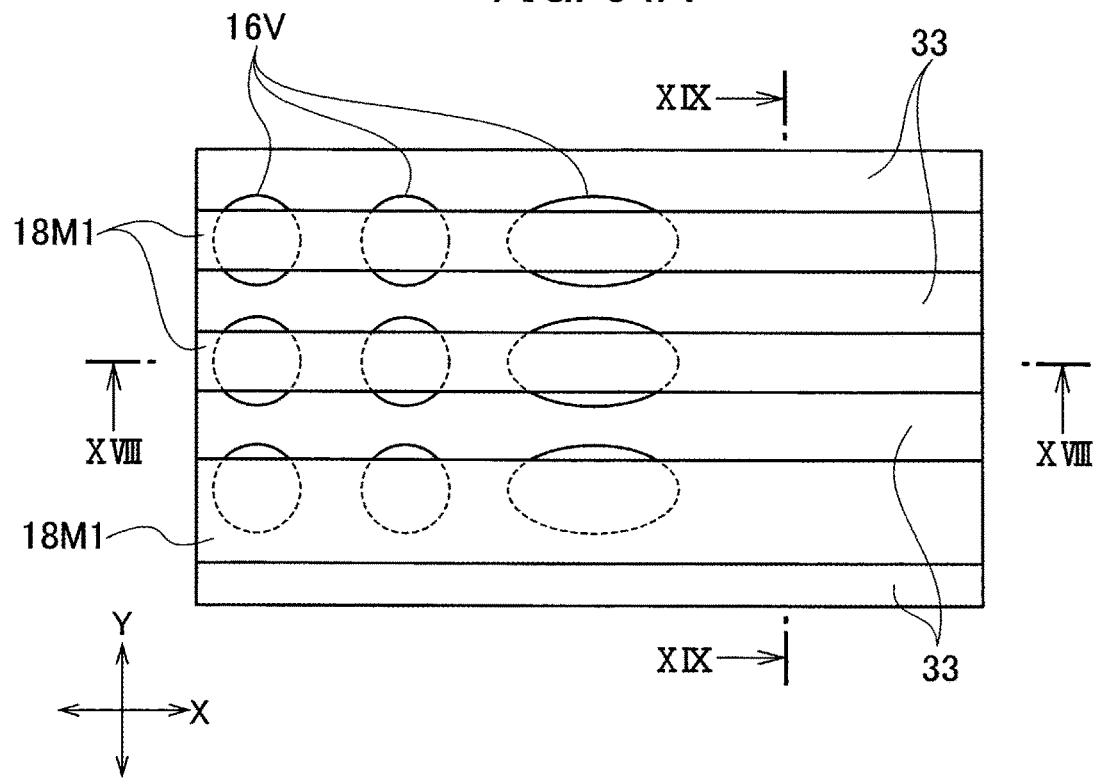
FIG. 34A is a schematic planar pattern configuration diagram of an insulating isolation region (Shallow Trench Isolation (STI)) portion of a peripheral portion in the nonvolatile semiconductor memory device according to the comparative example.
Figure 34B:
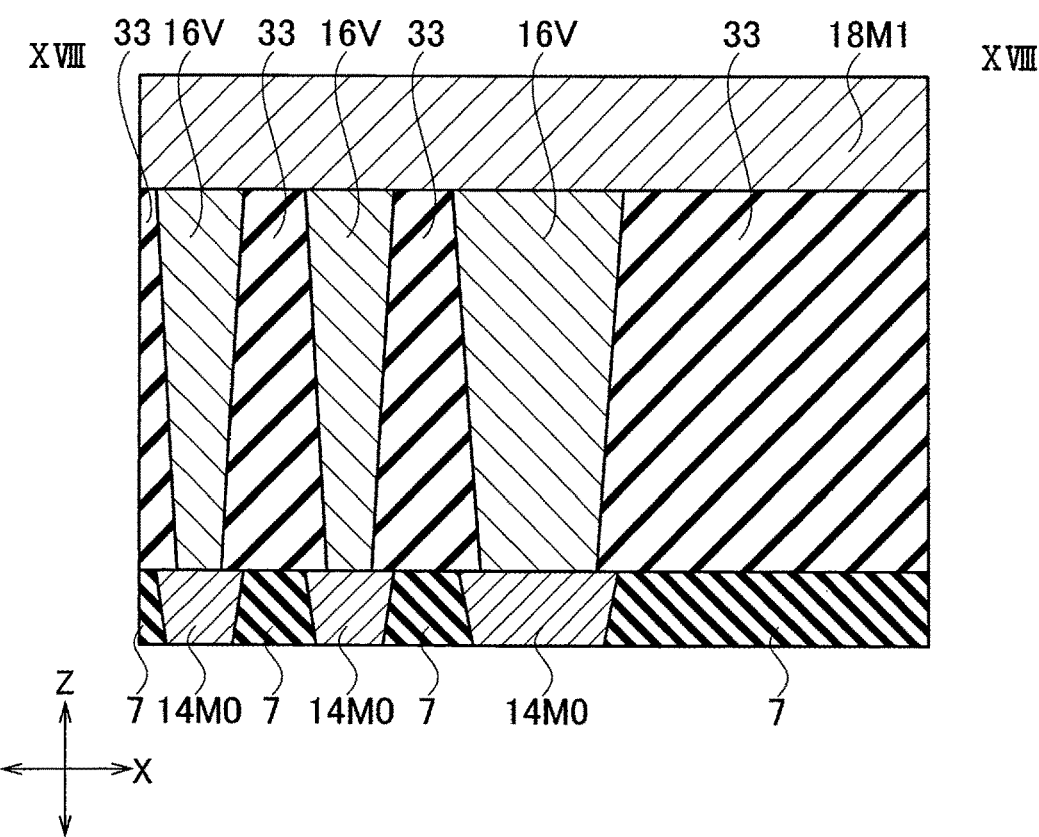
FIG. 34B is a schematic cross-sectional structure diagram taken in the line XVIII-XVIII of FIG. 34A.

As illustrated in FIGS. 34A and 34B, a nonvolatile semiconductor memory device according to a comparative example includes: a plurality of first wiring layers 14M0 extended inside an insulating substrate 7 in the Y direction, in a Shallow Trench Isolation (STI) portion of a peripheral portion; a plurality of second wiring layers 18M1 extended in the X direction crossing the Y direction above the plurality of first wiring layers 14M0; and a plurality of first stacked structures 16V disposed respectively between the second wiring layers 18M1 and the first wiring layers 14M0 in crossing portions between the plurality of second wiring layers 18M1 and the plurality of first wiring layers 14M0. The first stacked structure 16V includes a VIA electrode. An interlayer insulating film 33 is disposed between the insulating substrate 7 and the second wiring layer 18M1. The VIA electrode used herein is an electrode for connecting between the first wiring layer 14M0 and the second wiring layer 18M1.

Figure 35A:
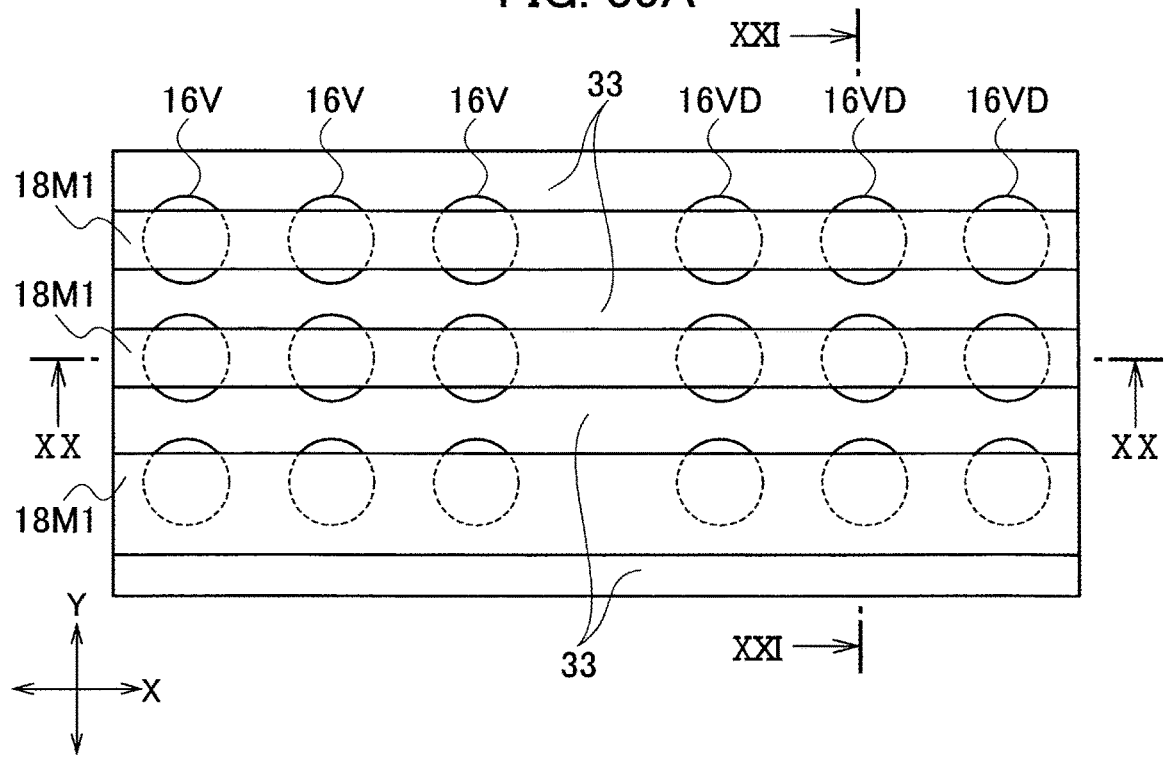
FIG. 35A is a schematic planar pattern configuration diagram of an STI portion of a peripheral portion in a nonvolatile semiconductor memory device according to a tenth embodiment.
Figure 35B:
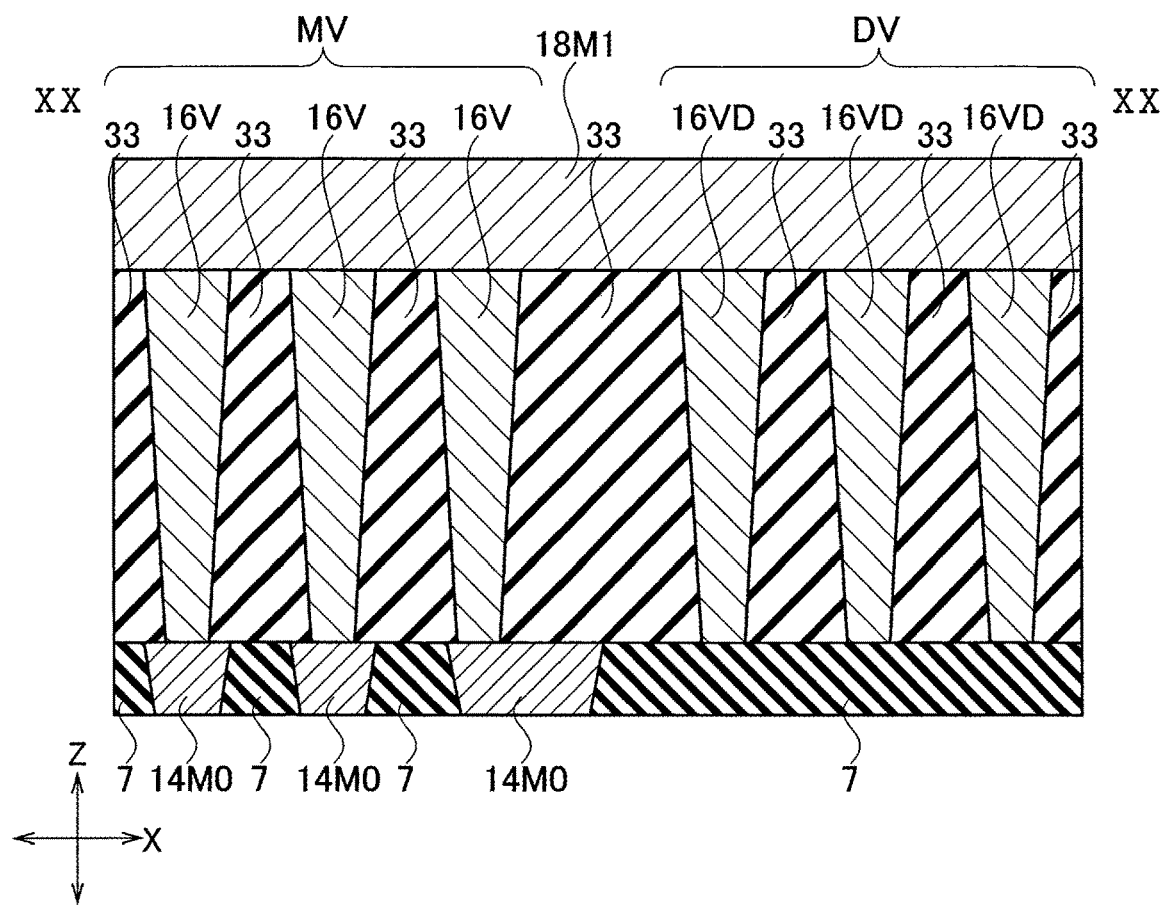
FIG. 35B is a schematic cross-sectional structure diagram taken in the line XX-XX of FIG. 35A.

In contrast, as illustrated in FIGS. 35A and 35B, a nonvolatile semiconductor memory device accorded to a tenth embodiment includes: a plurality of first wiring layers 14M0 extended in the Y direction in an insulating isolation region of a peripheral portion; a plurality of second wiring layers 18M1 extended in the X direction crossing the Y direction above the plurality of first wiring layers 14M0; a plurality of first stacked structures 16V disposed respectively between the second wiring layers 18M1 and the first wiring layers 14M0 in crossing portions between the plurality of second wiring layers 18M1 and the plurality of first wiring layers 14M0; and a second stacked structure 16VD disposed so as to be adjacent to the first stacked structure 16V and configured to support the second wiring layer 18M1.

The first stacked structure 16V includes a first electrode (VIA electrode), and the second stacked structure 16VD includes a second electrode (dummy VIA electrode). An interlayer insulating film 33 is disposed between the insulating substrate 7 and the second wiring layer 18M1.

Figure 36C:
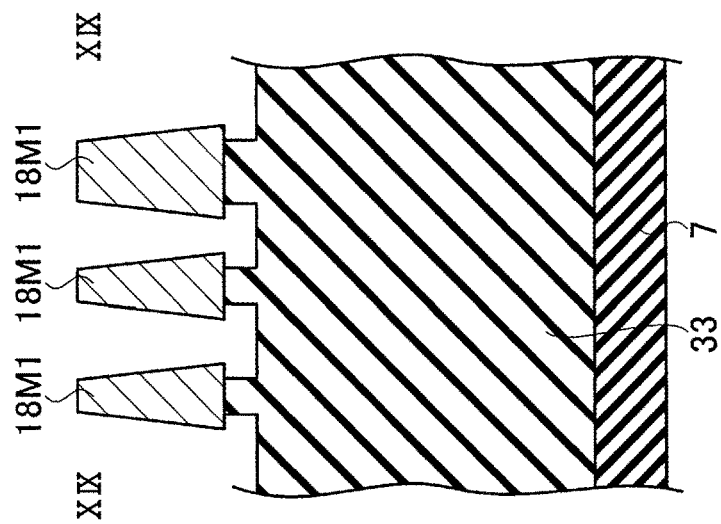
FIG. 36C is a schematic cross-sectional structure diagram taken in the line XIX-XIX of FIG. 34A, after further performing a wet etching process.
Figure 36B:
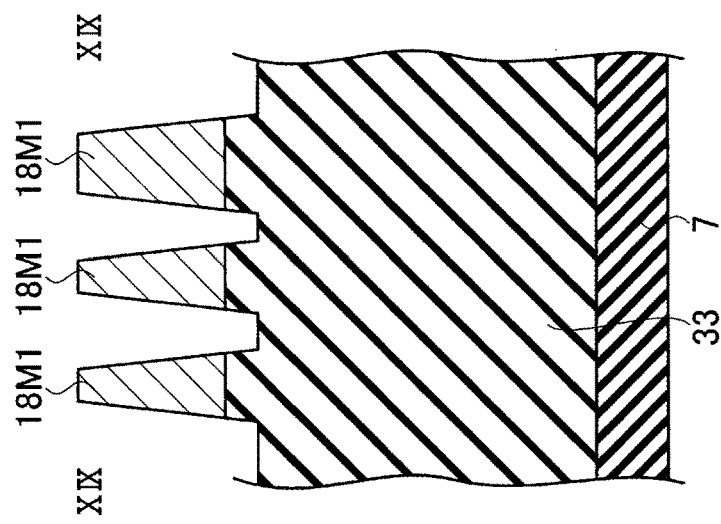
FIG. 36B is a schematic cross-sectional structure diagram taken in the line XIX-XIX of FIG. 34A, after processing the electrode layer by means of the RIE.
Figure 36A:
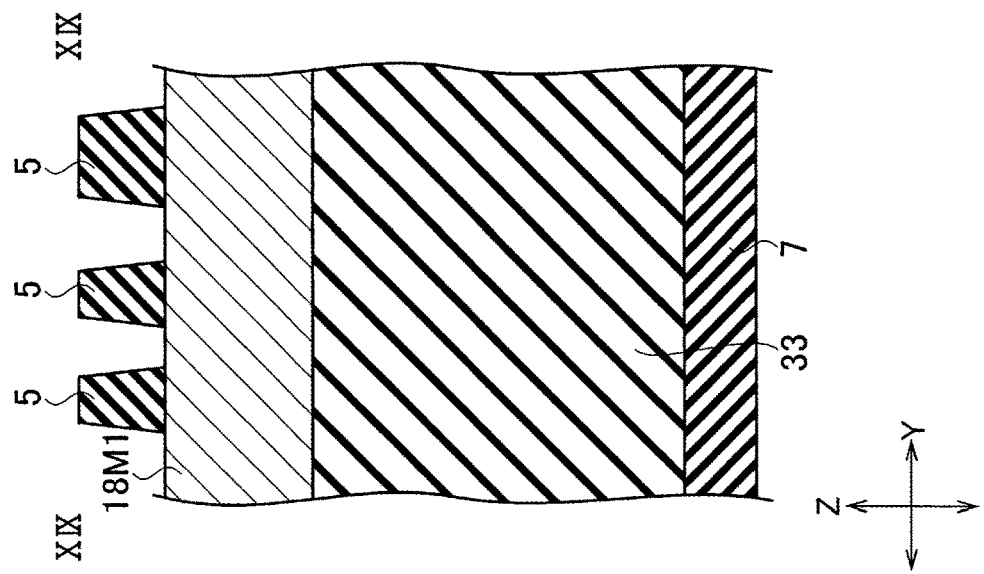
FIG. 36A is a schematic cross-sectional structure diagram taken in the line XIX-XIX of FIG. 34A for describing a step of processing an electrode layer by means of Reactive Ion Etching (RIE).

FIG. 36A illustrates a schematic cross-sectional structure taken in the line XIX-XIX of FIG. 34A for describing a step of processing the second wiring layer 18M1 by means of RIE. FIG. 36B illustrates a schematic cross-sectional structure after processing the electrode layer, and FIG. 36C illustrates a schematic cross-sectional structure after further performing a wet etching process.

Figure 37A:
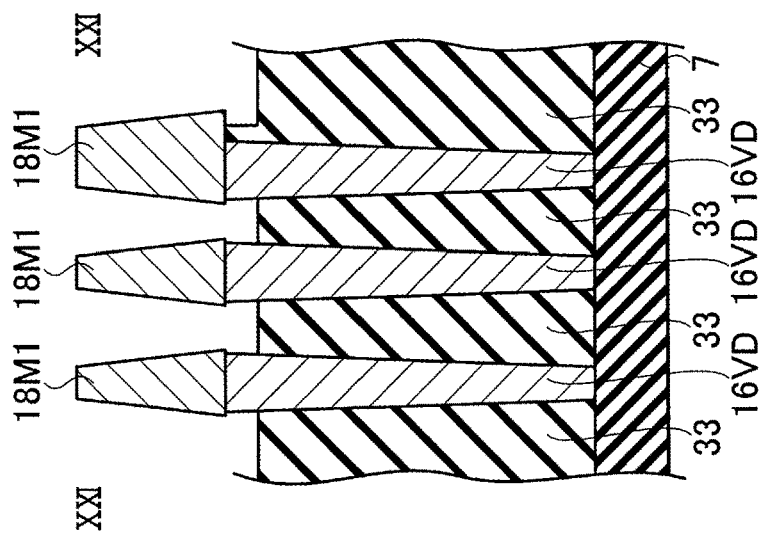
FIG. 37A is a schematic cross-sectional structure diagram taken in the line XXI-XXI of FIG. 35A for describing a step of processing the electrode layer by means of the RIE.
Figure 37B:
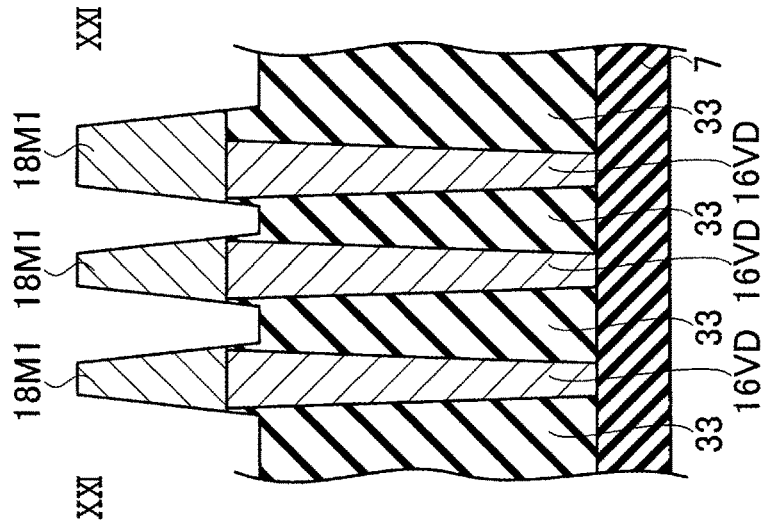
FIG. 37B is a schematic cross-sectional structure diagram taken in the line XXI-XXI of FIG. 35A, after processing the electrode layer by means of the RIE.
Figure 37C:
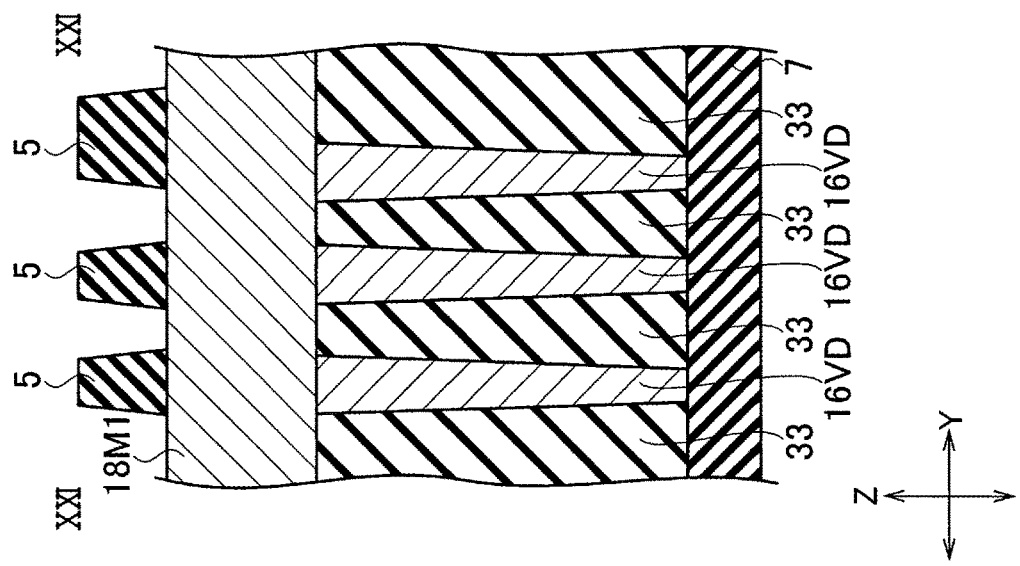
FIG. 37C is a schematic cross-sectional structure diagram taken in the line XXI-XXI of FIG. 35A, after further performing the wet etching process.

On the other hand, FIG. 37A illustrates a schematic cross-sectional structure taken in the line XXI-XXI of FIG. 35A for describing a step of processing the second wiring layer 18M1 by means of the RIE. FIG. 37B illustrates a schematic cross-sectional structure after processing the electrode layer, and FIG. 37C illustrates a schematic cross-sectional structure after further performing a wet etching process.

FIG. 36A illustrates a schematic cross-sectional structure taken in the XIX-XIX viewed from the Y direction before processing the second wiring layer 18M1 in the nonvolatile semiconductor memory device according to the comparative example. Next, FIG. 36B illustrates a schematic cross-sectional structure taken in the line XIX-XIX viewed from the Y direction after performing the RIE processing to the second wiring layer 18M1, using a mask 5. FIG. 36C illustrates a schematic cross-sectional structure taken in the line XIX-XIX viewed from the Y direction after performing the wet etching.

In the nonvolatile semiconductor memory device according to the comparative example, as illustrated in FIG. 36, the member for supporting the second wiring layer 18M1 is merely the interlayer insulating film 33 in the peripheral portion of the VIA electrode 16V, and therefore it is weak in terms of strength. Accordingly, a pattern collapse of the second wiring layer 18M1 and a pattern short between the adjacent patterns are easy to occur in the peripheral portion of the VIA electrode 16V.

FIG. 37A illustrates a schematic cross-sectional structure taken in the line XXI-XXI viewed from the Y direction before processing of the second wiring layer 18M1 in the nonvolatile semiconductor memory device 1 according to the embodiments. Next, FIG. 37B illustrates a schematic cross-sectional structure taken in the line XXI-XXI viewed from the Y direction after performing the RIE processing to the second wiring layer 18M1, using a mask 5. FIG. 37C illustrates a schematic cross-sectional structure taken in the line XXI-XXI viewed from the Y direction after performing the wet etching.

As illustrated in FIG. 37, in the nonvolatile semiconductor memory device according to the tenth embodiment, since the dummy VIA electrode 16VD having the same electrode structure as that of the VIA electrode 16V in the peripheral portion of the VIA electrode 16V as a reinforcement structure for supporting the second wiring layer 18M1 is disposed. As a result, the strength is relatively strong as compared with the structure of the comparative example. Accordingly, a pattern collapse of the second wiring layer 18M1 and a pattern short between the adjacent patterns can be suppressed in the peripheral portion of the VIA electrode 16V.

As described above, according to the nonvolatile semiconductor memory device according to the embodiments, the pillar of the dummy cell structure composed of the same stacked film structure as that of the memory cell as the reinforcement structure for supporting the wiring layer in the peripheral portion of the memory cell is established. Accordingly, there can be provided the highly reliable nonvolatile semiconductor memory device having excellent mechanical strength, resistance to pattern shorts, and improved yields, and the fabrication method of such a nonvolatile semiconductor memory device.

While certain embodiments have been described, these embodiments have been presented by way of examples only, and are not intended to limit the scope of the inventions. Indeed, the novel methods and systems described herein may be embodied in a variety of other forms; furthermore, various omissions, substitutions, and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a plurality of first wiring layers extended in a first direction and arranged in a second direction crossing the first direction;
   a plurality of second wiring layers provided above the plurality of first wiring layer of a third direction crossing the first direction and the second direction, the plurality of second wiring layers arranged in the first direction and extended in the second direction;
   a plurality of first stacked structures each comprising a first memory cell disposed between the second wiring layer and the first wiring layer at a crossing portion between each of the plurality of second wiring layers and each of the plurality of first wiring layers;
   a plurality of first conductive layers provided in the same layer as the plurality of first wiring layers in the third direction, the plurality of first conductive layers arranged to be adjacent to the first wiring layer in the second direction, the plurality of first conductive layers not connected to other than the second wiring layer;
   a plurality of second stacked structures disposed respectively at crossing portions between the second wiring layers and the plurality of first conductive layers; and
   an insulation layer provided between the plurality of first stacked structures and between the plurality of second stacked structures, wherein
   the second stacked structure has a Young's modulus larger than a Young's modulus of the insulation layer.

2. The nonvolatile semiconductor memory device according to claim 1, wherein
   the first stacked structure comprises a first electrode, and the second stacked structure comprises a second electrode.

3. The nonvolatile semiconductor memory device according to claim 1, further comprising:
   a first insulating layer provided between the plurality of first stacked structures; and
   a second insulation layer provided between the plurality of second stacked structures, wherein in the second direction, the first insulating layer and the second insulation layer are provided between one of the plurality of first stacked structures closest to the second stacked structure and one of the plurality of second stacked structures closest to the first stacked structure.

4. The nonvolatile semiconductor memory device according to claim 3, wherein
the second insulation layer has a Young's modulus larger than a Young's modulus of the first insulating layer.

5. The nonvolatile semiconductor memory device according to claim 3, wherein
the second stacked structure comprises a film having a smaller shrinkage rate than a shrinkage rate of the first insulating layer.

6. The nonvolatile semiconductor memory device according to claim 1, further comprising:
a plurality of third wiring layers provided above the plurality of second wiring layers of the third direction, the plurality of third wiring layers extended in the first direction;
a plurality of third stacked structures each comprising a second memory cell disposed between the third wiring layer and the second wiring layer at a crossing portion between each of the plurality of third wiring layers and each of the plurality of second wiring layers;
a second conductive layer provided in the same layer as the plurality of second wiring layers, the second conductive layer disposed to be adjacent to the plurality of second wiring layers in the first direction; and
a fourth stacked structure disposed at a crossing portion between the third wiring layer and the second conductive layer, wherein
the second conductive layer is not connected to other than the third wiring layer.

7. The nonvolatile semiconductor memory device according to claim 1, wherein
the second stacked structure comprises the same stacked structure as the first stacked structure including the first memory cell.

8. The nonvolatile semiconductor memory device according to claim 6, wherein
the second stacked structure is stacked in two layers via the first conductive layer between the second wiring layers adjacent to each other in the third direction orthogonal to the first and second directions.

9. The nonvolatile semiconductor memory device according to claim 6, wherein
the fourth stacked structure is stacked in two layers via the second conductive layer between the first wiring layers adjacent to each other in the third direction orthogonal to the first and second directions.

10. A fabrication method of a nonvolatile semiconductor memory device, the fabrication method comprising:
after pattern-forming a first wiring layer on a substrate, forming a first interlayer insulating film to be planarized and then forming a stacked film on the first wiring layer and the first interlayer insulating film;
processing the stacked film on the first wiring layer of a memory cell formation region in a fin shape to be extended in a first direction, and processing the stacked film of a stacked structure formation region into an island shape;
forming a second interlayer insulating film to be planarized;
after forming a metal layer, processing the metal layer in a line shape to be extended in the second direction crossing the first direction, thereby forming a second wiring layer to be overlapped on the stacked film of the stacked structure formation region; and
processing the stacked film and the second interlayer insulating film under between the second wiring layers, thereby forming a memory cell having a pillar-shaped stacked film in the memory cell formation region and forming a stacked structure having a pillar-shaped stacked film in the stacked structure formation region, wherein
the pattern-forming the first wiring layer includes simultaneously pattern-forming a first conductive layer, the first conductive layer provided in the same layer as the first wiring layer in the third direction, the first conductive layer arranged to be adjacent to the first wiring layer in the second direction, the first conductive layer not connected to other than the second wiring layer,
the forming the stacked film includes simultaneously forming the stacked film on the first conductive layer, and
the processing the stacked film on the first wiring layer in the fin shape to be extended in the first direction includes simultaneously processing the stacked film on the first conductive layer into an island shape.

11. The fabrication method of the nonvolatile semiconductor memory device according to claim 10, further comprising:
processing the stacked film on the first wiring layer in the second direction crossing the first direction, and thereby forming the pillar-shaped stacked film in the memory cell formation region and the pillar-shaped stacked film in the stacked structure formation region; and
after forming a third interlayer insulating film to be planarized, forming a metal layer and processing the metal layer in a line shape to be extended in the second direction, thereby forming a second wiring layer overlapped on the stacked film in the memory cell formation region and the stacked film in the stacked structure formation region.

12. The fabrication method of the nonvolatile semiconductor memory device according to claim 10, wherein
the first conductive layer is disposed so as to extend over the adjacent second wiring layers in planar view.

13. A nonvolatile semiconductor memory device comprising:
a first memory cell array provided with a plurality of first wiring layers extended to a first direction and arranged in a second direction crossing the first direction, a plurality of second wiring layers extended to the second direction and arranged in the first direction, and a plurality of first stacked structures including a first memory cell provided between the first wiring layer and the second wiring layer;
a plurality of first conductive layers provided in the same layer as the first wiring layer in a third direction crossing the first direction and the second direction and disposed to be adjacent to the first wiring layer in the second direction;
a plurality of second stacked structures including the plurality of the first conductive layers and the second wiring layers; and
an insulation layer provided between the plurality of first stacked structures and between the plurality of second stacked structures, wherein
the second stacked structure has a Young's modulus larger than a Young's modulus of the insulation layer.

14. The nonvolatile semiconductor memory device according to claim 13, further comprising
a second memory cell array provided with a plurality of third wiring layers extended in the first direction and arranged in the second direction, the plurality of second wiring layers, and a plurality of third stacked structures including a second memory cell provided between the third wiring layer and the second wiring layer, the second memory cell array being adjacent to the first memory cell array in the second direction, wherein
the second stacked structure is provided between the first memory cell array and the second memory cell array.

15. The nonvolatile semiconductor memory device according to claim 13, further comprising:
a cell unit including the first memory cell; and
a peripheral portion provided around the cell unit, wherein
the second stacked structure is provided in the cell unit.

16. The nonvolatile semiconductor memory device according to claim 15, wherein
a circuit element is provided in the peripheral portion.

\* \* \* \* \*